United States Patent
Kawashima et al.

(10) Patent No.: US 9,029,931 B2
(45) Date of Patent: May 12, 2015

(54) SEMICONDUCTOR DEVICE AND MANUFACTURING METHOD THEREOF

(75) Inventors: Yoshiyuki Kawashima, Kanagawa (JP); Koichi Toba, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 329 days.

(21) Appl. No.: 13/235,171

(22) Filed: Sep. 16, 2011

(65) Prior Publication Data

US 2012/0068243 A1    Mar. 22, 2012

(30) Foreign Application Priority Data

Sep. 22, 2010    (JP) ................. 2010-212036

(51) Int. Cl.
| | |
|---|---|
| *H01L 29/788* | (2006.01) |
| *H01L 29/66* | (2006.01) |
| *H01L 27/115* | (2006.01) |
| *H01L 29/792* | (2006.01) |
| *H01L 29/423* | (2006.01) |

(52) U.S. Cl.
CPC ........ *H01L 29/792* (2013.01); *H01L 29/66833* (2013.01); *H01L 27/11573* (2013.01); *H01L 29/42344* (2013.01)

(58) Field of Classification Search
USPC ....... 257/E29.129, E29.3, E21.179, E21.422, 257/314, 315
See application file for complete search history.

(56) References Cited

U.S. PATENT DOCUMENTS

| | | |
|---|---|---|
| 6,888,194 B2 | 5/2005 | Yoshino |
| 7,087,955 B2 | 8/2006 | Kawashima et al. |
| 7,115,943 B2 | 10/2006 | Mine et al. |
| 7,888,211 B2 | 2/2011 | Shim |
| 2009/0224306 A1* | 9/2009 | Hayashi ................. 257/316 |

FOREIGN PATENT DOCUMENTS

| | | |
|---|---|---|
| JP | 4-337672 A | 11/1992 |
| JP | 2003-258128 A | 9/2003 |
| JP | 2004-303918 A | 10/2004 |
| JP | 2005-259843 A | 9/2005 |
| JP | 2006-041227 A | 2/2006 |
| JP | 2006-080567 A | 3/2006 |
| JP | 2009-152556 A | 7/2009 |
| JP | 2009-212398 A | 9/2009 |
| JP | 2010-153780 A | 7/2010 |

OTHER PUBLICATIONS

Office Action dated Apr. 8, 2014, in Japanese Patent Application No. 2010-212036.

* cited by examiner

*Primary Examiner* — Yu-Hsi D Sun

(74) *Attorney, Agent, or Firm* — Miles & Stockbridge P.C.

(57) ABSTRACT

An improvement is achieved in the performance of semiconductor device including a nonvolatile memory. In a split-gate nonvolatile memory, between a memory gate electrode and a p-type well and between a control gate electrode and the memory gate electrode, an insulating film is formed. Of the insulating film, the portion between the lower surface of the memory gate electrode and the upper surface of a semiconductor substrate has silicon oxide films, and a silicon nitride film interposed between the silicon oxide films. Of the insulating film, the portion between a side surface of the control gate electrode and a side surface of the memory gate electrode is formed of a silicon oxide film, and does not have the silicon nitride film.

10 Claims, 28 Drawing Sheets

| | OPERATION METHOD WRITING/ERASING | WRITE OPERATION VOLTAGES (V) Vmg/Vs/Vcg/Vd/Vb | ERASE OPERATION VOLTAGES (V) Vmg/Vs/Vcg/Vd/Vb | READ OPERATION VOLTAGES (V) Vmg/Vs/Vcg/Vd/Vb |
|---|---|---|---|---|
| A | SSI(WRITING)/ BTBT(ERASING) | 10/5/1/0.5/0 | -6/6/0/open/0 | 0/0/1.5/1.5/0 |
| B | SSI(WRITING)/ FN(ERASING) | 10/5/1/0.5/0 | 12/0/0/0/0 | 0/0/1.5/1.5/0 |
| C | FN(WRITING)/ BTBT(ERASING) | -12/0/0/0/0 | -6/6/0/open/0 | 0/0/1.5/1.5/0 |
| D | FN(WRITING)/ FN(ERASING) | -12/0/0/0/0 | 12/0/0/0/0 | 0/0/1.5/1.5/0 |

SEMICONDUCTOR DEVICE AND MANUFACTURING METHOD THEREOF

CROSS-REFERENCE TO RELATED APPLICATIONS

The disclosure of Japanese Patent Application No. 2010-212036 filed on Sep. 22, 2010 including the specification, drawings and abstract is incorporated herein by reference in its entirety.

BACKGROUND

The present invention relates to a semiconductor device and a manufacturing method thereof, and particularly to a technology which is effective when applied to a semiconductor device having a nonvolatile memory and a manufacturing method thereof.

As an electrically writable/erasable nonvolatile semiconductor storage device, an EEPROM (Electrically Erasable and Programmable Read Only Memory) has been widely used. Such a storage device (memory) represented by a currently widely used flash memory has, under the gate electrode of a MISFET, a conductive floating gate electrode or a trapping insulating film surrounded by an oxide film. A charge stored state in the floating gate or the trapping insulating film is used as stored information, which is read out as the threshold of the transistor. The trapping insulating film indicates an insulating film capable of storing therein charges. Examples of the trapping insulating film that can be mentioned include a silicon nitride film. By the injection/release of charges into/from such a charge storage region, the threshold of the MISFET is shifted to cause the MISFET to function as a memory element. Examples of the flash memory include a split-gate cell using a MONOS (Metal-Oxide-Nitride-Oxide-Semiconductor) film. In such a memory, a silicon nitride film is used as a charge storage region to provide such advantages that, due to discrete storage of charges therein, the data retention reliability thereof is higher than that of a conductive floating gate electrode, that the higher data retention reliability allows reductions in the thicknesses of oxide films over and under the silicon nitride film, and that a voltage for a write/erase operation can be reduced.

In each of Japanese Unexamined Patent Publications Nos. 2006-41227 (Patent Document 1), Hei 4 (1992)-337672 (Patent Document 2), and 2003-258128 (Patent Document 3), a technique concerning a MONOS nonvolatile memory is described.

RELATED ART DOCUMENTS

Patent Documents

[Patent Document 1]
  Japanese Unexamined Patent Publication No. 2006-41227
[Patent Document 2]
  Japanese Unexamined Patent Publication No. Hei 4(1992)-337672
[Patent Document 3]
  Japanese Unexamined Patent Publication No. 2003-258128

SUMMARY

As a result of study, the present inventors have made the following findings.

In a split-gate nonvolatile memory, as a laminate gate insulating film, e.g., an ONO (Oxide-Nitride-Oxide) film having a laminated structure including a silicon oxide film, a silicon nitride film, and a silicon oxide film is formed, and the control gate electrode and memory gate electrode of the nonvolatile memory adjoin each other via the ONO film. In recent years, in the nonvolatile memory described above, it has been desired to improve the electric performance thereof or ensure the reliability thereof.

An object of the present invention is to provide a technology which allows an improvement in the electric performance of a semiconductor device. Another object of the present invention is to provide a technology which allows an improvement in the reliability of the semiconductor device. Still another object of the present invention is to provide a technology which allows an improvement in the electric performance of a semiconductor device, and also allows an improvement in the reliability of the semiconductor device.

The above and other objects and novel features of the present invention will become apparent from a statement in the present specification and the accompanying drawings.

The following is a brief description of the outline of a representative aspect of the invention disclosed in the present application.

A semiconductor device according to a representative embodiment is a semiconductor device including a memory cell of a nonvolatile memory, and has a first gate electrode formed over a semiconductor substrate, a second gate electrode formed over the semiconductor substrate to adjoin the first gate electrode, and an insulating film formed between the second gate electrode and the semiconductor substrate and between the first gate electrode and the second gate electrode. Of the insulating film, a first portion between a lower surface of the second gate electrode and an upper surface of the semiconductor substrate has a first silicon oxide film, a second silicon oxide film, and a first silicon nitride film interposed between the first and second silicon oxide films, and the first silicon nitride film functions as a charge storage portion of the memory cell. Of the insulating film, a second portion between a side surface of the first gate electrode and a side surface of the second gate electrode is formed of a silicon oxide, and does not have the first silicon nitride film.

A manufacturing method of a semiconductor device according to a representative embodiment is a method of manufacturing a semiconductor device including a memory cell of a nonvolatile memory, and has the steps of: (a) preparing a semiconductor substrate; (b) forming a first gate electrode forming the memory cell over a main surface of the semiconductor substrate via a first gate insulating film; and (c) forming a silicon oxide film over the main surface of the semiconductor substrate and a side surface of the first gate electrode. The method also has the steps of: (d) forming, over the silicon oxide film, a second gate electrode adjoining the first gate electrode via the silicon oxide film, and forming the memory cell; and (e) removing the silicon oxide film from a portion uncovered with the second gate electrode. The method also has the steps of: (f) after the step (e), removing at least a part of a portion of the silicon oxide film between a lower surface of the second gate electrode and the semiconductor substrate to form a cavity; and (g) forming a first silicon oxide film over a surface of the semiconductor substrate exposed in the cavity, while forming a second silicon oxide film under the lower surface of the second gate electrode exposed in the cavity. The method also has a step of: (h) forming a silicon nitride film between the first silicon oxide film over the surface of the semiconductor substrate and the second silicon oxide film under the lower surface of the second gate electrode.

The following is a brief description of effects achievable by the representative aspect of the invention disclosed in the present application.

According to the representative embodiments, it is possible to improve the electric performance of the semiconductor device. It is also possible to improve the reliability of the semiconductor device. In addition, it is possible to improve the electric performance of the semiconductor device, and improve the reliability of the semiconductor device.

DETAILED DESCRIPTION

Figure 1:
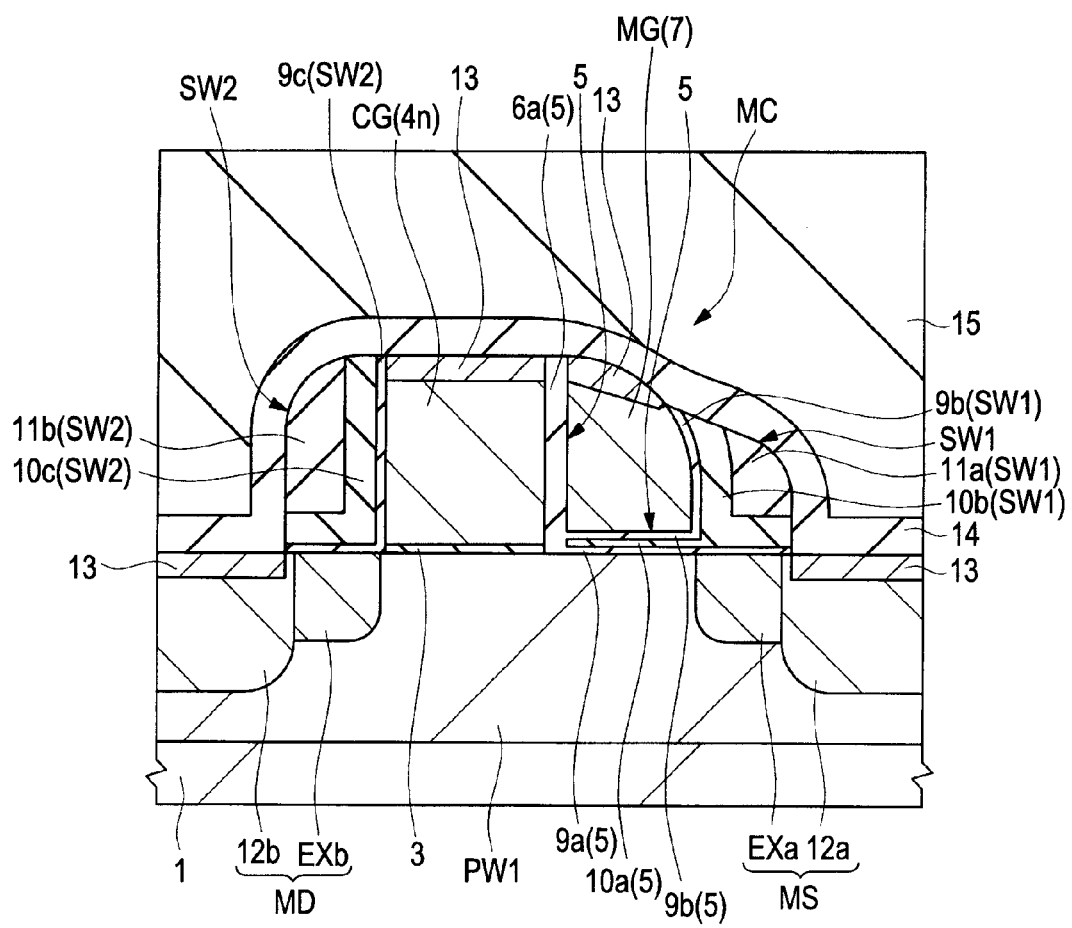
FIG. 1 is a main-portion cross-sectional view of a semiconductor device as an embodiment of the present invention.

In each of the following embodiments, if necessary for the sake of convenience, the embodiment will be described by being divided into a plurality of sections or embodiments. However, they are by no means irrelevant to each other unless particularly explicitly described otherwise, and one of the sections or embodiments is variations, details, supplementary explanation, and so forth of part or the whole of the others. When the number and the like (including the number, numerical value, amount, range, and the like) of elements are mentioned in the following embodiments, they are not limited to specific numbers unless particularly explicitly described otherwise or unless they are obviously limited to specific numbers in principle. The number and the like of the elements may be not less than or not more than specific numbers. It will be appreciated that, in the following embodiments, the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are referred to in the following embodiments, the shapes and the like are assumed to include those substantially proximate or similar thereto unless particularly explicitly described otherwise or unless it can be considered that they obviously do not in principle. The same shall apply in regard to the foregoing numerical value and range.

Hereinbelow, the embodiments of the present invention will be described in detail with reference to the drawings. Note that, throughout all the drawings for illustrating the embodiments, members having the same functions are designated by the same reference numerals, and a repeated description thereof is omitted. In the following embodiments, a description of the same or like parts will not be repeated in principle unless particularly necessary.

In the drawings used in the embodiments, hatching may omitted even in a cross section for clarity of illustration, while even a plan view may be hatched for clarity of illustration.
First Embodiment The present invention is a semiconductor device including a nonvolatile memory (nonvolatile memory element, flash memory, or nonvolatile semiconductor storage device), and the nonvolatile memory primarily uses a trapping insulating film (insulating film capable of storing therein charges) in a charge storage portion. In the following embodiment, a description will be given on the basis of a memory cell based on an n-channel MISFET (Metal Insulator Semiconductor Field Effect Transistor), and using a trapping insulating film. In the following embodiment, polarities (the polarities of voltages applied during writing, erasing, or reading or the polarities of carriers) are for illustrating operations when a memory cell is based on an n-channel MISFET. When a memory cell is based on a p-channel MISFET, by inverting all the polarities such as the conductivity types of applied potentials and carriers, the same operations can be obtained in principle.

The semiconductor device of the present embodiment and a manufacturing method thereof will be described with reference to the drawings.

Figure 2:
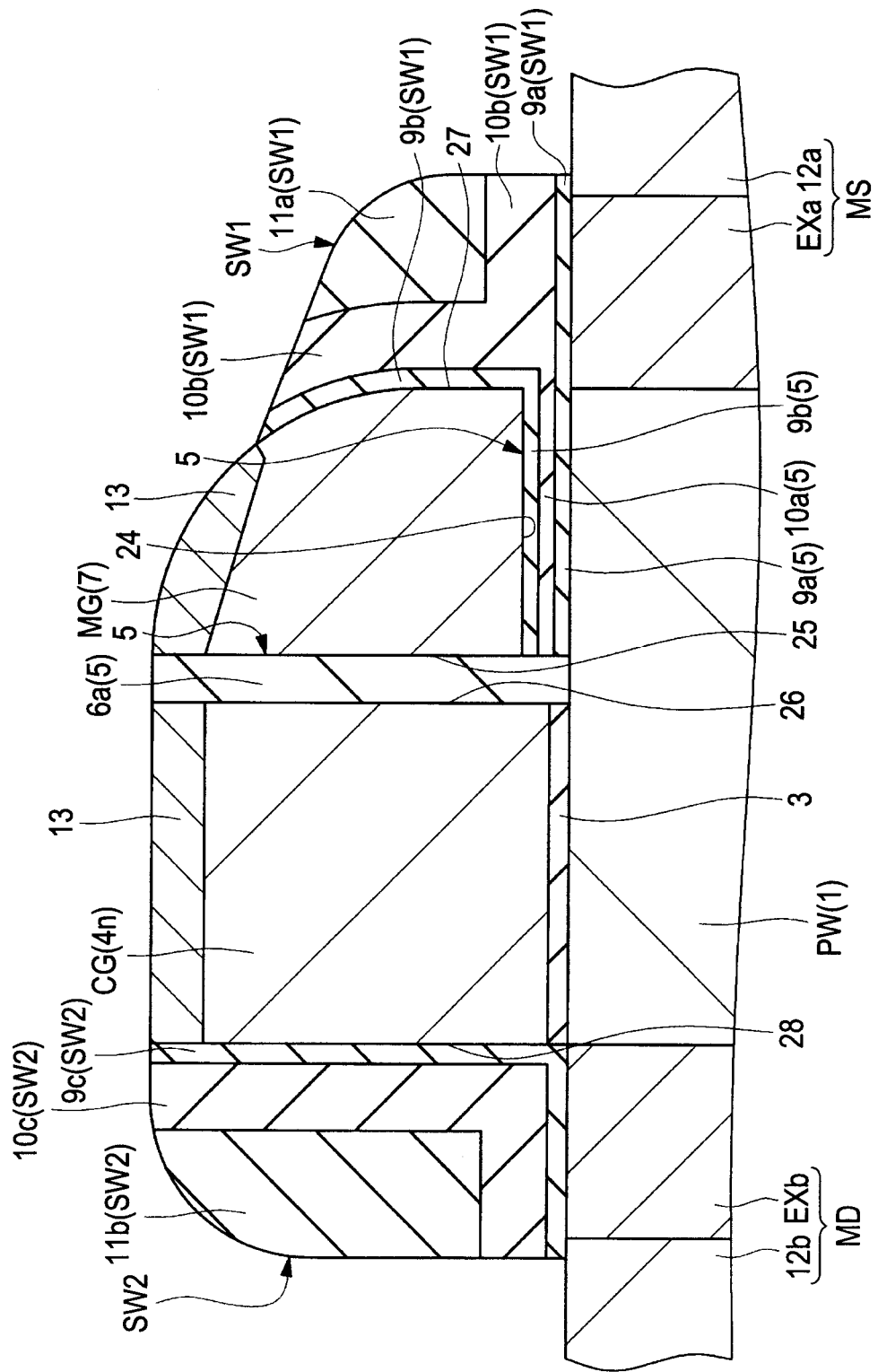
FIG. 2 is a partially enlarged cross-sectional view obtained by enlarging a part of FIG. 1.
Figures 3, 4:
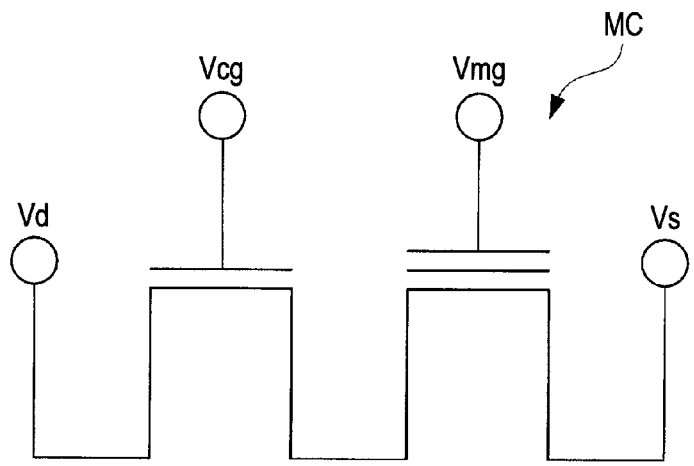
FIG. 3 is an equivalent circuit diagram of a memory cell.
FIG. 4 is a table showing an example of conditions for the application of voltages to the individual portions of a selected memory cell during "writing", "erasing", and "reading"

FIG. 1 is a main-portion cross-sectional view of the semiconductor device of the present embodiment. The semiconductor device of the present embodiment is a semiconductor device including a nonvolatile memory. FIG. 1 shows a main-portion cross-sectional view of a memory cell region in the nonvolatile memory. FIG. 2 is a partially enlarged cross-sectional view (main-portion cross-sectional view) of a memory cell MC in the semiconductor device of the present embodiment, and shows a part of FIG. 1 in enlarged relation. FIG. 3 is an equivalent circuit diagram of the memory cell MC. Note that, for easier understanding, FIG. 2 shows only a control gate electrode CG, a memory gate electrode MG, insulating films 3 and 5, sidewall insulating films SW1 and SW2, and a substrate region (a part of a semiconductor substrate 1 forming a p-type well PW1) located immediately therebelow. In FIG. 2, the depiction of metal silicide layers 13 over $n^+$-type semiconductor regions 12a and 12b is omitted.

As shown in FIG. 1, in the semiconductor substrate (semiconductor wafer) 1 formed of p-type monocrystalline silicon having a specific resistance of, e.g., about 1 to 10 Ωm or the like, an isolation region (corresponding to an isolation region 2 which will be described later, but not shown in FIG. 1) for isolating elements is formed and, in an active region isolated (defined) by the isolation region, the p-type well PW1 is formed. In the p-type well PW1 of each of memory cell regions, the memory cell MC of the nonvolatile memory including a memory transistor and a control transistor (selection transistor), which are as shown in FIG. 1, are formed. In each of the memory cell regions, a plurality of the memory cells MC are formed in an array configuration. Each of the memory cell regions is electrically isolated from other regions by the isolation region.

As shown in FIGS. 1 to 3, the memory cell MC of the nonvolatile memory in the semiconductor device of the present embodiment is a split-gate memory cell, and includes two MISFETs coupled to each other, which are the control transistor (selection transistor) having the control gate electrode (selection gate electrode) CG and the memory transistor having the memory gate electrode (gate electrode for memory).

Here, the MISFET (Metal Insulator Semiconductor Field Effect Transistor) including a gate insulating film including a charge storage portion (charge storage layer), and the memory gate electrode MG is referred to as the memory transistor (transistor for memory), and the MISFET including a gate insulating film and the control gate electrode CG is referred to as the control transistor (selection transistor or transistor for memory cell selection). Accordingly, the memory gate electrode MG is the gate electrode of the memory transistor, the control gate electrode CG is the gate electrode of the control transistor, and the control gate electrode CG and the memory gate electrode MG are the gate electrodes forming the nonvolatile memory (the memory cell thereof).

Hereinbelow, a specific description will be given to a structure of the memory cell MC.

As shown in FIGS. 1 and 2, the memory cell MC of the nonvolatile memory has n-type semiconductor regions MS and MD for source and drain regions formed in the p-type well PW1 of the semiconductor substrate 1, the control gate electrode CG formed over the semiconductor substrate 1

(p-type well PW1), and the memory gate electrode MG formed over the semiconductor substrate 1 (p-type well PW1) to adjoin the control gate electrode CG. In addition, the memory cell MC of the nonvolatile memory has the insulating film (gate insulating film) 3 formed between the control gate electrode CG and the semiconductor substrate 1 (p-type well PW1), and the insulating film 5 formed between the memory gate electrode MG and the semiconductor substrate 1 (p-type well PW1) and between the memory gate electrode MG and the control gate electrode CG.

The control gate electrode CG and the memory gate electrode MG extend along the main surface of the semiconductor substrate 1 with the insulating film 5 being interposed between the respective opposing side surfaces (side walls) thereof, and are disposed side by side. The extending directions of the control gate electrode CG and the memory gate electrode MG are perpendicular to the paper surface with FIG. 1. The control gate electrode CG and the memory gate electrode MG are formed over the semiconductor substrate 1 (p-type well PW1) between the semiconductor region MD and the semiconductor region MS via the insulating films 3 and 5 (with the insulating film 3 interposed between the control gate electrode CG and the semiconductor substrate and with the insulating film 5 interposed between the memory gate electrode MG and the semiconductor substrate 1). The memory gate electrode MG is located closer to the semiconductor region MS, while the control gate electrode CG is located closer to the semiconductor region MD.

The control gate electrode CG and the memory gate electrode MG adjoin each other with the insulating film 5 interposed therebetween. The memory gate electrode MG is formed in the form of a sidewall spacer over a sidewall of the control gate electrode CG via the insulating film 5. The insulating film 5 extends over two regions, which are the region between the memory gate electrode MG and the semiconductor substrate 1 (p-type well PW) and the region between the memory gate electrode MG and the control gate electrode CG.

The insulating film 3 (i.e., the insulating film 3 under the control gate electrode CG) formed between the control gate electrode CG and the semiconductor substrate 1 (p-type well PW1) functions as the gate insulating film of the control transistor. The insulating film 5 (i.e., the insulating film 5 under the memory gate electrode MG) between the memory gate electrode MG and the semiconductor substrate (p-type well PW1) functions as the gate insulating film (gate insulating film having the charge storage portion therein) of the memory transistor.

The insulating film 3 can be formed of, e.g., a silicon oxide film, a silicon oxynitride film, or the like. As the insulating film 3, not only the silicon oxide film, the silicon oxynitride film, or the like mentioned above, but also a metal oxide film having a dielectric constant higher than that of a silicon nitride film, such as a hafnium oxide film, an aluminum oxide (alumina) film, or a tantalum oxide film, may be used.

The insulating film 5 is formed (to extend) over the two regions that are the region between the memory gate electrode MG and the semiconductor substrate 1 (p-type well PW1) and the region between the memory gate electrode MG and the control gate electrode CG. However, the insulating film has different structures (configurations) in the region between the memory gate electrode MG and the semiconductor substrate 1 (p-type well PW1) and in the region between the memory gate electrode MG and the control gate electrode CG.

That is, of the insulating film 5, the portion located between the memory gate electrode MG and the semiconductor substrate 1 (p-type well PW1) has a silicon oxide film (silicon oxide layer) 9a, a silicon oxide film (silicon oxide layer) 9b, and a silicon nitride film (silicon nitride layer or charge storage layer) 10a interposed between the silicon oxide films 9a and 9b. Of the insulating film 5, the portion located between the memory gate electrode MG and the control gate electrode CG is formed of a silicon oxide film, and specifically formed of a silicon oxide film (silicon oxide layer) 6a. The silicon nitride film 10a extends (the extending direction thereof is a direction generally parallel with the main surface of the semiconductor substrate 1) in at least a part of the region between the memory gate electrode MG and the semiconductor substrate 1 (p-type well PW1), but is not formed between the memory gate electrode MG and the control gate electrode CG. That is, the insulating film 5 located between the memory gate electrode MG and the control gate electrode CG does not have the silicon nitride film 10a, and is formed of the silicon oxide film 6a. The silicon oxide film 6a is a silicon oxide film which does not have a silicon nitride film therein.

The portion of the insulating film 5 located between the memory gate electrode MG and the control gate electrode CG functions as an insulating film for providing insulation (electrical insulation) between the memory gate electrode MG and the control gate electrode CG, and is formed of the silicon oxide film 6a. On the other hand, the portion of the insulating film 5 located between the memory gate electrode MG and the semiconductor substrate 1 (p-type well PW1) functions as the gate insulating film of the memory transistor, and has the silicon oxide films 9a and 9b and the silicon nitride film 10a interposed between the silicon oxide films 9a and 9b.

The silicon nitride film 10a is vertically interposed between the silicon oxide films 9b and 9a. Over the silicon nitride film 10a, there is the silicon oxide film 9b in contact with the silicon nitride film 10a. Under the silicon nitride film 10a, there is the silicon oxide film 9a in contact with the silicon nitride film 10a. As a result, in the region where the silicon nitride film 10a extends, the insulating film 5 has a laminated structure of the silicon oxide film 9a, the silicon nitride film 10a over the silicon oxide film 9a, and the silicon oxide film 9b over the silicon nitride film 10a. The upper surface of the silicon oxide film 9b is in contact with the memory gate electrode MG, while the lower surface of the silicon oxide film 9b is in contact with the semiconductor substrate 1 (p-type well PW1). On the other hand, in the region where the silicon nitride film 10a does not extend, the insulating film 5 is formed of the silicon oxide film 6a (i.e., the silicon oxide film that does not have the silicon nitride film therein).

Thus, the insulating film 5 has an area (in other words, an area formed of the silicon oxide film that has the silicon nitride film 10a therein) having the laminated structure in which the silicon nitride film 10a is interposed between the silicon oxide films 9a and 9b, and an area formed of the silicon oxide film 6a that does not have the silicon nitride film therein, and the two areas adjoin each other. Of the insulating film 5, the area (in other words, the area formed of the silicon oxide film that has the silicon nitride film 10a therein) having the laminated structure in which the silicon nitride film 10a is interposed between the silicon oxide films 9a and 9b is present between the memory gate electrode MG and the semiconductor substrate 1 (p-type well PW1), but is not present between the memory gate electrode MG and the control gate electrode CG. On the other hand, of the insulating film 5, the area formed of the silicon oxide film 6a that does not have the silicon nitride film therein is present between the memory gate electrode MG and the control gate electrode CG, and can also be present in a part of the region between the memory gate electrode MG and the semiconductor substrate 1 (p-type well PW1).

The gate insulating film of the memory transistor has the charge storage portion, and the silicon nitride film 10a serves as the charge storage portion. That is, in the insulating film 5, the silicon nitride film 10a is an insulating film for storing therein charges, and functions as the charge storage layer (charge storage portion). Briefly, the silicon nitride film 10a is a trapping insulating film formed in the insulating film 5. Therefore, of the insulating film 5, the portion having the structure (laminated structure) in which the silicon nitride film 10a is interposed between the silicon oxide films 9a and 9b can be regarded as an insulating film having the charge storage portion (charge storage layer, which is the silicon nitride film 10a here) therein. The silicon oxide films 9b and 9a located over and under the silicon nitride film 10a are capable of functioning as charge block layers (charge block films or charge confinement layers). A potential barrier level in the inner layer (silicon nitride film 10a) is lower than potential barrier levels in the outer layers (silicon oxide films 9a and 9b). By forming the structure in which the silicon nitride film 10a is interposed between the silicon oxide films 9b and 9a, charges can be stored in the silicon nitride film 10a.

In the present embodiment, the portion of the insulating film 5 located between the memory gate electrode MG and the semiconductor substrate 1 (p-type well PW1) has the silicon nitride film 10a interposed between the silicon oxide films 9a and 9b, and the silicon nitride film 10a functions as the charge storage portion, while the portion of the insulating film 5 located between the memory gate electrode MG and the control gate electrode CG does not have the silicon nitride film 10a, and is formed of the silicon oxide film 6a. That is, of the insulating film 5, the portion between a lower surface 24 of the memory gate electrode MG and the surface (upper surface) of the semiconductor substrate 1 (p-type well PW1) has the silicon oxide films 9a and 9b and the silicon nitride film 10a interposed between the silicon oxide films 9a and 9b, and the portion between a side surface 26 of the control gate electrode CG and a side surface 25 of the memory gate electrode MG does not have the silicon nitride film 10a, and is formed of the silicon oxide film 6a that does not have the silicon nitride film therein.

Thus, the portion of the insulating film 5 located between the memory gate electrode MG1 and the semiconductor substrate 1 (p-type well PW1) mainly has the structure in which the silicon nitride film 10a is interposed between the silicon oxide films 9a and 9b, while the portion of the insulating film 5 located between the memory gate electrode MG and the control gate electrode CG is mainly formed of the silicon oxide film 6a (i.e., the silicon oxide film 6a that does not have the silicon nitride film therein).

The reason for forming the insulating film 5 in such a structure will be described later in greater detail.

As will be described later, the silicon oxide films 9a and 9b are films (oxide films) formed by oxidizing (more specifically thermally oxidizing) the lower surface (and side surface) of the memory gate electrode MG exposed by partially removing the silicon oxide film 6a and the surface (upper surface) of the semiconductor substrate 1 (p-type well PW1). Specifically, the silicon oxide film 9b is a film (oxide film) formed through the oxidization of the memory gate electrode MG (a silicon film 7 forming the memory gate electrode MG), and the silicon oxide film 9a is a film (oxide film) formed through the oxidization of the surface (upper surface) of the semiconductor substrate 1 (p-type well PW1). Therefore, in the present embodiment, the silicon oxide films 9a and 9b are formed separately from the silicon oxide film 6a. However, depending on the manufacturing process, the silicon oxide films 9a and 9b may also be formed integrally with the silicon oxide film 6a.

The semiconductor region MS functions as one of the source region and the drain region, while the semiconductor region MD functions as the other of the source region and the drain region. Here, the semiconductor region MS functions as the source region, while the semiconductor region MD functions as the drain region. The semiconductor regions MS and MD are each formed of a semiconductor region (n-type impurity diffusion layer) into which an n-type impurity has been introduced, and has a LDD (lightly doped drain) structure. That is, the semiconductor region MS for the source region has an $n^-$-type semiconductor region (extension region) EXa and the $n^+$-type semiconductor region (source region) 12a having an impurity concentration higher than that of the $n^-$-type semiconductor region EXa, while the semiconductor region MD for the drain region has an $n^-$-type semiconductor region (extension region) EXb and the $n^+$-type semiconductor region (drain region) 12b having an impurity concentration higher than that of the $n^-$-type semiconductor region EXb. The $n^+$-type semiconductor region 12a has a junction depth deeper than that of the $n^-$-type semiconductor region EXa and an impurity concentration higher than that of the $n^-$-type semiconductor region EXa, while the $n^+$-type semiconductor region 12b has a junction depth deeper than that of the $n^-$-type semiconductor region EXb and an impurity concentration higher than that of the $n^-$-type semiconductor region EXb.

Over the side walls (side walls that do not adjoin each other) of the memory gate electrode MG and the control gate electrode CG, sidewall spacers (sidewalls, sidewall spacers, or sidewall insulating films) SW1 and SW2 each formed of an insulator (insulating film) are formed. Note that, over the side wall (side wall that does not adjoin the control gate electrode CG) of the memory gate electrode MG, the sidewall spacer SW1 is formed and, over the side wall (side wall not adjoining the memory gate electrode MG) of the control gate electrode CG, the sidewall spacer SW2 is formed. That is, over the side wall (side surface 27) of the memory gate electrode MG opposite to the side wall thereof adjoining the control gate electrode CG via the insulating film 5, the sidewall spacer SW1 is formed and, over the side wall (side surface 28) of the control gate electrode CG opposite to the side wall thereof adjoining the memory gate electrode MG via the insulating film 5, the sidewall spacer SW2 is formed.

The sidewall spacer SW1 is formed of the silicon oxide films 9a and 9b, a silicon nitride film 10b, and a silicon oxide film 11a.

The silicon oxide film 9a forming a part of the sidewall spacer SW1 and the silicon oxide film 9a forming a part of the insulating film 5 are films (oxide films) formed by oxidizing (more specifically thermally oxidizing) the surface (upper surface) of the semiconductor substrate 1 (p-type well PW1), and are integrally formed. That is, the silicon oxide film 9a is formed over the surface (upper surface) of the semiconductor substrate 1 (p-type well PW1), and extends from a region below the memory gate electrode MG to a region under the sidewall spacer SW1. Of the silicon oxide film 9a, the portion located below the memory gate electrode MG forms a part of the insulating film 5, and the portion located outside the memory gate electrode MG forms a part of the sidewall spacer SW1.

The silicon oxide film 9b forming a part of the sidewall spacer SW1 and the silicon oxide film 9b forming a part of the insulating film 5 are films (oxide films) formed by oxidizing (more specifically thermally oxidizing) the lower and side surfaces of the memory gate electrode MG (the silicon film 7 forming the memory gate electrode MG), and are integrally formed. That is, the silicon oxide film 9b is formed continuously over the lower surface 24 and side surface (side surface not adjoining the control gate electrode CG) of the memory gate electrode MG (the silicon film 7 forming the memory gate electrode MG). That is, the silicon oxide film 9b extends from under the lower surface 24 of the memory gate electrode MG to over the side surface (side wall) 27 thereof. Of the silicon oxide film 9b, the portion formed under the lower surface 24 of the memory gate electrode MG forms a part of the insulating film 5, and the portion formed over the side surface 27 of the memory gate electrode MG forms a part of the sidewall spacer SW1. The silicon nitride film 10a is formed between the silicon oxide film 9b under the lower surface of the memory gate electrode MG and the silicon oxide film 9a over the surface of the semiconductor substrate 1 (p-type well PW1).

The silicon nitride film 10b forming a part of the sidewall spacer SW1 and the silicon nitride film 10a forming a part of the insulating film 5 are integrally formed. That is, the silicon nitride film 10b and the silicon nitride film 10a are each formed of a silicon nitride film 10. Of the silicon nitride film 10, the portion located between the memory gate electrode MG and the semiconductor substrate 1 (p-type well PW1) serves as the silicon nitride film 10a (i.e., the silicon nitride film 10a forming a part of the insulating film 5), and the portion located outside the memory gate electrode MG serves as the silicon nitride film 10b (i.e., the silicon nitride film 10b forming a part of the sidewall spacer SW1).

The silicon oxide film 11a forming a part of the sidewall spacer SW1 is formed over the silicon nitride film 10b. It may also be possible to omit the formation of the silicon oxide film 11a, and use an entire film obtained by combining the silicon nitride film 10b and the silicon oxide film 11a in FIGS. 1 and 2 as the silicon nitride film 10b.

On the other hand, over the side wall of the control gate electrode CG, the sidewall spacer SW2 is formed, and the outer configuration (overall configuration) of the sidewall spacer SW2 has a structure similar to that of the sidewall spacer SW1. The sidewall spacer SW2 is formed of a silicon oxide film 9c, a silicon nitride film 10c, and a silicon oxide film 11b.

The silicon oxide film 9c forming a part of the sidewall spacer SW2 is a film (oxide film) formed by oxidizing (more specifically thermally oxidizing) the surface (upper surface) of the semiconductor substrate 1 (p-type well PW1) and the control gate electrode CG (a silicon film 4n forming the control gate electrode CG). The silicon oxide film 9c is not formed under the control gate electrode CG. The silicon nitride film 10c forming a part of the sidewall spacer SW2 is formed of a part of a silicon nitride film which is formed in the same step and in the same layer as the silicon nitride film 10b forming a part of the sidewall spacer SW1. The silicon nitride film 10c is formed over the silicon oxide film 9c, and does not extend under the control gate electrode CG.

The silicon oxide film 11b forming a part of the sidewall spacer SW2 is formed over the silicon nitride film 10c. The silicon oxide film 11b forming a part of the sidewall spacer SW2 is formed of a part of a silicon nitride film which is formed in the same step and in the same layer as the silicon oxide film 11a forming a part of the sidewall spacer SW1.

Thus, in the case where the formation of the silicon oxide film 11a is omitted and the entire film obtained by combining the silicon nitride film 10b and the silicon oxide film 11a in FIGS. 1 and 2 is used as the silicon nitride film 10b, the formation of the silicon oxide film 11b is also omitted, and the entire film obtained by combining the silicon nitride film 10b and the silicon oxide film 11a in FIGS. 1 and 2 is used as the silicon nitride film 10c.

In the source portion, the $n^-$-type semiconductor region EXa is formed by self alignment with respect to the memory gate electrode MG (the side wall thereof), and the $n^+$-type semiconductor region 12a is formed by self alignment with respect to the sidewall spacer SW1 formed over the side wall of the memory gate electrode MG. Consequently, the low-concentration $n^-$-type semiconductor region EXa is formed below the sidewall spacer SW1 over the side wall of the memory gate electrode MG, and the high-concentration $n^+$-type semiconductor region 12a is formed outside the low-concentration $n^-$-type semiconductor region EXa. Therefore, the low-concentration $n^-$-type semiconductor region EXa is formed to adjoin the channel region of the memory transistor, and the high-concentration $n^+$-type semiconductor region 12a is formed to come in contact with the low-concentration $n^-$-type semiconductor region EXa and be spaced apart from the channel region of the memory transistor by a distance corresponding to the $n^-$-type semiconductor region EXa.

In the drain portion, the $n^-$-type semiconductor region EXb is formed by self alignment with respect to the control gate electrode CG (the side wall thereof), and the $n^+$-type semiconductor region 12b is formed by self alignment with respect to the sidewall spacer SW2 formed over the side wall of the control gate electrode CG. Consequently, the low-concentration $n^-$-type semiconductor region EXb is formed below the sidewall spacer SW2 over the side wall of the control gate electrode CG, and the high-concentration $n^+$-type semiconductor region 12b is formed outside the low-concentration $n^-$-type semiconductor region EXb. Therefore, the low-concentration $n^-$-type semiconductor region EXb is formed to adjoin the channel region of the control transistor, and the high-concentration $n^+$-type semiconductor region 12b is formed to come in contact with the low-concentration $n^-$-type semiconductor region EXb and be spaced apart from the channel region of the control transistor by a distance corresponding to the $n^-$-type semiconductor region EXb.

Under the insulating film 5 under the memory gate electrode MG, the channel region of the memory transistor is formed while, under the insulating film 3 under the control gate electrode CG, the channel region of the control transistor is formed. In the channel formation region of the control transistor under the insulating film 3 under the control gate electrode CG, a semiconductor region (p-type semiconductor region or n-type semiconductor region) for adjusting the threshold of the control transistor is formed as necessary while, in the channel formation region of the memory transistor under the insulating film 5 under the memory gate electrode MG, a semiconductor region (p-type semiconductor region or n-type semiconductor region) for adjusting the threshold of the memory transistor is formed as necessary.

The control gate electrode CG is formed of a conductor (conductor film), and preferably formed of the silicon film such as an n-type polysilicon film (polycrystalline silicon film into which an n-type impurity has been introduced or doped polysilicon film). The silicon film 4 is preferably an n-type silicon film having an n-type impurity introduced therein and a low resistivity. Specifically, the control gate electrode CG is formed of the patterned silicon film 4n.

The memory gate electrode MG is formed of a conductor (conductor film), and preferably formed of the silicon film 7. The silicon film 7 is preferably an n-type silicon film having an n-type impurity introduced therein and a low resistivity. The silicon film 7 is more preferably an n-type polysilicon film (polycrystalline silicon film into which an n-type impurity has been introduced or doped polysilicon film). As will be described later, the memory gate electrode MG is formed by anisotropically etching the silicon film 7 formed over the semiconductor substrate 1 so as to cover the control gate electrode CG, and leaving the silicon film 7 over the side wall of the control gate electrode CG via the insulating film 5. Consequently, the memory gate electrode MG is formed in the form of a sidewall spacer over the side wall of the control gate electrode CG via the insulating film 5.

Over (the upper surface of) the memory gate electrode MG (the silicon film 7 forming the memory gate electrode MG), over (the upper surface of) the control gate electrode CG (the silicon film 4n forming the control gate electrode CG), and over (the upper surfaces or surfaces) of the $n^+$-type semiconductor regions 12a and 12b, metal silicide layers (metal silicide films) 13 are formed by a salicide (Self Aligned Silicide) technique or the like. The metal silicide layers 13 are each formed of, e.g., a cobalt silicide layer, a nickel silicide layer, or the like. With the metal silicide layers 13, it is possible to reduce a diffusion resistance and a contact resistance. It is also possible to regard a combination of the silicon film 4n forming the control gate electrode CG and the metal silicide layer 13 thereover as the control gate electrode CG. Alternatively, it is also possible to regard a combination of the silicon film 7 forming the memory gate electrode MG and the metal silicide layer 13 thereover as the memory gate electrode MG. In terms of minimizing the possibility of a short circuit between the memory gate electrode MG and the control gate electrode CG, it may also be possible not to form the metal silicide layer 13 over either or both of the memory gate electrode MG and the control gate electrode CG.

Over the semiconductor substrate 1, an insulating film 14 and an insulating film 15 over the insulating film 14 are formed so as to cover the control gate electrode CG, the memory gate electrode MG, and the sidewall spacers SW1 and SW2. The insulating film 14 is thinner than the insulating film 15, and preferably formed of a silicon nitride film. The insulating film 15 is thicker than the insulating film 14, and preferably formed of a silicon oxide film. As will be described later, contact holes CNT are formed in the insulating films 14 and 15, plugs PG are buried in the contact holes CNT, and wiring lines M1 and the like are formed over the insulating film 15 in which the plugs PG are buried, but the depiction thereof is omitted in FIGS. 1 and 2. Note that the insulating film 15 is capable of functioning as an interlayer insulating film, and the insulating film 14 is capable of functioning as an etching stopper film when the contact holes CNT, which will be described later, are formed in the insulating film 15.

FIG. 4 is a table showing an example of conditions for the application of voltages to the individual portions of a selected memory cell during "writing", "erasing", and "reading". In the table of FIG. 4, there are shown a voltage Vmg applied to the memory gate electrode MG of a memory cell (selected memory cell) as shown in FIGS. 1 and 2, a voltage Vs applied to the source region (semiconductor region MS) thereof, a voltage Vcg applied to the control gate electrode CG thereof, a voltage Vd applied to the drain region (semiconductor region MD) thereof, and a base voltage Vb applied to the p-type well PW1. Note that the conditions shown in the table of FIG. 4 are a preferred example of the conditions for the application of the voltages. The conditions for the application of the voltages are not limited thereto, and can be variously changed as necessary. In the present embodiment, the injection of electrons into the silicon nitride film 10a serving as the charge storage portion (charge storage layer) in the insulating film 5 of the memory transistor is defined as "writing", and the injection of holes into the silicon nitride film 10a in the insulating film 5 thereof is defined as "erasing".

Note that, in the table of FIG. 4, the row corresponds to the case where a writing method is a SSI method and an erasing method is a BTBT method, the row B corresponds to the case where the writing method is the SSI method and the erasing method is a FN method, the row C corresponds to the case where the writing method is the FN method and the erasing method is the BTBT method, and the row D corresponds to the case where the writing method is the FN method and the erasing method is the FN method.

The SSI method can be regarded as an operation method in which writing to the memory cell is performed by injecting hot electrons into the silicon nitride film 10a. The BTBT method can be regarded as an operation method in which erasing to the memory cell is performed by injecting hot electrons into the silicon nitride film 10a. The FN method can be regarded as an operation method in which writing or erasing is performed by the tunneling of electrons or holes. In other words, writing by the FN method can be regarded as an operation method in which writing to the memory cell is performed by injecting electrons into the silicon nitride film 10a using a FN tunnel effect, and erasing by the FN method can be regarded as an operation method in which erasing to the memory cell is performed by injecting holes into the silicon nitride film 10a using the FN tunnel effect. Hereinbelow, a specific description will be given.

Writing methods include a writing method (hot electron injection writing method) called the so-called SSI (Source Side Injection) method in which writing is performed through hot electron injection by source side injection, and a writing method (tunneling writing method) called the so-called FN method in which writing is performed by FN (Fowler Nordheim) tunneling.

In the writing by the SSI method, voltages (Vmg=10 V, Vs=5 V, Vcg=1 V, Vd=0.5 V, and Vb=0 V) as shown in, e.g., "Write Operation Voltages" in the row A or the row B of the table of FIG. 4 are applied to the individual portions of the selected memory cell to which writing is performed so that electrons are injected into the silicon nitride film 10a in the insulating film 5 of the selected memory cell to effect writing. At this time, hot electrons are generated in the channel region (between the source and drain regions) below the region between the two gate electrodes (memory gate electrode MG and the control gate electrode CG), and injected into the silicon nitride film 10a serving as the charge storage portion in the insulating film 5 under the memory gate electrode MG. The injected hot electrons (electrons) are trapped in the trap level in the silicon nitride film 10a in the insulating film 5 so that the threshold voltage of the memory transistor increases (to establish a written state).

In the writing by the FN method, voltages (Vmg=−12 V, Vs=0 V, Vcg=0 V, Vd=0 V, and Vb=0 V) as shown in, e.g., "Write Operation Voltages" in the row C or the row D of the table of FIG. 4 are applied to the individual portions of the selected memory cell to which writing is performed so that, in the selected memory cell, electrons are caused to tunnel from the memory gate electrode MG, and injected into the silicon nitride film 10a in the insulating film 5 to effect writing. At this time, the electrons tunnel from the memory gate electrode MG through the silicon oxide film 9b by FN tunneling (FN tunneling effect) to be injected into the insulating film 5, and trapped in the trap level in the silicon nitride film 10a in the insulating film 5. As a result, the threshold voltage of the memory transistor increases (to establish a written state).

Note that, in the writing by the FN method, writing can also be performed by causing electrons to tunnel from the semiconductor substrate 1 and be injected into the silicon nitride film 10a in the insulating film 5. In this case, write operation voltages can be obtained by, e.g., interchanging the positive and negative signs of "Write Operation Voltages" in the row C or the row D of the table of FIG. 4.

Erasing methods include an erasing method (hot hole injection erasing method) called the so-called BTBT method in which erasing is performed through hot hole injection using a BTBT (Band-To-Band Tunneling) phenomenon, and an erasing method (tunneling erasing method) called the so-called FN method in which erasing is performed by FN (Fowler Nordheim) tunneling.

In the erasing by the BTBT method, erasing is performed by injecting holes generated by BTBT (Band-To-Band Tunneling) into the charge storage portion (the silicon nitride film 10a in the insulating film 5). For example, voltages (Vmg=−6 V, Vs=6 V, Vcg=0 V, Vd=open, and Vb=0 V) as shown in, e.g., "Erase Operation Voltages" in the row A or the row C of the table of FIG. 4 are applied to the individual portions of the selected memory cell to which erasing is performed. In this manner, using the BTBT (Band-To-Band Tunneling) phenomenon, the holes are generated, accelerated with an electric field, and injected into the silicon nitride film 10a in the insulating film 5 of the selected memory cell, thereby reducing the threshold voltage of the memory transistor (to establish an erased state).

In the erasing by the FN method, voltages (Vmg=12 V, Vs=0 V, Vcg=0 V, Vd=0 V, and Vb=0 V) as shown in, e.g., "Erase Operation Voltages" in the row B or the row D of the table of FIG. 4 are applied to the individual portions of the selected memory cell to which erasing is performed so that, in the selected memory cell, holes are caused to tunnel from the memory gate electrode MG, and injected into the silicon nitride film 10a in the insulating film 5 to effect erasing. At this time, the holes tunnel from the memory gate electrode MG through the silicon oxide film 9b by the FN tunneling (FN tunneling effect) to be injected into the insulating film 5, and trapped in the trap level in the silicon nitride film 10a in the insulating film 5. As a result, the threshold voltage of the memory transistor decreases (to establish an erased state).

Note that, in the erasing by the FN method, erasing can also be performed by causing holes to tunnel from the semiconductor substrate 1 and be injected into the silicon nitride film 10a in the insulating film 5. In this case, erase operation voltages can be obtained by, e.g., interchanging the positive and negative signs of "Erase Operation Voltages" in the row B or the row D of the table of FIG. 4.

When writing or erasing is performed by the FN method (i.e., when the operation method B, C, or D is implemented) and charges are caused to tunnel from the memory gate electrode MG, and injected into the silicon nitride film 10a, the thickness of the silicon oxide film 9b is preferably set smaller than the thickness of the silicon oxide film 9a. On the other hand, when writing or erasing is performed by the FN method (i.e., when the operation method B, C, or D is implemented) and charges are caused to tunnel from the semiconductor substrate 1, and injected into the silicon nitride film 10a, the thickness of the silicon oxide film 9a is preferably set smaller than the thickness of the silicon oxide film 9b. When writing is performed by the SSI method and erasing is performed by the BTBT method (i.e., when the operation method A is implemented), the thickness of the silicon oxide film 9b is preferably set not less than the thickness of the silicon oxide film 9a.

During reading, voltages as shown in, e.g., "Read Operation Voltages" in the row A, the row B, the row C, or the row D of the table of FIG. 4 are applied to the individual portions of the selected memory cell to which reading is performed. By setting the voltage Vmg applied to the memory gate electrode MG during reading to a value between the threshold voltage of the memory transistor in a written state and the threshold voltage thereof in an erased state, the written state can be discriminated from the erased state.

In the following description, for the sake simplification, a method implemented when writing is performed by the SSI method and erasing is performed by the BTBT method is referred to as the operation method A, a method implemented when writing is performed by the SSI and erasing is performed by the FN method is referred to as the operation method B, a method implemented when writing is performed by the FN method and erasing is performed by the BTBT method is referred to as the operation method C, and a method implemented by the FN method and erasing is performed by the FN method is referred to as the operation method D. In the operation method A, the operation voltages in, e.g., the row A of the table of FIG. 4 can be used. In the operation method B, the operation voltages in, e.g., the row B of the table of FIG. 4 can be used. In the operation method C, the operation voltages in, e.g., the row C of the table of FIG. 4 can be used. In the operation method D, the operation voltages in, e.g., the row D of the table of FIG. 4 can be used.

Next, a description will be given to the manufacturing method of the semiconductor device of the present embodiment.

Figure 5:
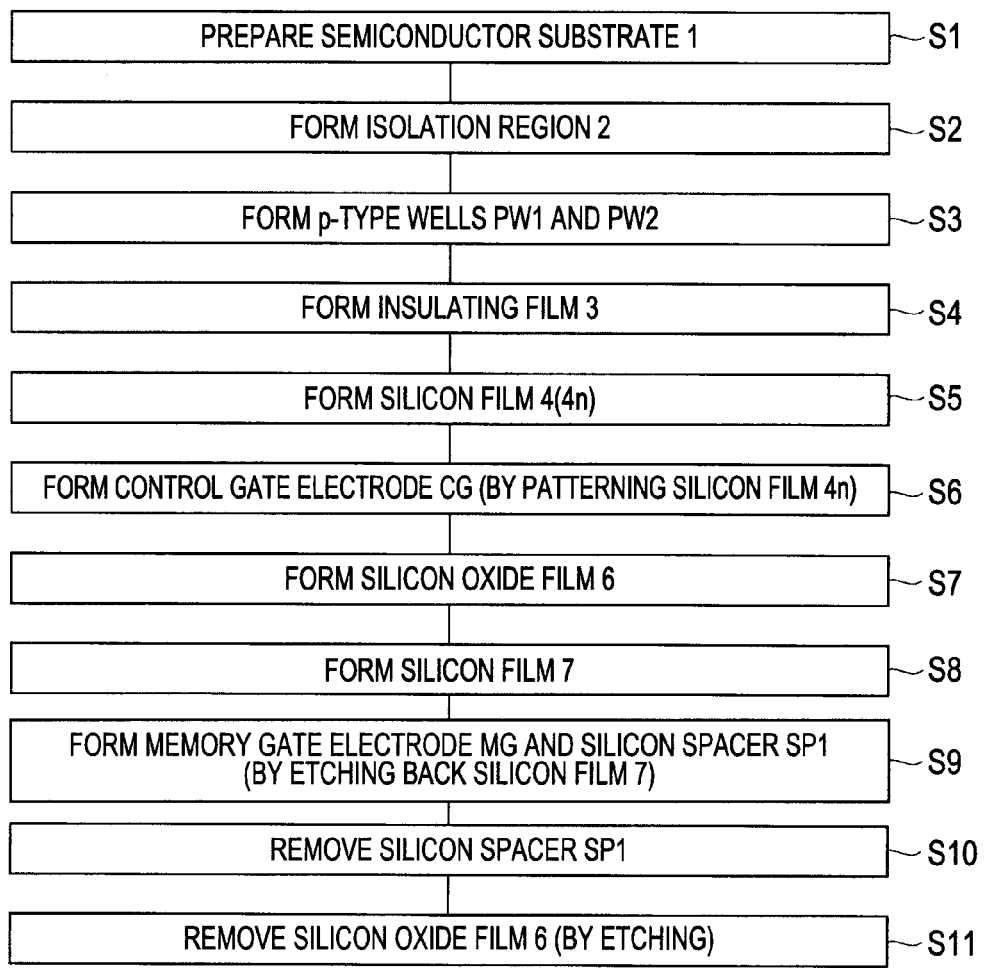
FIG. 5 is a process flow chart showing a part of a manufacturing process of the semiconductor device as the embodiment of the present invention.
Figure 6:
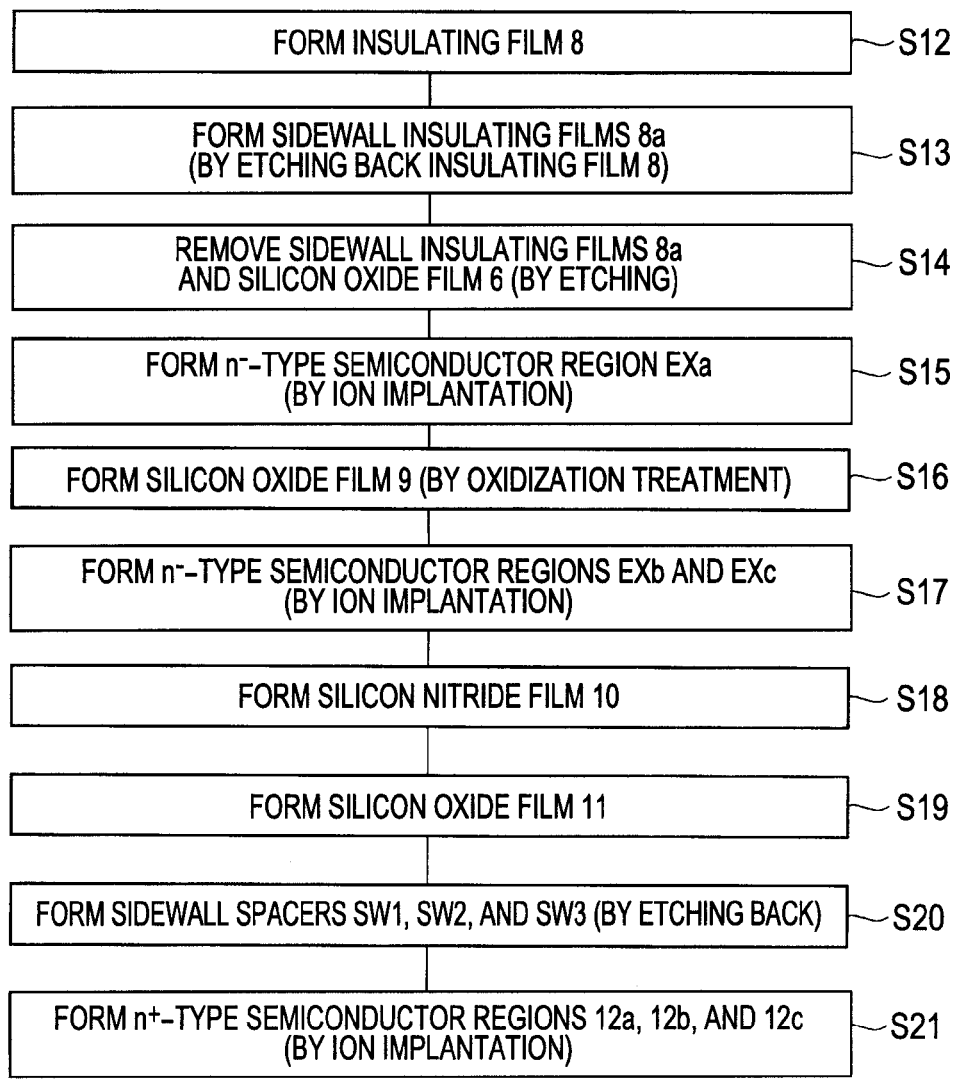
FIG. 6 is a process flow chart showing a part of the manufacturing process of the semiconductor device as the embodiment of the present invention.

FIGS. 5 and 6 are process flow charts each showing a part of the manufacturing process of the semiconductor device of the present embodiment. FIG. 6 corresponds to a process flow chart after Step S11 of FIG. 5. FIGS. 7 to 39 are main-portion cross-sectional views of the semiconductor device of the present embodiment during the manufacturing process thereof. In the cross-sectional views of FIGS. 7 to 18, 20, 21, 23, 24, 26 to 28, 30, 32, and 34 to 39, there are shown the main-portion cross-sectional views of a memory cell region (region where the memory cell MC of the nonvolatile memory is formed) 1A and a peripheral circuit region (region where circuits other than the nonvolatile memory are formed) 1B, and are also shown the formation of the memory cell MC in the memory cell region 1A and the formation of the MISFET in the peripheral circuit region 1B. FIG. 19 corresponds to a partially enlarged cross-sectional view of FIG. 18. FIG. 22 corresponds to a partially enlarged cross-sectional view of FIG. 21. FIG. 25 corresponds to a partially enlarged cross-sectional view of FIG. 24. FIG. 29 corresponds to a partially enlarged cross-sectional view of FIG. 28. FIG. 31 corresponds to a partially enlarged cross-sectional view of FIG. 30. FIG. 33 corresponds to a partially enlarged cross-sectional view of FIG. 32. The memory cell region 1A and the peripheral circuit region 1B are formed in the same semiconductor substrate 1. The memory cell region 1A and the peripheral circuit region 1B need not adjoin each other but, for easier understanding, in the cross-sectional views of FIGS. 7 to 18, 20, 21, 23, 24, 26 to 28, 30, 32, and 34 to 39, the peripheral circuit region 1B is shown next to the memory cell region 1A. Here, examples of the peripheral circuits include a processor such as a CPU, a control circuit, a sense amplifier, a column decoder, a row decoder, and an input/output circuit.

In the present embodiment, a description will be given to the case where n-channel MISFETs (control transistor and memory transistor) are formed in the memory cell region 1A, but it is also possible to invert the conductivity types, and form p-channel MISFETs (control transistor and memory transistor) in the memory cell region A. Likewise, in the present embodiment, a description will be given to the case where an n-channel MISFET is formed in the peripheral circuit region 1B, but it is also possible to invert the conductivity types, and form a p-channel MISFET in the peripheral circuit region B. It is also possible to form a CMISFET (Complementary MISFET) or the like in the peripheral circuit region 1B.

Figure 7:
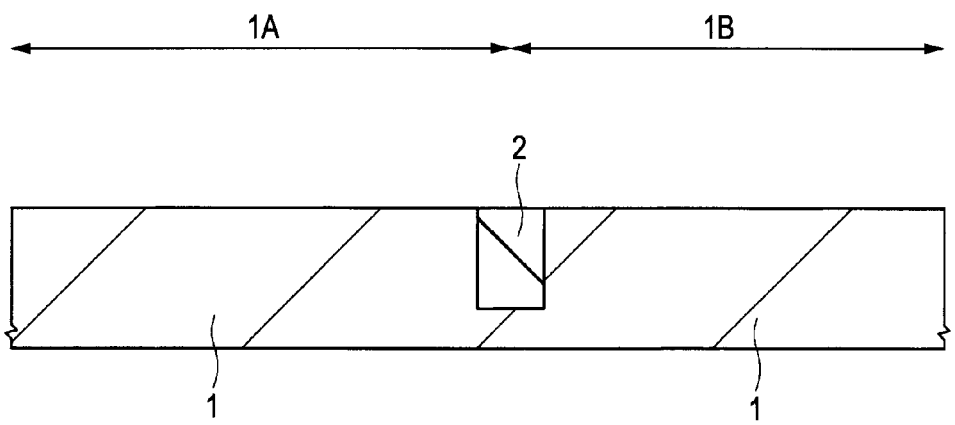
FIG. 7 is a main-portion cross-sectional view of the semiconductor device of the embodiment of the present invention during the manufacturing process thereof.

As shown in FIG. 7, the semiconductor substrate (semiconductor wafer) 1 formed of, e.g., p-type monocrystalline silicon having a specific resistance of about 1 to 10 Ωm is prepared (made ready) (Step S1 of FIG. 5). Then, in the main surface of the semiconductor substrate 1, an isolation region (inter-element isolation region) 2 for defining (delineating) active regions is formed (Step S2 of FIG. 5). The isolation region 2 is formed of an insulator such as silicon oxide, and can be formed by, e.g., a STI (Shallow Trench Isolation) method, a LOCOS (Local Oxidization of Silicon) method, or the like. For example, by forming a trench for isolation in the main surface of the semiconductor substrate 1, and then burying an insulating film made of, e.g., silicon oxide in the trench for isolation, the isolation region 2 can be formed.

Figure 8:
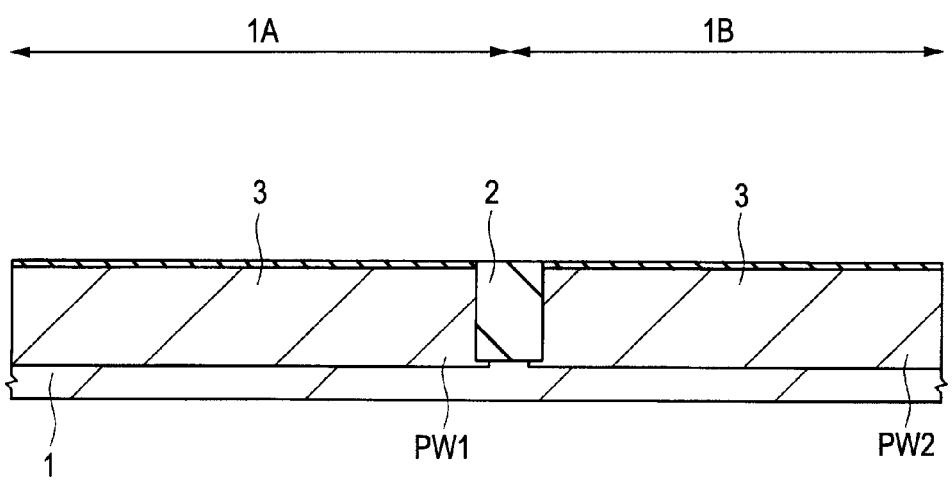
FIG. 8 is a main-portion cross-sectional view of the semiconductor device during the manufacturing process thereof, which is subsequent to FIG. 7.

Next, as shown in FIG. 8, the p-type well PW1 is formed in the memory cell region 1A of the semiconductor substrate 1, and a p-type well PW2 is formed in the peripheral circuit region 1B thereof (Step S3 of FIG. 5). The p-type wells PW1 and PW2 can be formed by, e.g., ion implantation of a p-type impurity such as boron (B) into the semiconductor substrate 1 or the like. The p-type wells PW1 and PW2 are formed at predetermined depths from the main surface of the semiconductor substrate 1.

Next, to adjust the threshold voltage of the control transistor formed later in the memory cell region 1A, channel dope ion implantation is performed as necessary to the surface portion (surface layer portion) of the p-type well PW1 in the memory cell region 1A. At the same time, to adjust the threshold voltage of the MISFET formed later in the peripheral circuit region 1B, channel dope ion implantation is performed as necessary to the surface portion (surface layer portion) of the p-type well PW2 in the peripheral circuit region 1B.

Next, the surface of the semiconductor substrate 1 (p-type wells PW1 and PW2) is cleaned by diluted hydrofluoric acid cleaning or the like, and then the insulating film 3 for gate insulating film is formed (Step S4 of FIG. 5). The insulating film 3 can be formed of, e.g., a thin silicon oxide film, silicon oxynitride film, or the like. The film thickness (formed film thickness) of the insulating film 3 can be adjusted to, e.g., about 2 to 3 nm.

Figure 9:
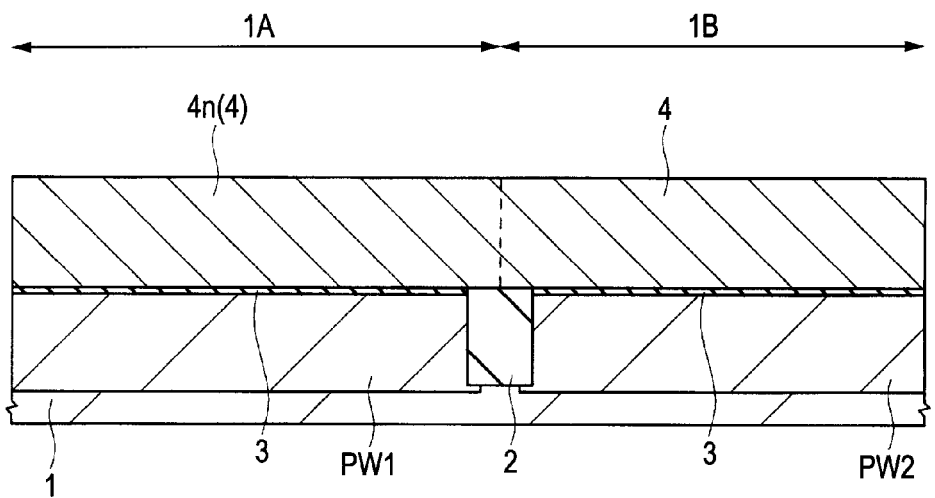
FIG. 9 is a main-portion cross-sectional view of the semiconductor device during the manufacturing process thereof, which is subsequent to FIG. 8.

Next, as shown in FIG. 9, over the main surface (entire main surface) of the semiconductor substrate 1, i.e., over the insulating film 3, a silicon film 4 is formed (deposited) as a conductor film for gate electrodes (Step S5 of FIG. 5). The silicon film 4 is formed of a polycrystalline silicon film, and can be formed using a CVD (Chemical Vapor Deposition) method or the like. The film thickness (formed film thickness) of the silicon film 4 can be adjusted to, e.g., about 50 to 250 nm. It is also possible to form the silicon film 4 as an amorphous silicon film during film deposition, and change the amorphous silicon film into the polycrystalline silicon film by the subsequent heat treatment.

After the silicon film 4 is formed, using photolithographic method, a photoresist pattern (which is not shown herein, but is formed in the entire peripheral circuit region 1B) is formed over the silicon film 4. Using the photoresist pattern as a mask, an n-type impurity is introduced into the memory cell region 1A (the silicon film 4 thereof) by an ion implantation method or the like, thereby forming the n-type silicon film 4n in the memory cell region 1A. That is, an n-type impurity is introduced into the silicon film 4 in the memory cell region 1A to change the silicon film 4 in the memory cell region 1A to the n-type silicon film 4n into which the n-type impurity has been introduced.

Figure 10:
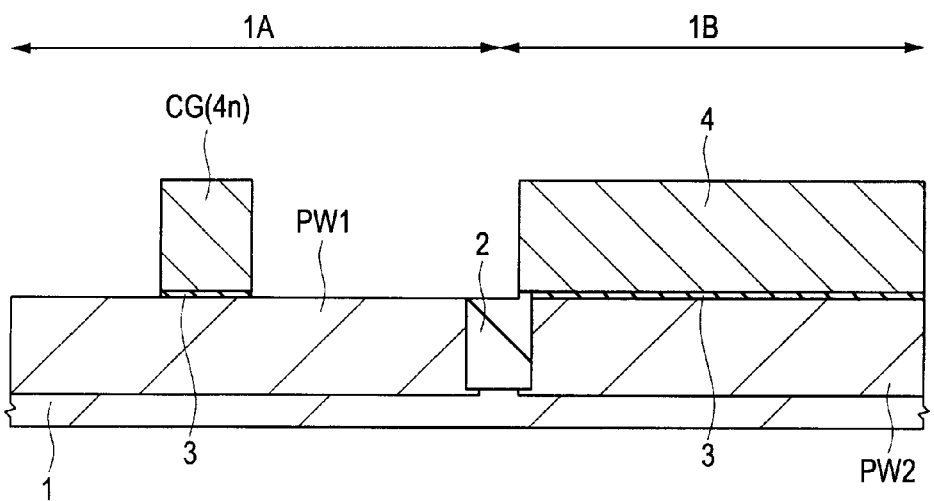
FIG. 10 is a main-portion cross-sectional view of the semiconductor device during the manufacturing process thereof, which is subsequent to FIG. 9.

Next, as shown in FIG. 10, the n-type silicon film 4n in the memory cell region 1A is patterned by etching to form the control gate electrode CG (Step S6 of FIG. 5). The patterning step of Step S6 can be performed, e.g., as follows.

That is, over the silicon films 4n and 4, using a photolithographic method, a photoresist pattern (which is not shown herein, but is formed entirely in the region where the control gate electrode CG is to be formed and the peripheral circuit region 1B) is formed and, using the photoresist pattern as an etching mask, the silicon film 4n in the memory cell region 1A is etched (by dry etching) to be patterned. Thereafter, the photoresist pattern is removed.

Thus, in Step S6, the silicon film 4n is patterned and, as shown in FIG. 10, in the memory cell region 1A, the control gate electrode CG formed of the patterned silicon film 4n is formed. At this time, in the peripheral circuit region 1B, the photoresist pattern is formed as described above so that the silicon film 4 is not patterned. On the other hand, in the memory cell region 1A, the insulating film 3 remaining under the control gate electrode CG serves as the gate insulating film of the control transistor. As a result, the control gate electrode CG made of the silicon film 4n is formed over the semiconductor substrate 1 (p-type well PW1) via the insulating film 3 as the gate insulating film.

In the memory cell region 1A, the insulating film 3 except for the portion thereof covered with the control gate electrode CG (i.e., the insulating film 3 except for the portion thereof serving as the gate insulating film) may be able to be removed by dry etching performed in the patterning step of Step S6 or wet etching performed after the dry etching.

Next, to adjust the threshold voltage of the memory transistor formed later in the memory cell region 1A, channel dope ion implantation is performed as necessary to the surface portion (surface layer portion) of the p-type well PW1 in the memory cell region 1A.

Figure 11:
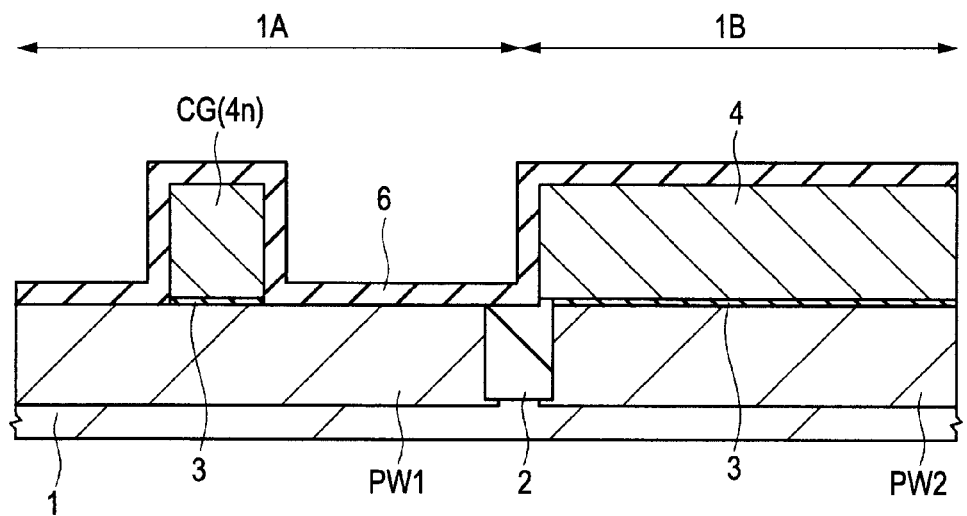
FIG. 11 is a main-portion cross-sectional view of the semiconductor device during the manufacturing process thereof, which is subsequent to FIG. 10.

Next, a cleaning treatment is performed to clean the main surface of the semiconductor substrate 1. Then, as shown in FIG. 11, over the entire main surface of the semiconductor substrate 1, i.e., over the main surface (surface) of the semiconductor substrate 1 and the surfaces (upper and side surfaces) of the control gate electrode CG, a silicon oxide film (insulating film) 6 is formed as an insulating film (Step S7 of FIG. 5). The silicon oxide film 6 can be formed by, e.g., a CVD method. The silicon oxide film 6 may also use a laminated structure of a thermal oxide film and an oxide film by a CVD method. In Step S7, as shown in FIG. 11, the silicon oxide film 6 is formed over the surface of the portion of the semiconductor substrate 1 uncovered with the control gate electrode CG and the silicon film 4, the surfaces (side and upper surfaces) of the control gate electrode CG, and the surfaces (side and upper surfaces) of the silicon film 4. Specifically, the silicon oxide film 6 is formed over the semiconductor substrate 1 so as to cover the control gate electrode CG and the silicon film 4. The thickness of the silicon oxide film 6 can be adjusted to be, e.g., about 10 to 30 nm.

Figure 12:
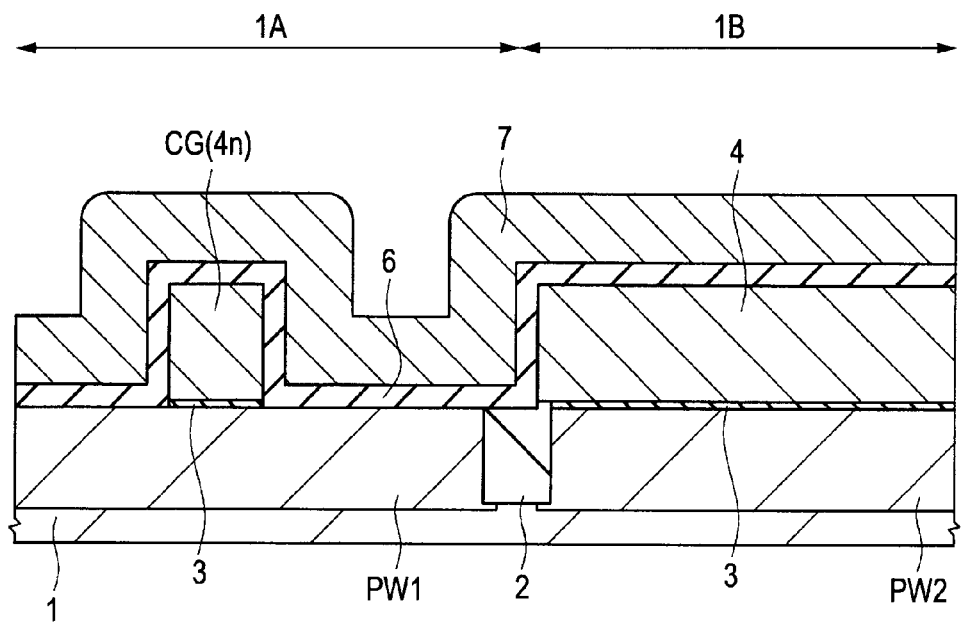
FIG. 12 is a main-portion cross-sectional view of the semiconductor device during the manufacturing process thereof, which is subsequent to FIG. 11.

Next, as shown in FIG. 12, over the main surface (entire main surface) of the semiconductor substrate 1, i.e., over the silicon oxide film 6, a silicon film 7 is formed (deposited) as a conductor film for forming the memory gate electrode MG so as to cover the control gate electrode CG in the memory cell region 1A and cover the silicon film 4 in the peripheral circuit region 1B (Step S8 of FIG. 5).

The silicon film 7 is made of a polycrystalline silicon film, and can be formed using a CVD method or the like. The film thickness (deposited film thickness) of the silicon film 7 can be adjusted to be, e.g., about 30 to 150 nm. It is also possible to form the silicon film 7 as an amorphous silicon film during film deposition, and change the amorphous silicon film to a polycrystalline silicon film by the subsequent heat treatment.

The resistance of the silicon film 7 has been reduced by introducing an n-type impurity therein. The n-type impurity can be introduced into the silicon film 7 by ion implantation after the deposition of the silicon film 7, but can also be introduced into the silicon film 7 during the deposition of the silicon film 7. When the n-type impurity is introduced into the silicon film 7 during the deposition thereof, by causing a gas for depositing the silicon film 7 to contain a doping gas (gas for adding an n-type impurity), the silicon film 7 into which an n-type impurity has been introduced can be deposited. In either case, in the memory cell region 1A and the peripheral circuit region 1B, the silicon film 7 into which the n-type impurity has been introduced is formed.

Next, using an anisotropic etching technique, the silicon film 7 is etched back (by etching, dry etching, or anisotropic etching) (Step S9 of FIG. 5).

Figure 13:
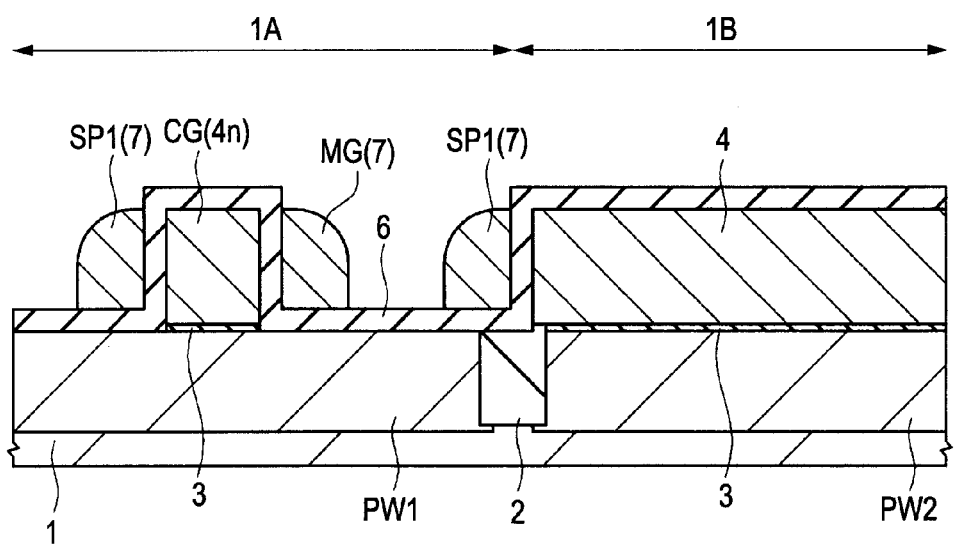
FIG. 13 is a main-portion cross-sectional view of the semiconductor device during the manufacturing process thereof, which is subsequent to FIG. 12.

In the etch-back step of Step S9, by anisotropically etching (etching back) the silicon film 7 by the deposited film thickness thereof, the silicon film 7 is left in the form of sidewall spacers over the both side walls of the control gate electrode CG (via the silicon oxide films 6), while the silicon film 7 in the other region is removed. In this manner, as shown in FIG. 13, in the memory cell region 1A, the memory gate electrode MG is formed of the silicon film 7 that has been left in the form of the sidewall spacer over one of the both side walls of the control gate electrode CG via the silicon oxide film 6, while a silicon spacer SP1 is formed of the silicon film 7 that has been left in the form of the sidewall spacer over the other side wall via the silicon oxide film 6. The memory gate electrode MG is formed over the silicon oxide film 6 so as to adjoin the control gate electrode CG via the silicon oxide film 6.

The silicon spacer SP1 can also be regarded as a sidewall spacer made of a conductor, i.e., a conductor spacer. The memory gate electrode MG and the silicon spacer SP1 are formed over the mutually opposite side walls of the control gate electrode CG, and have substantially symmetric configurations with respect to the control gate electrode CG interposed therebetween. Over the side wall of the silicon film 4 left in the peripheral circuit region 1B also, the silicon spacer SP1 may be able to be formed via the silicon oxide film 6.

In the etch-back step of Step S9, using the silicon oxide film 6 as an etching stopper, the silicon film 7 can be etched (anisotropically etched). At the stage when the etch-back step of Step S9 has been performed, the silicon oxide film 6 in the region uncovered with the memory gate electrode MG and the silicon spacer SP1 is exposed. The memory gate length (gate length of the memory gate electrode MG) is determined by the deposited film thickness of the silicon film 7. Therefore, by adjusting the deposited film thickness of the silicon film 7 deposited in Step S8 mentioned above, the memory gate length can be adjusted.

Figure 14:
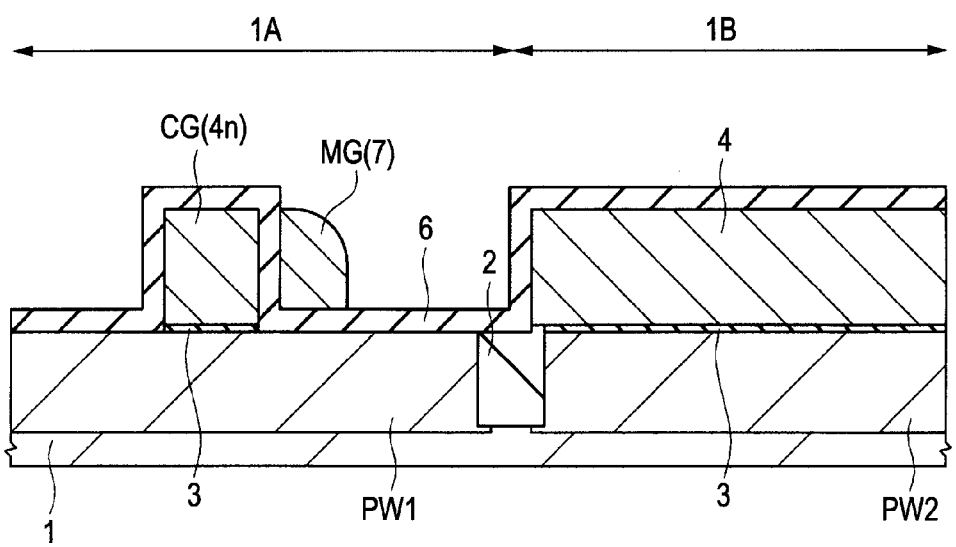
FIG. 14 is a main-portion cross-sectional view of the semiconductor device during the manufacturing process thereof, which is subsequent to FIG. 13.

Next, using a photolithographic technique, a photoresist pattern (not shown) which covers the memory gate electrode MG and exposes the silicon spacer SP1 is formed over the semiconductor substrate 1. Then, by dry etching using the photoresist pattern as an etching mask, the silicon spacer SP1 is removed (Step S10 of FIG. 5). Thereafter, the photoresist pattern is removed. By the etching step of Step S10, as shown in FIG. 14, the silicon spacer SP1 is removed but, since the memory gate electrode MG is covered with the photoresist pattern, the memory gate electrode MG remains without being etched.

Figure 15:
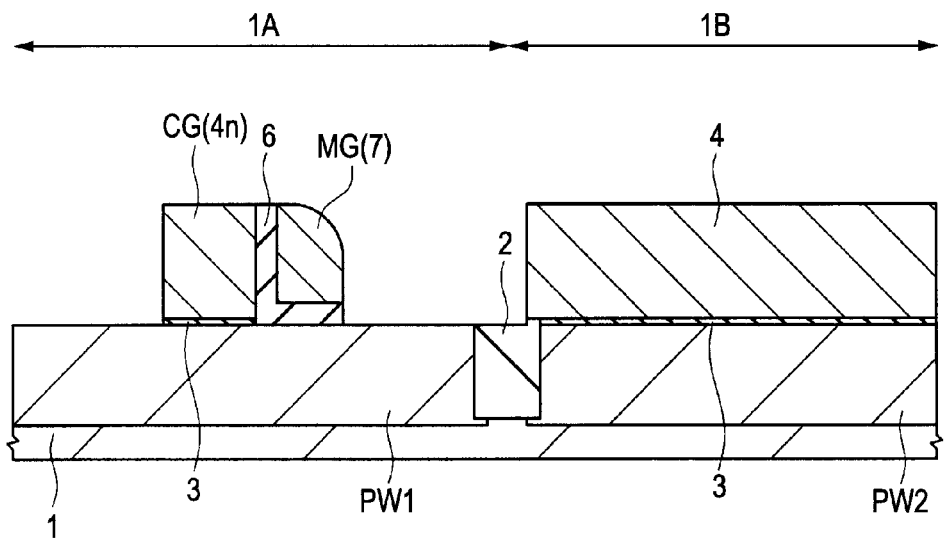
FIG. 15 is a main-portion cross-sectional view of the semiconductor device during the manufacturing process thereof, which is subsequent to FIG. 14.

Next, as shown in FIG. 15, the portion of the silicon oxide film 6 uncovered with the memory gate electrode MG and exposed is removed by etching (e.g., wet etching) (Step S11 of FIG. 5).

The etching in Step S11 can be performed by, e.g., wet etching using a diluted hydrofluoric acid or the like. In the etching step of Step S11, in the memory cell region 1A, the silicon oxide film 6 located under the memory gate electrode MG and between the memory gate electrode MG and the control gate electrode CG remains without being removed, while the silicon oxide film 6 in the other region is removed. At this stage, as can be seen also from FIG. 15, the silicon oxide film 6 extends continuously over two regions, which are the region between the memory gate electrode MG and the semiconductor substrate 1 (p-type well PW1) and the region between the memory gate electrode MG and the control gate electrode CG. Note that, depending on conditions for the etching in Step S11, a part of the silicon oxide film 6 located under the memory gate electrode MG may also be slightly etched.

Figure 16:
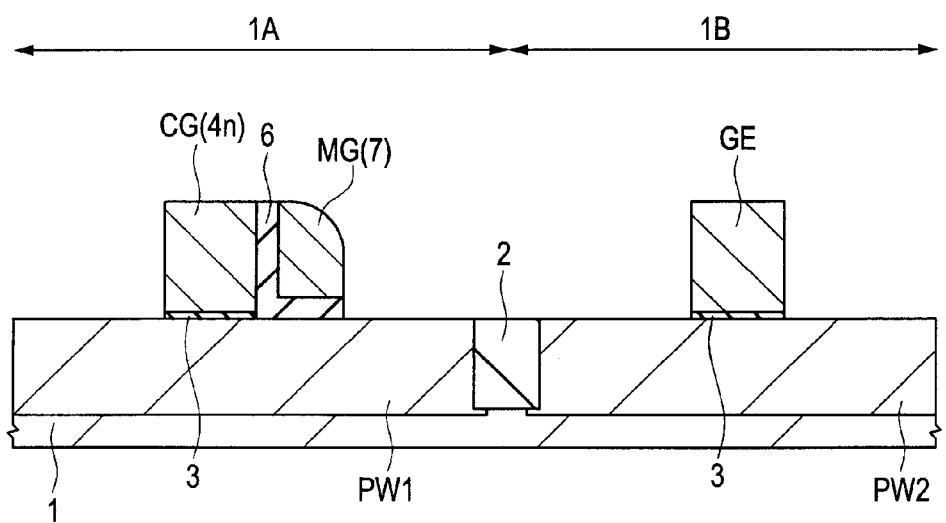
FIG. 16 is a main-portion cross-sectional view of the semiconductor device during the manufacturing process thereof, which is subsequent to FIG. 15.

Next, over the silicon film 4 formed in the peripheral circuit region 1B, using a photolithographic method, a photoresist pattern (which is not shown herein, but is formed in the entire memory cell region 1A and the area of the peripheral circuit region 1B where the p-channel MISFET is to be formed) is formed and, using the photoresist pattern as a mask, an n-type impurity is introduced into the silicon film 4 in the peripheral circuit region 1B. As a result, in the peripheral circuit region 1B, an n-type silicon film (corresponding to the silicon film 4 in the peripheral circuit region 1B into which an n-type impurity has been introduced) is formed. Thereafter, over the n-type silicon film, a photoresist pattern (which is not shown herein, but is formed in the entire memory cell region 1A and the area of the peripheral circuit region 1B where the gate electrode GE is to be formed) is formed and, using the photoresist pattern as an etching mask, the foregoing n-type silicon film is etched (by dry etching) to be patterned. At this time, the memory cell region 1A is covered with the photoresist pattern, and is not etched. Thereafter, the photoresist pattern is removed. In this manner, as shown in FIG. 16, the gate electrode GE formed of the patterned n-type silicon film (i.e., the silicon film 4 in the peripheral circuit region 1B into which an n-type impurity has been introduced and which has been patterned) is formed.

Figure 17:
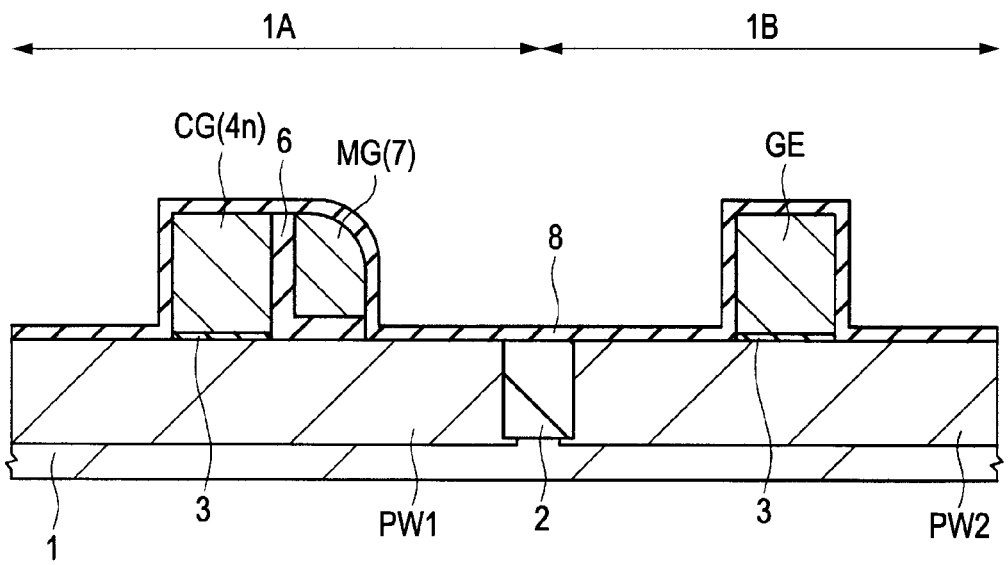
FIG. 17 is a main-portion cross-sectional view of the semiconductor device during the manufacturing process thereof, which is subsequent to FIG. 16.

Next, as shown in FIG. 17, over the main surface (entire main surface) of the semiconductor substrate 1, the insulating film 8 is formed so as to cover the control gate electrode CG, the memory gate electrode MG, and the gate electrode GE (Step S12 of FIG. 6).

The insulating film 8 is preferably made of, e.g., silicon oxide film, and the formed film thickness (thickness) thereof can be adjusted to be, e.g., about 5 to 20 nm. The insulating film 8 can be formed using, e.g., a CVD method or the like.

Figure 18:
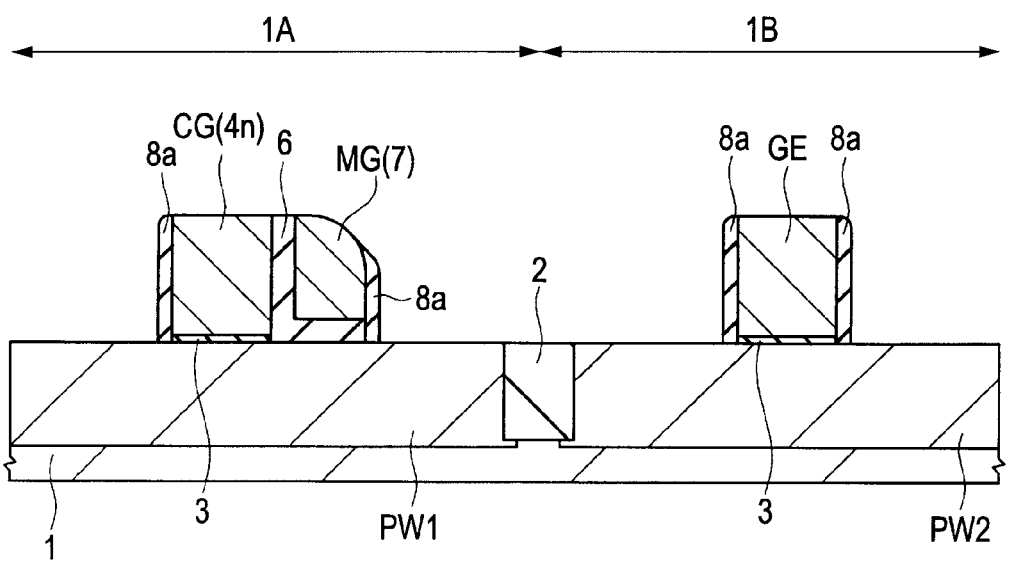
FIG. 18 is a main-portion cross-sectional view of the semiconductor device during the manufacturing process thereof, which is subsequent to FIG. 17.
Figure 19:
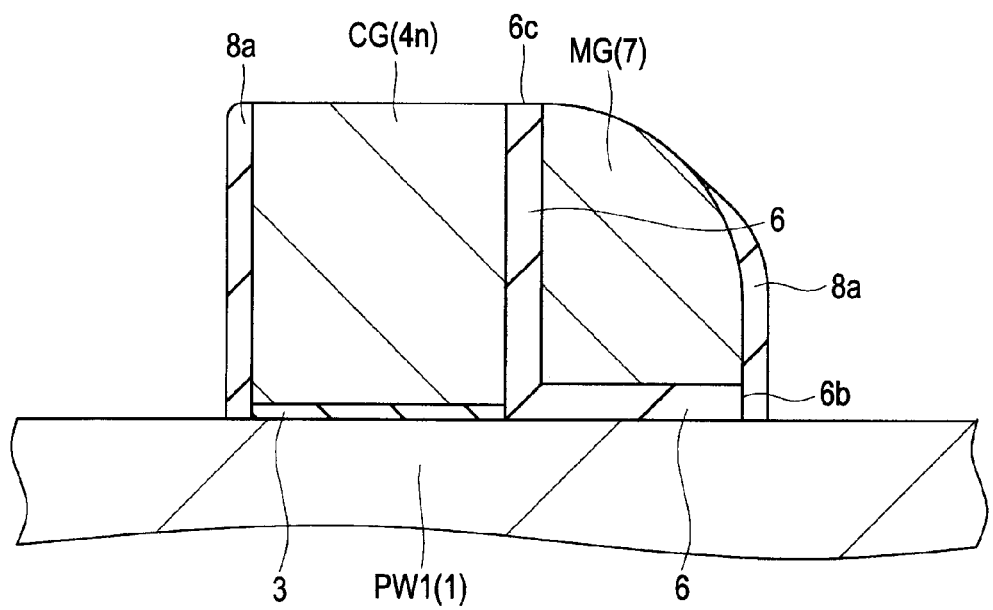
FIG. 19 is a partially enlarged cross-sectional view of FIG. 18.

Next, as shown in FIG. 18, using an anisotropic etching technique, the insulating film 8 is etched back (by etching, dry etching, or anisotropic etching) (Step S13 of FIG. 6). Note that FIG. 19 is a partially enlarged cross-sectional view of FIG. 18, and shows a part of the memory cell region 1A in FIG. 18 in enlarged relation.

In the etch-back step of Step S13, by anisotropically etching (etching back) the insulating film 8 by the deposited film thickness thereof, the insulating film 8 is left over the side walls of the control gate electrode CG, the memory gate electrode MG, and the gate electrode GE, while the insulating film 8 in the other region is removed. In this manner, as shown in FIGS. 18 and 19, sidewall insulating films (sidewall spacers or offset spacers) 8a formed of the insulating film 8 left over the respective side walls of the control gate electrode CG, the memory gate electrode MG, and the gate electrode GE are formed.

The sidewall insulating films 8a are formed over the both side walls of the gate electrode GE, the side wall of the control gate electrode CG opposite to the side wall thereof adjoining the memory gate electrode MG via the silicon oxide film 6, and the side wall of the memory gate electrode MG opposite to the side wall thereof adjoining the control gate electrode CG via the silicon oxide film 6.

Note that it may also be possible to omit Step S12 (the step of forming the insulating film 8) and Step S13 (the step of etching back the insulating film 8). In this case, over the side walls of the gate electrode GE, the control gate electrode CG, and the memory gate electrode MG, the foregoing sidewall insulating films 8a are not formed. However, if consideration is given to an improvement in the performance of the MISFET formed in the peripheral circuit region 1B, it is more preferable to form the sidewall insulating films 8a over the both side walls of the gate electrode GE, and therefore it is more preferable to perform Step S12 (the step of forming the insulating film 8) and Step S13 (the step of etching back the insulating film 8). When Step S12 (the step of forming the insulating film 8) and Step S13 (the step of etching back the insulating film 8) are omitted, the sidewall insulating films 8a are not formed so that, in Step S14 which will be described later, the silicon oxide film 6 interposed between the memory gate electrode MG and the semiconductor substrate 1 (p-type well PW1) is removed by etching.

Figure 20:
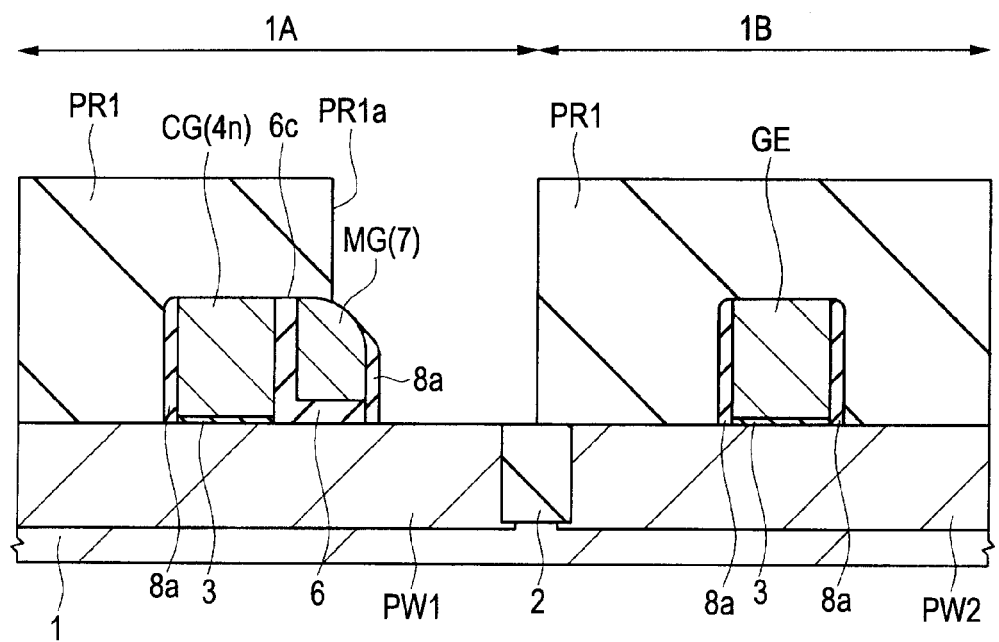
FIG. 20 is a main-portion cross-sectional view of the semiconductor device during the manufacturing process thereof, which is subsequent to FIG. 18.

Next, as shown in FIG. 20, a photoresist pattern (resist pattern) PR1 which covers a part of the memory gate electrode MG, the control gate electrode CG, and the gate electrode GE, and exposes the other part of the memory gate electrode MG is formed over the semiconductor substrate 1 using a photolithographic method. At this time, the area of the memory cell region 1A where the source region of the memory cell MC is to be formed is exposed without being covered with the photoresist pattern PR1. More specifically, the photoresist pattern PR1 is formed so as to cover the entire peripheral circuit region 1B, expose the area where the source region of the memory cell MC is to be formed and a part of the memory gate electrode MG, and cover the other part of the memory cell region 1A. Since the area of the memory cell region 1A where the source region of the memory cell MC is to be formed and a part of the memory gate electrode MG are exposed from an opening PR1a in the photoresist pattern PR1, the sidewall insulating film 8a formed over the side wall of the memory gate electrode MG is also exposed from the opening PR1a in the photoresist pattern PR1 without being covered with the photoresist pattern PR1.

Figure 21:
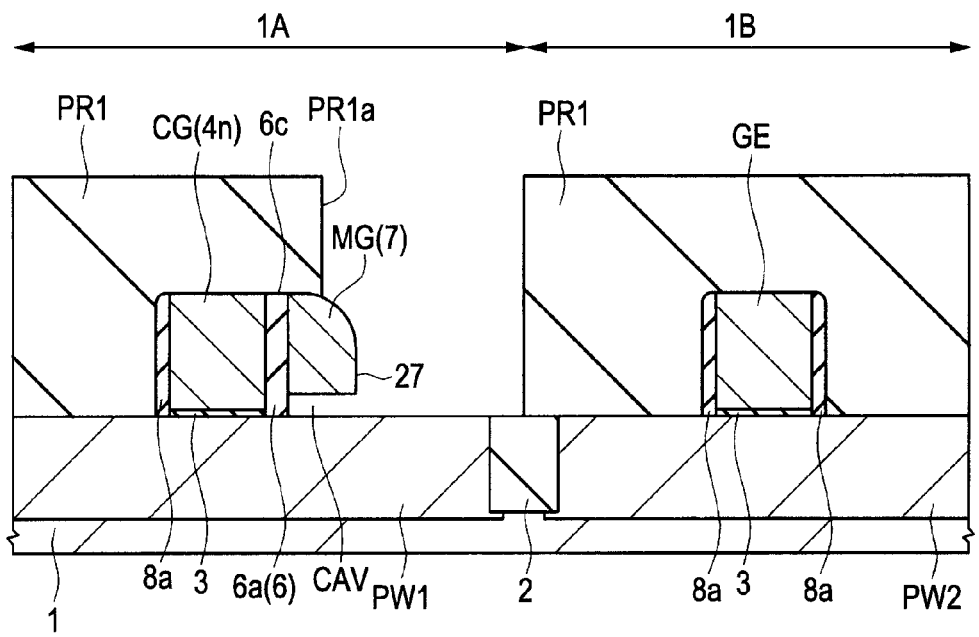
FIG. 21 is a main-portion cross-sectional view of the semiconductor device during the manufacturing process thereof, which is subsequent to FIG. 20.
Figure 22:
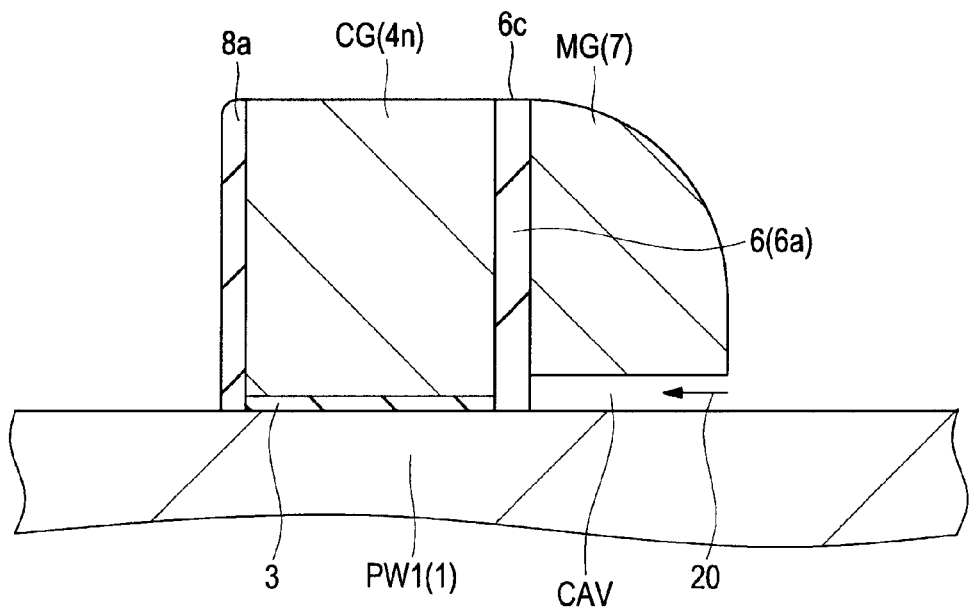
FIG. 22 is a partially enlarged cross-sectional view of FIG. 21.

Next, as shown in FIG. 21, etching is performed to remove the sidewall insulating film 8a formed over the side wall of the memory gate electrode MG and the silicon oxide film 6 located between the memory gate electrode MG and the semiconductor substrate 1 (p-type well PW1) (Step S14 of FIG. 6). In the etching step of Step S14, of the silicon oxide film 6, at least a part of the portion between the lower surface of the memory gate electrode MG and the semiconductor substrate 1 (p-type well PW1) is removed to form a cavity CAV. Note that FIG. 22 is a partially enlarged cross-sectional view of FIG. 21, and shows a part of the memory cell region 1A in FIG. 21 in enlarged relation but, in FIG. 22, the depiction of the photoresist pattern PR1 is omitted. In the etching step of Step S14, the photoresist pattern PR1 is capable of functioning as an etching mask.

If the sidewall insulating film 8a is formed of a silicon oxide film (i.e., if the foregoing insulating film 8 is a silicon oxide film), in Step S14, it is possible to sequentially etch the sidewall insulating film 8a and the silicon oxide film 6.

In Step S14, when the sidewall insulating film 8a is removed first by etching, an end portion 6b of the silicon oxide film 6 is exposed under the side wall (side wall not adjoining the control gate electrode CG) of the memory gate electrode MG (the end portion 6b is shown in FIG. 19 mentioned above). The end portion 6b of the silicon oxide film 6 is the end portion of the portion of the silicon oxide film 6 located between the memory gate electrode MG and the semiconductor substrate 1 (p-type well PW1), which has been in contact (covered) with the sidewall insulating film 8a till the sidewall insulating film 8a is removed. That is, after the sidewall insulating film 8a is formed in Step S13, the end portion 6b of the portion of the silicon oxide film 6 interposed between the memory gate electrode MG and the semiconductor substrate 1 (p-type well PW1) is covered with the sidewall insulating film 8a, and is not exposed. However, when the sidewall insulating film 8a is removed in Step S14, the end portion 6b is exposed and, when etching further advances, as can be seen also from FIG. 22, the etching of the silicon oxide film 6 advances from the end portion 6b of the silicon oxide film 6. Note that, in FIG. 22, the direction in which the etching of the silicon oxide film 6 advances is schematically shown by an arrow 20.

To etch the silicon oxide film 6 located between the memory gate electrode MG and the semiconductor substrate 1 (p-type well PW1) in Step S14, it is necessary to perform isotropic etching, and it is more preferable to perform wet etching. Therefore, in Step S14, wet etching is preferably performed but, at this time, an etchant solution capable of selectively etching the sidewall insulating film 8a and the silicon oxide film 6 is used. That is, an etchant solution is used which allows the etching speed of the sidewall insulating film 8a and the silicon oxide film 6 to be higher than the etching speeds of the memory gate electrode MG (the silicon film 7 forming the memory gate electrode MG) and the semiconductor substrate 1 (the monocrystalline silicon region forming the semiconductor substrate 1). In other words, an etchant solution is used which is more likely to etch the sidewall insulating film 8a and the silicon oxide film 6 and less likely to etch the memory gate electrode MG (the silicon film 7 forming the memory gate electrode MG) and the semiconductor substrate 1 (the monocrystalline silicon region forming the semiconductor substrate 1). Examples of the etchant solution that can be used in Step S14 include a buffered hydrofluoric acid. Thus, in Step S14, it is possible to selectively remove the sidewall insulating film 8a formed over the side wall of the memory gate electrode MG and the silicon oxide film 6 located between the memory gate electrode MG and the semiconductor substrate 1 (p-type well PW1), and also inhibit or prevent the memory gate electrode MG and the semiconductor substrate 1 (p-type well PW1) from being etched.

At the stage before Step S14 is performed, as also shown in FIGS. 19 and 20, the silicon oxide film 6 extends continuously over two regions, which are the region between the memory gate electrode MG and the semiconductor substrate (p-type well PW1) and the region between the memory gate electrode MG and the control gate electrode CG. At this stage, the portion of the silicon oxide film 6 located between the memory gate electrode MG and the control gate electrode CG has an upper end portion 6c thereof being covered with the photoresist pattern PR1 (i.e., not exposed) (the upper end portion 6c is shown in FIGS. 19 to 22). Here, the upper end portion 6c of the silicon oxide film 6 corresponds to the end portion of the silicon oxide film 6 interposed between an upper portion of the memory gate electrode MG and an upper portion of the control gate electrode CG. The state in which the upper end portion 6c of the silicon oxide film 6 is covered with the photoresist pattern PR1 (i.e., an unexposed state) is maintained even when the etching in Step S14 advances. Accordingly, in the etching step of Step S14, the etching of the silicon oxide film 6 does not advance from the upper end portion 6c of the silicon oxide film 6. The silicon oxide film 6 is also interposed between the memory gate electrode MG and the control gate electrode CG and between the memory gate electrode MG and the semiconductor substrate 1 (p-type well PW1). Therefore, in Step S14, the silicon oxide film 6 is exposed at the end portion 6b, and the etching of the silicon oxide film 6 may be able to advance from the end portion 6b. That is, in the etching step of Step S14, the etching of the silicon oxide film 6 does not advance from the upper end portion 6c of the silicon oxide film 6 interposed between the upper portion of the control gate electrode CG and the upper portion of the memory gate electrode MG, but advances from the end portion 6b of the silicon oxide film 6. In the etching step of Step S14, by adjusting an etching time or the like, it is possible to control the distance over which the silicon oxide film 6 is etched and removed.

That is, the photoresist pattern PR1 is formed so as to cover the upper end portion 6c of the silicon oxide film 6 (i.e., the end portion 6c of the silicon oxide film 6 interposed between the control gate electrode CG and the memory gate electrode MG). Then, in the etching step of Step S14, using the photoresist pattern PR1 as an etching mask, the silicon oxide film 6 is etched from the end portion 6b of the silicon oxide film 6 (i.e., from the end portion 6b of the silicon oxide film 6 interposed between the memory gate electrode MG and the semiconductor substrate 1).

The portion from which the silicon oxide film 6 has been removed becomes the cavity (space) CAV. That is, by the etching step of Step S14, a part of the silicon oxide film 6 is removed to result in the cavity CAV. In the cavity CAV, the material of the silicon oxide film 6 does not exist.

In the etching step of Step S14, at least a part of the silicon oxide film 6 located between the memory gate electrode MG and the semiconductor substrate 1 (p-type well PW1) is removed, but the silicon oxide film 6 located between the memory gate electrode MG and the control gate electrode CG is left without being removed. That is, in the etching step of Step S14, the silicon oxide film 6 is etched from the end portion 6b of the silicon oxide film 6. However, by the time even the silicon oxide film 6 between the memory gate electrode MG and the control gate electrode CG is etched (removed), etching is terminated. Accordingly, the cavity CAV is formed below the memory gate electrode MG, i.e., between the memory gate electrode MG and the semiconductor substrate 1 (p-type well PW1), but is not formed between the memory gate electrode MG and the control gate electrode CG so that the silicon oxide film 6 (i.e., the silicon oxide film 6a) remains. The silicon oxide film 6 which is not removed but remains even in the etching step of Step S14 becomes the silicon oxide film 6a mentioned above and, at the stage after the etching step of Step S14, the silicon oxide film 6a is formed (disposed) between the memory gate electrode MG and the control gate electrode CG.

As a result, the cavity CAV and the silicon oxide film 6a adjoin each other, and the end portion (etched end surface) of the silicon oxide film 6b adjoins the cavity CAV to form a part of the inner wall of the cavity CAV. The upper surface (upper surface of the inner wall) of the cavity CAV is formed of the lower surface of the memory gate electrode MG, while the lower surface (lower surface of the inner wall) of the cavity CAV is formed of the surface of the semiconductor substrate 1 (p-type well PW1). Since the portion from which the silicon oxide film 6 has been removed becomes the cavity CAV, the thickness of the cavity CAV is substantially the same as the thickness of the silicon oxide film 6a (6). Note that, in the portion where the end portion 6b of the silicon oxide film 6 was located immediately before Step S14, the cavity CAV is opened to the outside so that the cavity CAV is not a closed space, but an open space.

Figure 23:
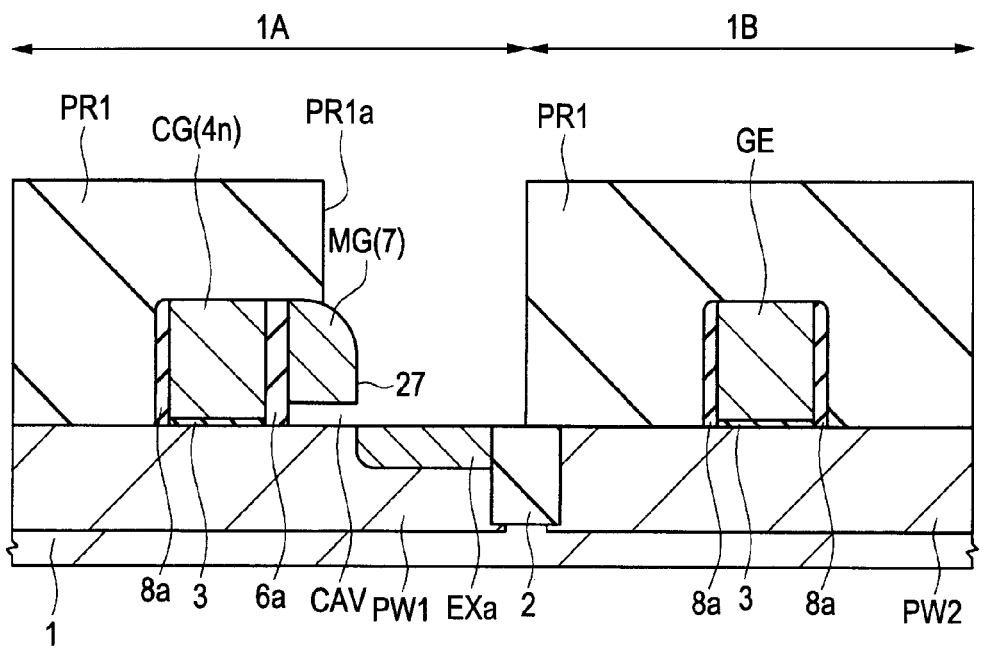
FIG. 23 is a main-portion cross-sectional view of the semiconductor device during the manufacturing process thereof, which is subsequent to FIG. 21.

Next, by an ion implantation method or the like, an n-type impurity such as arsenic (As) or phosphorus (P) is introduced (for doping) into the semiconductor substrate 1 (p-type well PW1) using the photoresist pattern PR1 and the memory gate electrode MG as a mask (ion implantation stopper mask), thereby forming the $n^-$-type semiconductor region (impurity diffusion layer) EXa (Step S15 of FIG. 6), as shown in FIG. 23.

The photoresist pattern PR1 is formed so as to expose at least a part of a region where a source region (corresponding to the semiconductor region MS) adjoining the memory gate electrode MG is to be formed. In Step S15, using the photoresist pattern PR1 (and the memory gate electrode MG) as an ion implantation stopper mask, ion implantation for forming the $n^-$-type semiconductor region EXa is performed. Note that the $n^-$-type semiconductor region EXa is an extension region for the source region, and can be regarded as a part of the source region (corresponding to the semiconductor region MS).

At this time, in the memory cell region 1A, the $n^-$-type semiconductor region EXa is formed by self alignment with respect to the side wall (side surface 27 opposite to the side surface thereof adjoining the control gate electrode CG via the silicon oxide film 6a) of the memory gate electrode MG.

In the present embodiment, the ion implantation for forming the $n^-$-type semiconductor region EXa and ion implantation for forming the $n^-$-type semiconductor region EXb, which will be described later, are performed in different steps (by different ion implantations). Accordingly, it is possible to differentiate the impurity concentration of the $n^-$-type semiconductor region EXa from the impurity concentration of the $n^-$-type semiconductor region EXb, and achieve respective optimum impurity concentrations therefor. This allows a further improvement in the performance of the nonvolatile memory.

In addition, since the same photoresist pattern PR1 is used in the etching step of Step S14 and the ion implantation step of Step S15, the number of photolithographic steps can be reduced. This allows a reduction in the number of process steps for the semiconductor device, and also allows a reduction in the manufacturing cost of the semiconductor device.

Note that, in Step S15, the area of the memory cell region 1A where the drain region of the memory cell MC is to be formed is covered with the photoresist pattern PR1 so that an extension region (corresponding to the $n^-$-type semiconductor region EXb which will be described later) for the drain region of the memory cell MC is not formed. Also in Step S15, the peripheral circuit region 1B is covered with the photoresist pattern PR1 so that, in the peripheral circuit region 1B, extension regions (corresponding to $n^-$-type semiconductor regions EXc which will be described later) for the source/drain regions are not formed.

Figure 24:
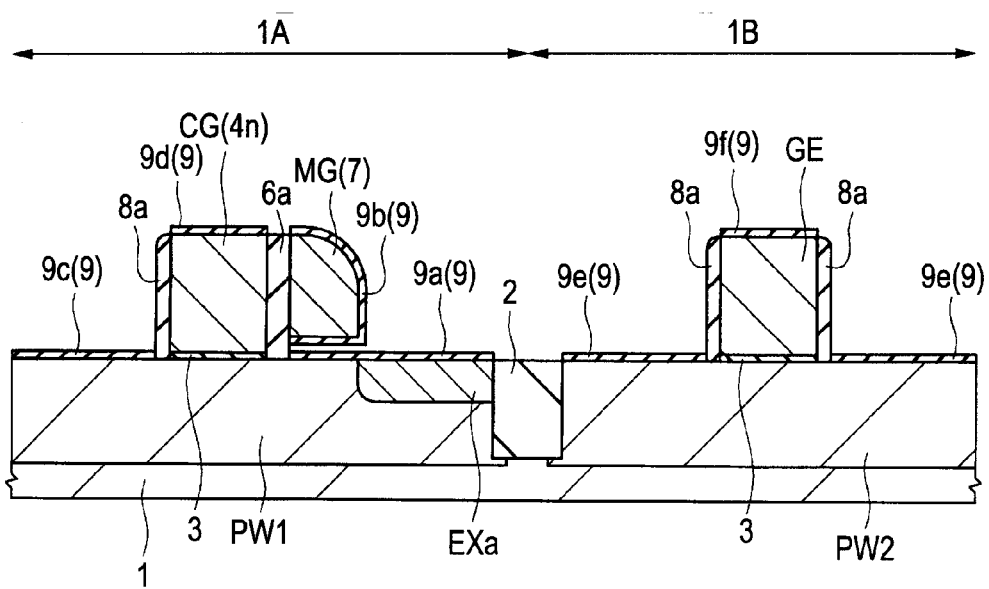
FIG. 24 is a main-portion cross-sectional view of the semiconductor device during the manufacturing process thereof, which is subsequent to FIG. 23.
Figure 25:
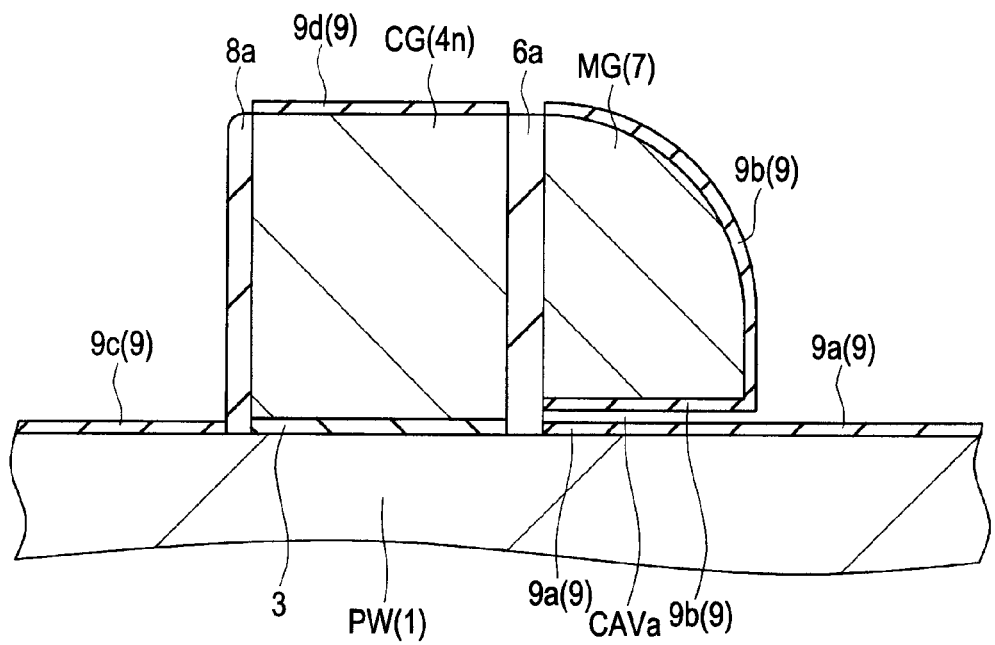
FIG. 25 is a partially enlarged cross-sectional view of FIG. 24.

Next, as shown in FIG. 24, the photoresist pattern PR1 is removed using ashing or the like.

Next, as shown in FIG. 24, an oxidation treatment (preferably a thermal oxidation treatment) is performed to the semiconductor substrate 1 to form a silicon oxide film (oxide film) 9 (Step S16 of FIG. 6). In Step S16, over the surface of the semiconductor substrate 1 (p-type well PW1) exposed in the cavity CAV, the silicon oxide film (oxide film) 9a is formed while, under the lower surface of the memory gate electrode MG exposed in the cavity CAV, the silicon oxide film (oxide film) 9b is formed. Note that FIG. 25 is a partially enlarged cross-sectional view of FIG. 24, and shows a part of the memory cell region 1A in FIG. 24 in enlarged relation but, in FIG. 25, the n⁻-type semiconductor region EXa is included in the p-type well PW1, and the depiction thereof is omitted.

The oxidation treatment in Step S16 is preferably a thermal oxidation treatment. In Step S16, by the thermal oxidation treatment, the exposed surface of silicon is oxidized to form the silicon oxide film 9. The silicon oxide film 9 has the silicon oxide film 9b formed through the oxidization of the exposed surface of the memory gate electrode MG (the silicon film 7 forming the memory gate electrode MG), a silicon oxide film 9d formed through the oxidization of the exposed surface of the control gate electrode CG (the silicon film 4 forming the control gate electrode CG), a silicon oxide film 9f formed through the oxidization of the exposed surface of the gate electrode GE (the silicon film 4 forming the gate electrode GE), and the silicon oxide films 9a, 9c, and 9e formed through the oxidization of the exposed surface of the semiconductor substrate 1.

Specifically, in the memory cell region 1A, the silicon oxide film 9b is formed extensively over the lower surface of the memory gate electrode MG exposed in the cavity CAV, the side surface (side surface opposite to the side surface adjoining the control gate electrode CG via the silicon oxide film 6a) of the memory gate electrode MG, and the upper surface of the memory gate electrode MG. Also in the memory cell region 1A, the silicon oxide film 9a is formed extensively over the surface of the semiconductor substrate 1 (p-type well PW1) exposed in the cavity CAV and the surface of the semiconductor substrate 1 in the area where the n⁻-type semiconductor region EXa is formed. Also in the memory cell region 1A, the silicon oxide film 9d is formed over the upper surface of the control gate electrode CG. Also in the memory cell region 1A, the silicon oxide film 9c is formed over the surface of the semiconductor substrate 1 (p-type well PW1) in the area where the drain region of the memory cell MC is to be formed. On the other hand, in the peripheral circuit region 1B, the silicon oxide film 9f is formed over the upper surface of the gate electrode GE. Also in the peripheral circuit region 1B, the silicon oxide film 9e is formed over the surface of the semiconductor substrate 1 (p-type well PW2).

When the silicon oxide film 9 is formed in Step S16, by the time the cavity CAV is filled up with the silicon oxide film 9, the oxidization treatment is terminated. Accordingly, when the silicon oxide film 9 is formed in Step S16, in the region between the memory gate electrode MG and the semiconductor substrate 1 (p-type well PW1), a cavity (space) CAVa (shown in FIG. 25) is present between the silicon oxide film 9a (the upper surface thereof) and the silicon oxide film 9b (the lower surface thereof). That is, of the foregoing cavity CAV, the space (space where the material of the silicon oxide films 9a and 9b is not present) remaining even after the silicon oxide film 9 is formed in Step S16 is the cavity CAVa. The cavity CAVa is prevented from becoming a closed space so as to allow the silicon nitride film 10a to be formed therein later.

Since polycrystalline silicon has a property more likely to be oxidized than that of monocrystalline silicon, the respective thicknesses of the silicon oxide films 9b, 9d, and 9f can be increased to be larger than the respective thicknesses of the silicon oxide films 9a, 9c, and 9e. Therefore, in the manufactured semiconductor device, in the region between the memory gate electrode MG and the semiconductor substrate 1 (p-type well PW1), the silicon oxide film 9b can be formed thicker than the silicon oxide film 9a. In the region between the memory gate electrode MG and the semiconductor substrate 1 (p-type well PW1), if the silicon oxide film 9b is formed thicker than the silicon oxide film 9a, it is possible to more properly implement the operation method A described above. In the case where the silicon oxide film 9b is formed thicker than the silicon oxide film 9a and where writing or erasing is performed by the FN method (i.e., in the case where the operation method B, C, or D is implemented), it is more preferable to cause charges to tunnel from the semiconductor substrate 1 and be injected into the silicon nitride film 10a.

Note that, in the case where the formation of the sidewall insulating films 8a is omitted (i.e., where the foregoing step of forming the insulating film 8 of Step S12 and the foregoing step of etching back the insulating film 8 of Step S13 are omitted), the silicon oxide film 9d is formed also on the side surface (side surface opposite to the side surface adjoining the memory gate electrode MG via the silicon oxide film 6a) of the control gate electrode CG, and the silicon oxide film 9f is formed also on the side surface of the gate electrode GE. In this case, the silicon oxide film 9d over the surface of the control gate electrode CG may also be integrated with the silicon oxide film 9c over the surface of the semiconductor substrate 1, and the silicon oxide film 9f over the surface of the gate electrode GE may also be integrated with the silicon oxide film 9e over the surface of the semiconductor substrate 1.

Figure 26:
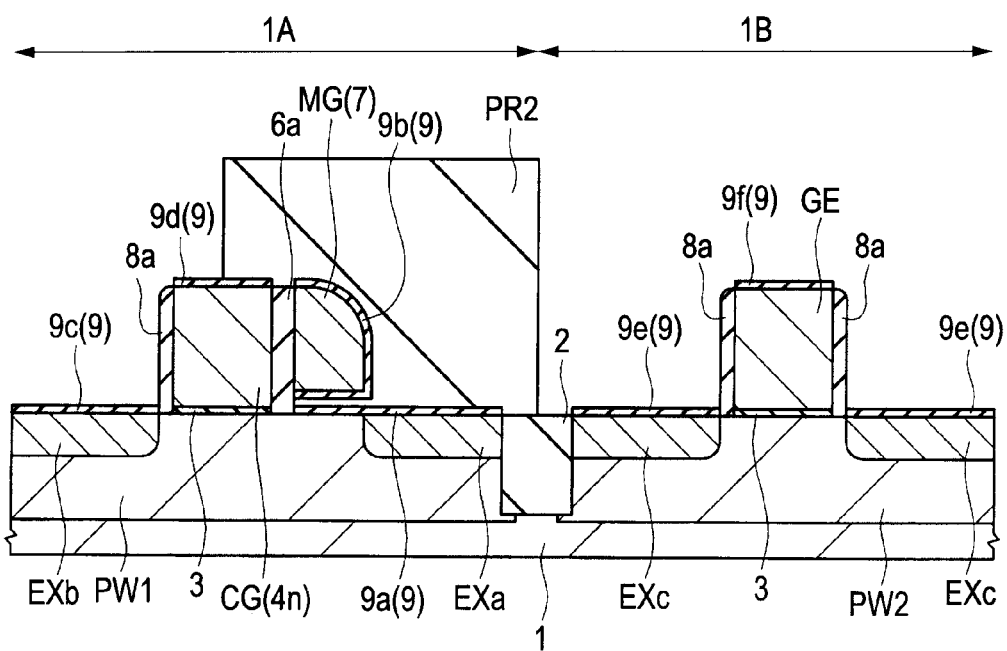
FIG. 26 is a main-portion cross-sectional view of the semiconductor device during the manufacturing process thereof, which is subsequent to FIG. 24.

Next, as shown in FIG. 26, a photoresist pattern (resist pattern) PR2 covering the memory gate electrode MG and the area of the memory cell region 1A where the source region of the memory cell MC is to be formed is formed over the semiconductor substrate 1 using a photolithographic method. It is also possible to cover a part of the control gate electrode CG with the photoresist pattern PR2. The area of the memory cell region 1A where the drain region of the memory cell MC is to be formed is exposed without being covered with the photoresist pattern PR2.

Next, by an ion implantation method or the like, an n-type impurity such as, e.g., arsenic (As) or phosphorus (P) is introduced (for doping) into the semiconductor substrate 1 (p-type wells PW1 and PW2) using the photoresist pattern PR2, the control gate electrode CG, the gate electrode GE, and the sidewall insulating films 8a over the sidewalls of the gate electrodes as a mask (ion implantation stopper mask), thereby forming the n⁻-type semiconductor regions (impurity diffusion layers) EXb and EXc, as shown in FIG. 26 (Step S17 of FIG. 6).

At this time, in the memory cell region 1A, the n⁻-type semiconductor region EXb is formed by self alignment with respect to the side surface (side surface opposite to the side surface in contact with the control gate electrode CG) of the sidewall insulating film 8a over the side wall (side wall opposite to the side wall adjoining the memory gate electrode MG via the silicon oxide film 6a) of the control gate electrode CG. On the other hand, in the peripheral circuit region 1B, the n⁻-type semiconductor regions EXc are formed by self alignment with respect to the side surfaces (side surfaces opposite to the side surfaces in contact with the gate electrode GE) of the sidewall insulating films 8a over the both side walls of the gate electrode GE. The n⁻-type semiconductor regions EXa and EXb are capable of functioning as parts of the source/drain regions of the memory cell formed in the memory cell region 1A, while the n⁻-type semiconductor regions EXc are capable of functioning as parts of the source/drain regions of the MISFET formed in the peripheral circuit region 1B.

Note that, in Step S17, the area of the memory cell region 1A where the source region of the memory cell MC is to be formed is covered with the photoresist pattern PR2, and therefore impurity ions are not implanted therein in Step S17.

Figure 27:
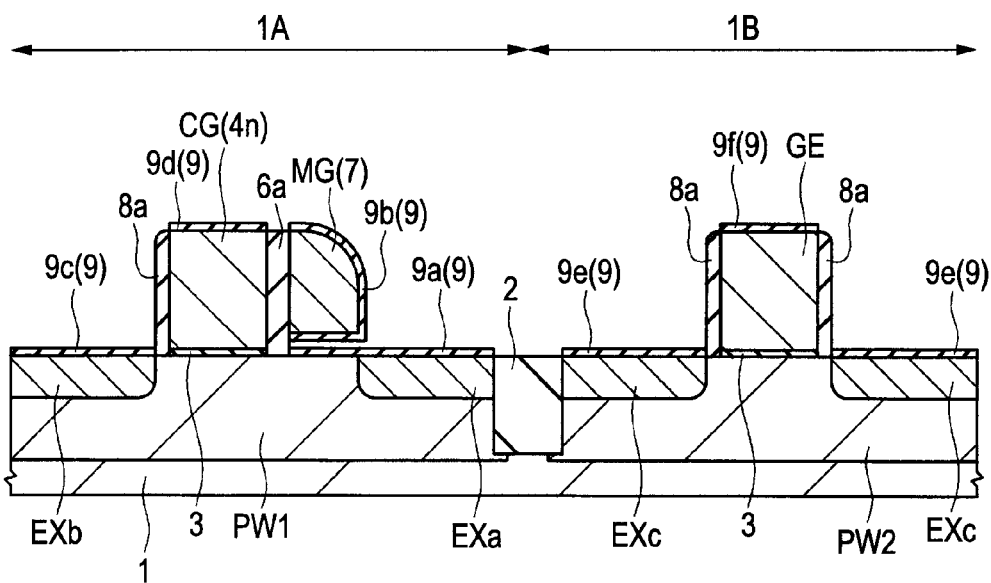
FIG. 27 is a main-portion cross-sectional view of the semiconductor device during the manufacturing process thereof, which is subsequent to FIG. 26.

Next, as shown in FIG. 27, the photoresist pattern PR2 is removed using ashing or the like.

Figure 28:
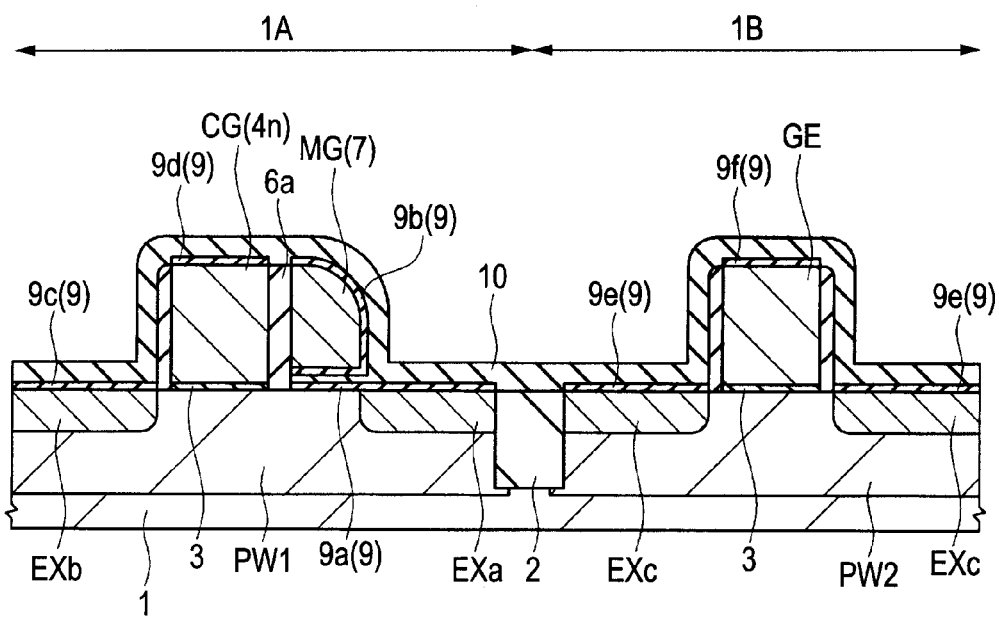
FIG. 28 is a main-portion cross-sectional view of the semiconductor device during the manufacturing process thereof, which is subsequent to FIG. 27.
Figure 29:
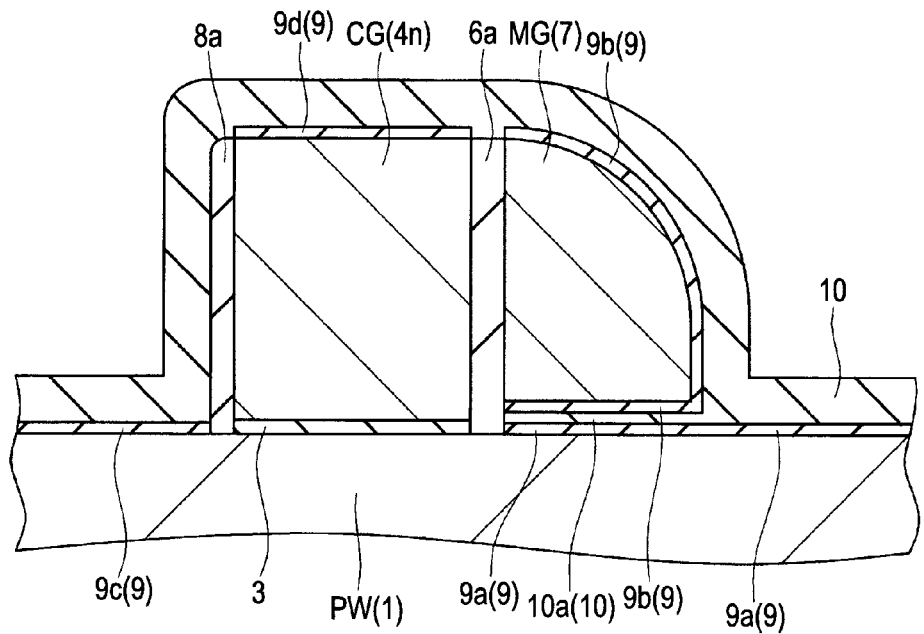
FIG. 29 is a partially enlarged cross-sectional view of FIG. 28.

Next, as shown in FIG. 28, over the semiconductor substrate 1, the silicon nitride film 10 is formed as an insulating film (Step S18 of FIG. 6). In Step S18, between the silicon oxide film 9b under the lower surface of the memory gate electrode MG and the silicon oxide film 9a over the surface of the semiconductor substrate 1 (p-type well PW1) (i.e., in the cavity CAVa), the silicon nitride film 10a is formed. Note that FIG. 29 is a partially enlarged cross-sectional view of FIG. 28, and shows a part of the memory cell region 1A in FIG. 28 in enlarged relation but, in FIG. 29, the n⁻-type semiconductor regions EXa and EXb are included in the p-type well PW1, and the depiction thereof is omitted.

When the silicon nitride film 10 is formed in Step S18, it is important that a part (i.e., the silicon nitride film 10a) of the silicon nitride film 10 is formed between the silicon oxide films 9a and 9b in the region between the memory gate electrode MG and the semiconductor substrate 1 (p-type well PW1). Therefore, to form the silicon nitride film 10 in Step S18, it is preferable to use a film deposition method featuring high step coverage (capability of covering a step), and it is preferable to form the silicon nitride film 10 using any of a low-pressure CVD method, a plasma CVD method, an ALD (Atomic Layer Deposition) method, and the like alone or in combination with each other.

In Step S18, over the main surface of the semiconductor substrate 1, the silicon nitride film 10 is formed so as to cover the control gate electrode CG, the memory gate electrode MG, and the gate electrode GE. As described above, when the silicon oxide film 9 is formed in Step S16, in the region between the memory gate electrode MG and the semiconductor substrate 1 (p-type well PW1), the cavity CAVa (shown in FIG. 25 mentioned above) is consequently present between the silicon oxide film 9a (the upper surface thereof) and the silicon oxide film 9b (the lower surface thereof). As can be seen from a comparison between FIGS. 25 and 29, in Step S18, the silicon nitride film 10a is formed in the cavity CAVa. More preferably, the cavity CAVa is filled with the silicon nitride film 10a. Of the silicon nitride film 10, the portion formed in the cavity CAVa corresponds to the silicon nitride film 10a so that the silicon nitride film 10a is formed in the same step as the silicon nitride film 10 integrally therewith to form a part of the silicon nitride film 10.

Over the cavity CAVa, the silicon oxide film 9b is present while, under the cavity CAVa, the silicon oxide film 9a is present. Therefore, when the silicon nitride film 10a is formed in the cavity CAVa in Step S18, the silicon nitride film 10a is vertically interposed between the silicon oxide film 9b and the silicon oxide film 9a. As a result, between the memory gate electrode MG and the semiconductor substrate 1 (p-type well PW1), the silicon oxide film 9a, the silicon oxide film 9b, and the silicon nitride film 10a interposed between the silicon oxide films 9a and 9b are present.

That is, in Step S18, over the semiconductor substrate 1, the silicon nitride film 10 is formed so as to cover the control gate electrode CG, the memory gate electrode MG, and the gate electrode GE such that a part (i.e., the silicon nitride film 10a) of the silicon nitride film 10 is formed between the silicon oxide film 9b under the lower surface of the memory gate electrode MG and the silicon oxide film 9a over the surface of the semiconductor substrate 1 (p-type well PW1) (i.e., in the cavity CAVa).

The silicon nitride film 10a is interposed between the silicon oxide films 9a and 9b, and the silicon oxide film 9b formed under the lower surface of the memory gate electrode MG is in contact with the upper surface of the silicon nitride film 10a, while the silicon oxide film 9a formed over the surface of the semiconductor substrate 1 (p-type well PW2) is in contact with the lower surface of the silicon nitride film 10a. The thickness of the silicon nitride film 10a is substantially the same as the thickness of the foregoing cavity CAVa, and can be set to, e.g., about 5 to 15 nm.

Figure 30:
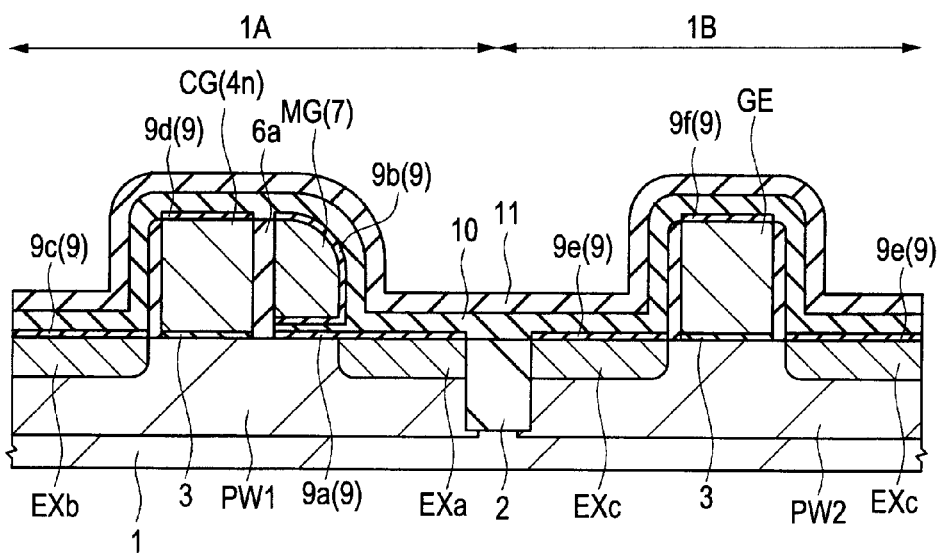
FIG. 30 is a main-portion cross-sectional view of the semiconductor device during the manufacturing process thereof, which is subsequent to FIG. 28.
Figure 31:
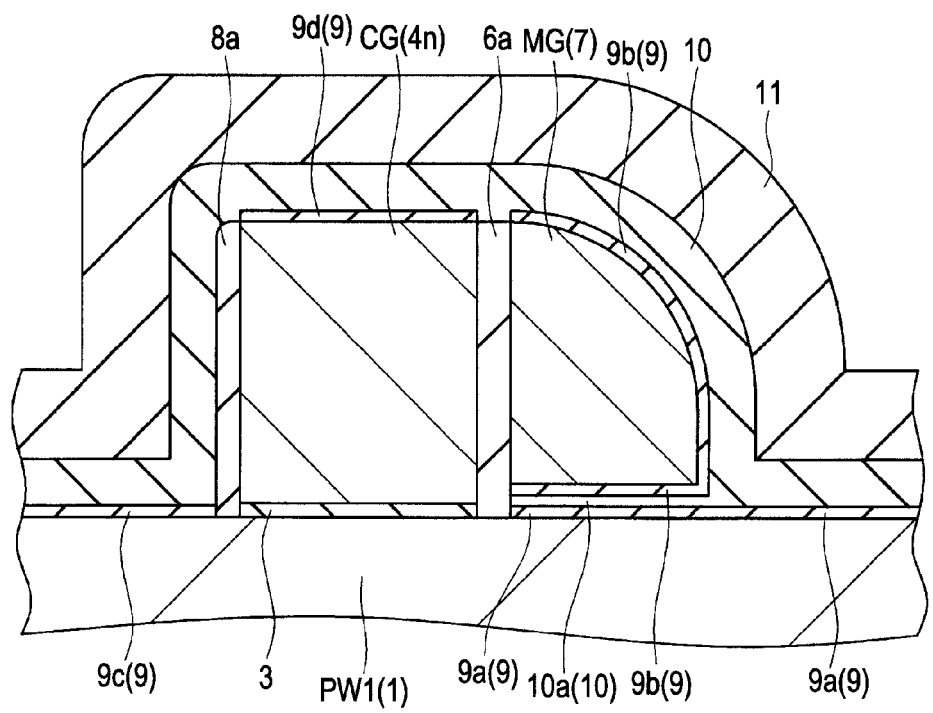
FIG. 31 is a partially enlarged cross-sectional view of FIG. 30.

Next, as shown in FIG. 30, over the silicon nitride film 10, the silicon oxide film 11 is formed as an insulating film (Step S19 of FIG. 6). Note that FIG. 31 is a partially enlarged cross-sectional view of FIG. 30, and shows a part of the memory cell region 1A in FIG. 30 in enlarged relation but, in FIG. 31, the n⁻-type semiconductor regions EXa and EXb are included in the p-type well PW1, and the depiction thereof is omitted.

When the silicon oxide film 11 is formed in Step S19, over the main surface of the semiconductor substrate 1, the laminate film of the silicon nitride film 10 and the silicon oxide film 11 is formed so as to cover the control gate electrode CG, the memory gate electrode MG, and the gate electrode GE. In the foregoing cavity CAVa, the silicon nitride film 10a is formed so that the silicon oxide film 11 is not formed in the region between the memory gate electrode MG and the semiconductor substrate 1 (p-type well PW1).

Note that, in the present embodiment, the silicon oxide film 11 is formed over the silicon nitride film 10 but, in another embodiment, the step of forming the silicon oxide film 11 of Step S19 can also be omitted. In the case where the step of forming the silicon oxide film 11 of Step S19 is omitted, it may be appropriate to accordingly increase the thickness of the silicon nitride film 10. In still another embodiment, instead of the silicon oxide film 11, a film of another insulating material can also be formed in Step S19 or, alternatively, a plurality of insulating films can be formed instead of the silicon oxide film 11.

Figure 32:
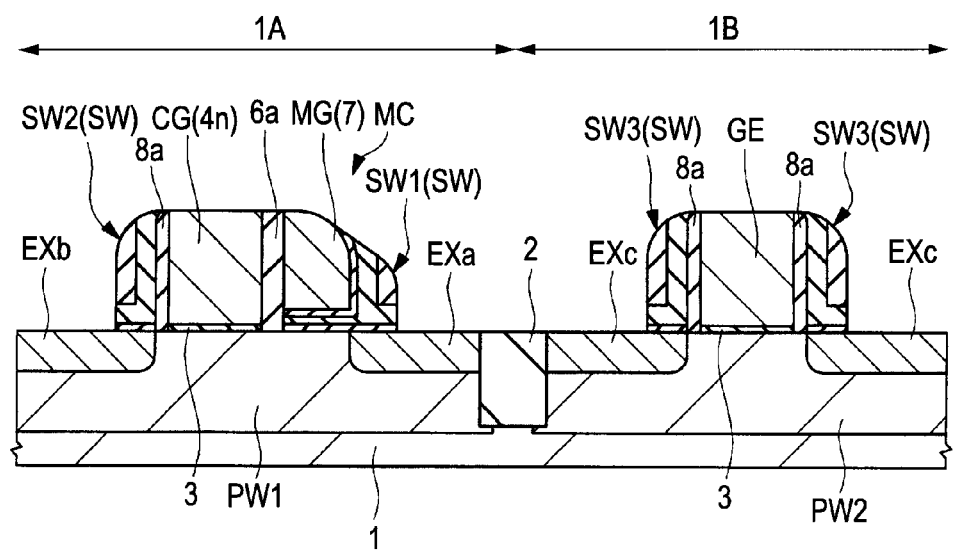
FIG. 32 is a main-portion cross-sectional view of the semiconductor device during the manufacturing process thereof, which is subsequent to FIG. 30.
Figure 33:
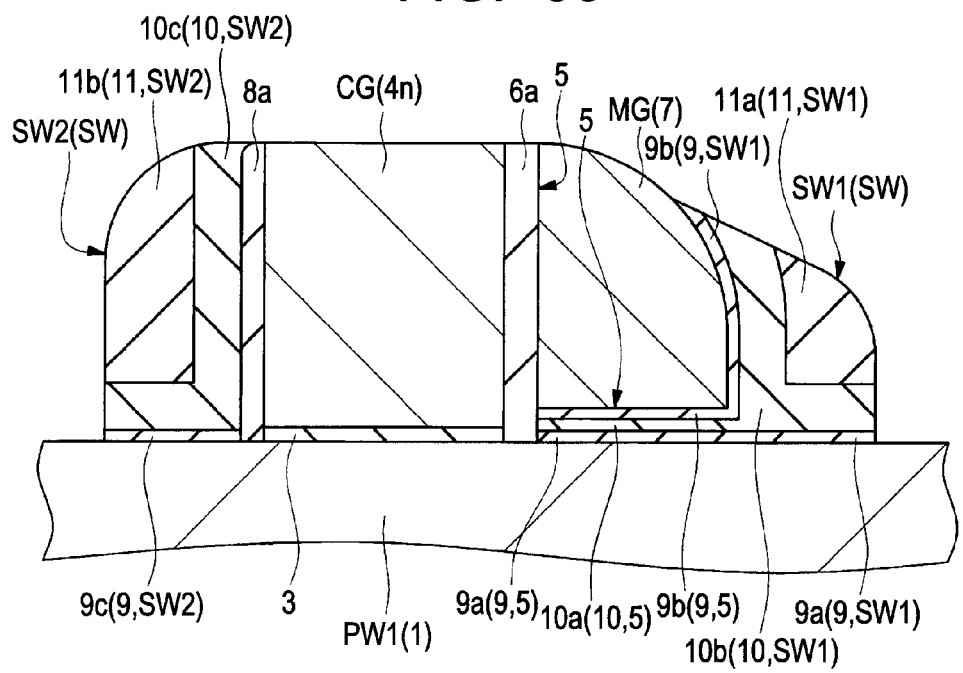
FIG. 33 is a partially enlarged cross-sectional view of FIG. 32.

Next, as shown in FIG. 32, by an anisotropic etching technique, the silicon oxide film 11 and the silicon nitride film 10 are etched back (by etching, dry etching, or anisotropic etching) (Step S20 of FIG. 6). Note that FIG. 33 is a partially enlarged cross-sectional view of FIG. 32, and shows a part of the memory cell region 1A in FIG. 32 in enlarged relation but, in FIG. 33, the n⁻-type semiconductor regions EXa and EXb are included in the p-type well PW1, and the depiction thereof is omitted.

In the etch-back step of Step S20, by anisotropically etching (etching back) the laminate film of the silicon oxide film 11 and the silicon nitride film 10 by the deposited film thicknesses of the silicon oxide film 11 and the silicon nitride film 10, the laminate film is left in the form of the sidewall spacers over the side walls of the control gate electrode CG, the memory gate electrode MG, and the gate electrode GE, while the laminate film in the other region is removed. At the same time, the silicon oxide film 9 formed over the surface of the semiconductor substrate 1 is also etched (anisotropically etched or etched back) together with the silicon oxide film 11 and the silicon nitride film 10. In this manner, as shown in FIGS. 32 and 33, the sidewall spacers (sidewalls or sidewall insulating films) SW are formed over the respective side walls of the control gate electrode CG, the memory gate electrode MG, and the gate electrode GE. Of the sidewall spacers SW, the sidewall spacer SW1 is formed over the side wall (side wall opposite to the side wall adjoining the control gate electrode CG via the silicon oxide film 6a) of the memory gate electrode MG, and the sidewall spacer SW2 is formed over the side wall (side wall opposite to the side wall adjoining the memory gate electrode MG via the silicon oxide film 6a) of the control gate electrode CG via the sidewall insulating film 8a. That is, the sidewall spacers SW (SW1 and SW2) are formed over the respective side walls of the control gate electrode CG and the memory gate electrode MG opposite to the side walls thereof adjoining each other. Of the sidewall spacers SW, the side wall spacers SW3 are formed over the both side walls of the gate electrode GE via the sidewall insulating films 8a.

The sidewall spacers SW are each formed of the silicon oxide film 9, the silicon nitride film 10, and the silicon oxide film 11. Specifically, the sidewall spacer SW1 formed over the side wall of the memory gate electrode MG is formed of the silicon oxide films 9a and 9b, the silicon nitride film 10b, and the silicon oxide film 11a. The silicon nitride film 10b is formed of the silicon nitride film 10 remaining as a part of the sidewall spacer SW1. The silicon oxide film 11a is formed of the silicon oxide film 11 remaining as a part of the sidewall spacer SW1. The silicon oxide film 9b forming the sidewall spacer SW1 is the silicon oxide film 9b formed over the side surface (side surface in contact with the sidewall spacer SW1) of the memory gate electrode MG. The silicon oxide film 9a forming the sidewall spacer SW1 is the silicon oxide film 9a formed outside the region under the memory gate electrode MG (closer to the sidewall spacer SW1).

The silicon oxide film 9b formed under the lower surface of the memory gate electrode MG and the silicon oxide film 9a formed below the memory gate electrode MG (on the surface of the semiconductor substrate 1) do not form the sidewall spacer SW1, but function as the gate insulating film (gate insulating film having a charge storing function) in conjunction with the silicon nitride film 10a therebetween.

Between the memory gate electrode MG and the semiconductor substrate 1 (p-type well PW1) and between the memory gate electrode MG and the control gate electrode CG, the insulating film 5 is consequently formed. The insulating film 5 is formed of the laminate film in which the silicon nitride film 10a is interposed between the silicon oxide films 9a and 9b, and the silicon oxide film 6a adjacent thereto. The silicon nitride film 10a (i.e., the silicon nitride film 10b formed integrally with the silicon nitride film 10a) and the silicon oxide films 9a and 9b extend to the outside of the region immediately below the memory gate electrode MG, and form a part of the sidewall spacer SW1.

The sidewall spacer SW2 formed over the side wall of the control gate electrode CG is formed of the silicon oxide film 9c, the silicon nitride film 10c, and the silicon oxide film 11b. The silicon nitride film 10c is formed of the silicon nitride film 10 remaining as a part of the sidewall spacer SW2. The silicon oxide film 1ib is formed of the silicon oxide film 11 remaining as a part of the sidewall spacer SW2. The structure of each of the sidewall spacers SW3 is substantially the same as that of the sidewall spacer SW2.

Figure 34:
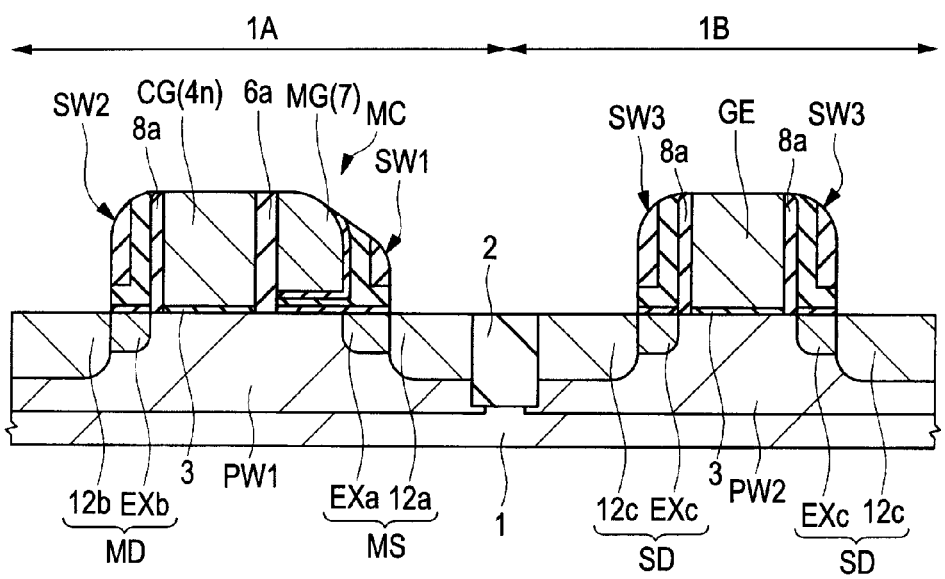
FIG. 34 is a main-portion cross-sectional view of the semiconductor device during the manufacturing process thereof, which is subsequent to FIG. 32.

Next, as shown in FIG. 34, the $n^+$-type semiconductor regions (impurity diffusion regions) 12a, 12b, and 12c are formed using an ion implantation method or the like (Step S21 of FIG. 6).

In Step S21, by introducing an n-type impurity such as, e.g., arsenic (As) or phosphorus (P) into the semiconductor substrate 1 (p-type wells PW1 and PW2) using the control gate electrode CG, the memory gate electrode MG, the gate electrode GE, and the sidewall insulating films 8a and the sidewall spacers SW1, SW2, and SW3 over the side walls of the gate electrodes as a mask (ion implantation stopper mask), the $n^+$-type semiconductor regions 12a, 12b, and 12c can be formed. At this time, in the memory cell region 1A, the $n^+$-type semiconductor region 12a is formed by self alignment with respect to the sidewall spacer SW1 over the side wall of the memory gate electrode MG, and the $n^+$-type semiconductor region 12b is formed by self alignment with respect to the sidewall spacer SW2 over the side wall of the control gate electrode CG. In the peripheral region 1B, the $n^+$-type semiconductor region 12c is formed by self alignment with respect to the sidewall spacers SW3 over the both side walls of the gate electrode GE. In this manner, the LDD (lightly doped drain) structure is formed.

Thus, the $n^-$-type semiconductor region EXa and the $n^+$-type semiconductor region 12a at an impurity concentration higher than that of the $n^-$-type semiconductor region EXa form the n-type semiconductor region MS functioning as the source region of the memory transistor, while the $n^-$-type semiconductor region EXb and the $n^+$-type semiconductor region 12b at an impurity concentration higher than that of the $n^-$-type semiconductor region EXb form the n-type semiconductor region MD functioning as the drain region of the control transistor. On the other hand, the $n^-$-type semiconductor regions EXc and the $n^+$-type semiconductor regions 12c at impurity concentrations higher than those of the $n^-$-type semiconductor regions EXc form n-type semiconductor regions SD functioning as the source/drain regions of the MISFET in the peripheral circuit region 1B.

Next, activation annealing is performed, which is a heat treatment for activating the impurities introduced into the n-type semiconductor regions MS, MD, and SD ($n^-$-type semiconductor regions EXa, EXb, and EXc and $n^+$-type semiconductor regions 12a, 12b, and 12c) for the source/drain regions.

In this manner, in the memory cell region 1A, the memory cell MC of the nonvolatile memory is formed and, in the peripheral circuit region 1B, the MISFET is formed.

Figure 35:
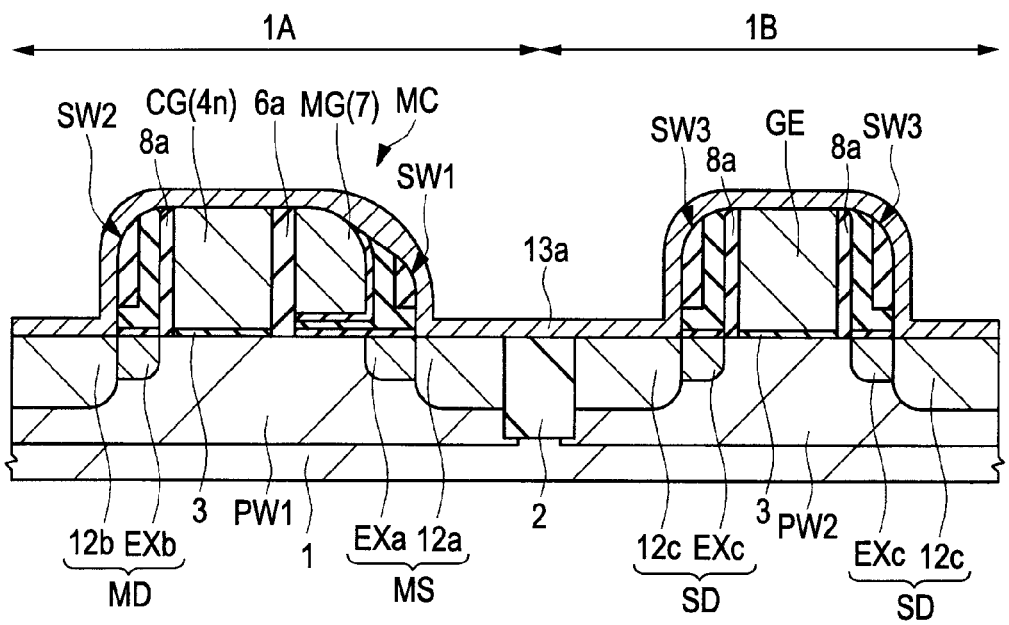
FIG. 35 is a main-portion cross-sectional view of the semiconductor device during the manufacturing process thereof, which is subsequent to FIG. 34.

Next, over the entire main surface of the semiconductor substrate 1, a silicon oxide film is formed by a CVD method or the like. Then, using a photolithographic method and an etching method, the upper surfaces (surfaces) of the $n^+$-type semiconductor regions 12a, 12b, and 12c, the upper surface of the control gate electrode CG, the upper surface of the memory gate electrode MG, and the upper surface of the gate electrode GE are exposed. Then, as shown in FIG. 35, over the entire main surface of the semiconductor substrate 1 including the upper surfaces of the $n^+$-type semiconductor regions 12a, 12b, and 12c, the upper surface (portion uncovered with the sidewall spacer SW1) of the memory gate electrode MG, the upper surface of the control gate electrode CG, and the upper surface of the gate electrode GE, a metal film 13a is formed (deposited) so as to cover the control gate electrode CG, the memory gate electrode MG, the gate electrode GE, and the sidewall spacers SW1, SW2, and SW3. The metal film 13a is formed of, e.g., a cobalt (Co) film, a nickel (Ni) film, or the like, and can be formed using a sputtering method or the like.

Figure 36:
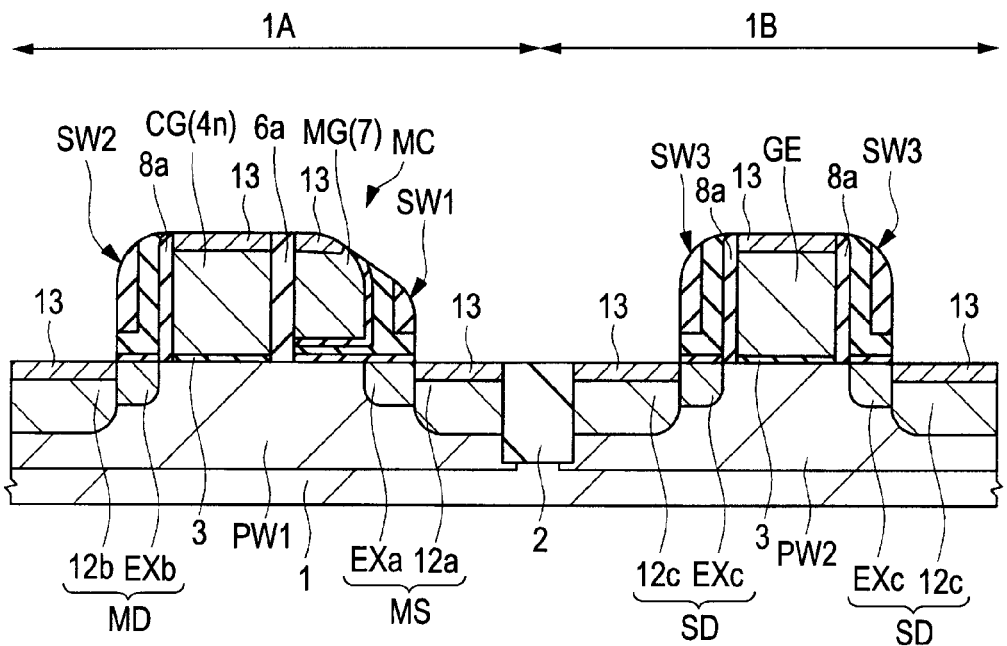
FIG. 36 is a main-portion cross-sectional view of the semiconductor device during the manufacturing process thereof, which is subsequent to FIG. 35.

Next, a heat treatment is performed to the semiconductor substrate 1 to cause the upper layer portions (surface layer portions) of the $n^+$-type semiconductor regions 12a, 12b, and 12c, the control gate electrode CG, the memory gate electrode MG, and the gate electrode GE to react with the metal film 13a. As a result, as shown in FIG. 36, in each of the upper portions (upper surfaces, surfaces, or upper layer portions) of the n$^+$-type semiconductor regions 12a, 12b, and 12c, the control gate electrode CG, the memory gate electrode MG, and the gate electrode GE, the metal silicide layer 13 is formed. The metal silicide layer 13 can be formed of, e.g., a cobalt silicide layer (when the metal film 13a is a cobalt film) or a nickel silicide layer (when the metal film 13a is a nickel film). Thereafter, the unreacted metal film 13a is removed. In FIG. 36, a cross-sectional view at this stage is shown. By thus performing a so-called salicide process, it is possible to form the metal silicide layers 13 in the respective upper portions of the n$^+$-type semiconductor regions 12a, 12b, and 12c, the control gate electrode CG, the memory gate electrode MG, and the gate electrode GE, and thereby reduce the resistances of the source/drain regions and the individual gate electrodes (CG, MG, and GE).

Figure 37:
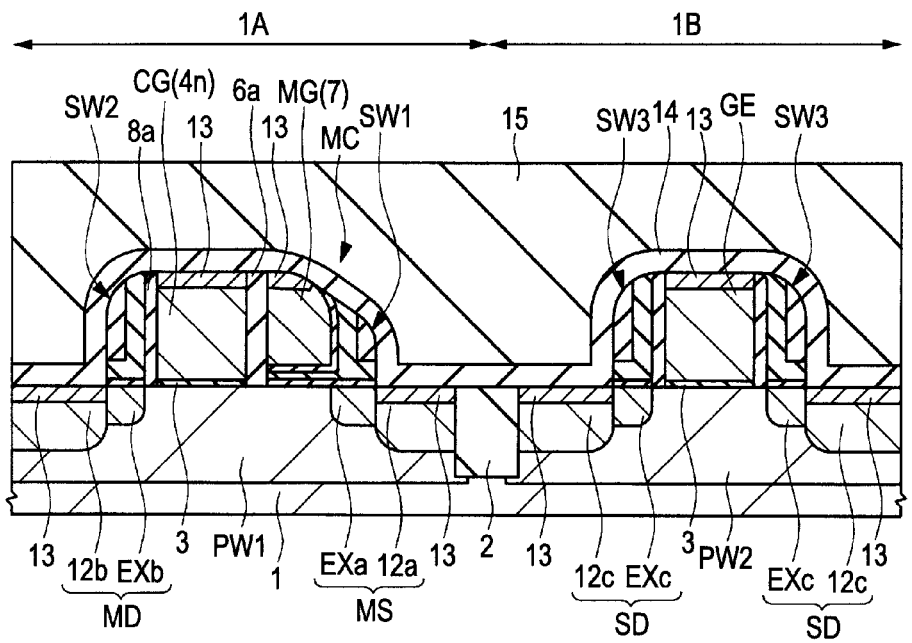
FIG. 37 is a main-portion cross-sectional view of the semiconductor device during the manufacturing process thereof, which is subsequent to FIG. 36.

Next, as shown in FIG. 37, over the entire main surface of the semiconductor substrate 1, the insulating film 14 is formed (deposited) so as to cover the control gate electrode CG, the memory gate electrode MG, the gate electrode GE, and the sidewall spacers SW1, SW2, and SW3, and form (deposit) the insulating film 15 over the insulating film 14. Then, as necessary, the upper surface of the insulating film 15 is planarized using a CMP (Chemical Mechanical Polishing) method or the like.

The insulating film 14 is preferably formed of a silicon nitride film, and the insulating film 15 over the insulating film 14 is preferably formed of a silicon oxide film or the like. Each of the insulating films 14 and 15 can be formed using a CVD method or the like. The thickness of the insulating film 14 is smaller than the thickness of the insulating film 15. The thicker insulating film 15 functions as an interlayer insulating film, while the thinner insulating film 14 functions as an etching stopper film when contact holes are formed in the insulating film 15.

Figure 38:
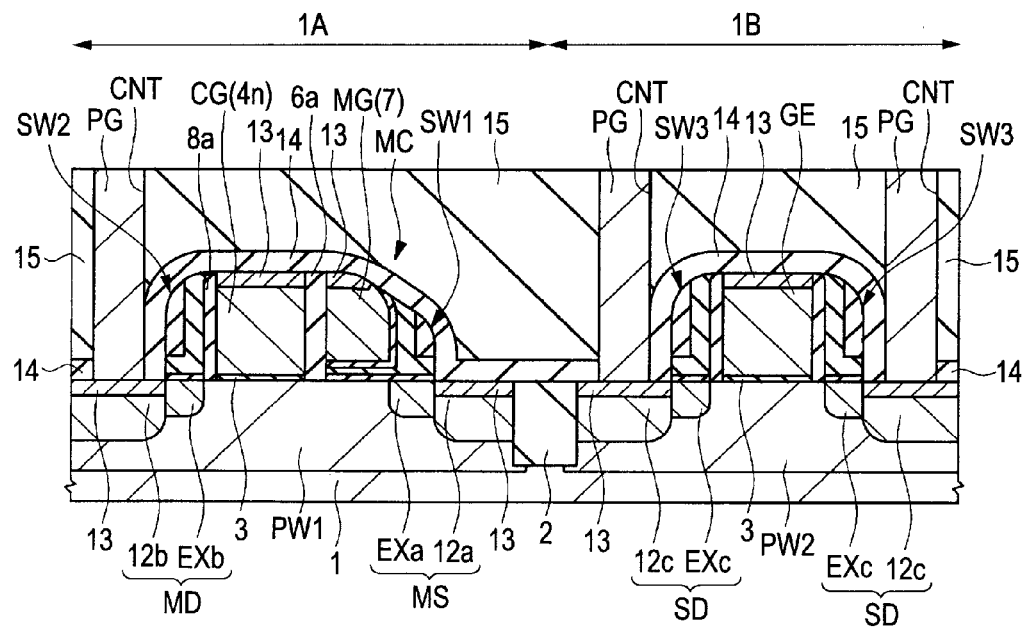
FIG. 38 is a main-portion cross-sectional view of the semiconductor device during the manufacturing process thereof, which is subsequent to FIG. 37.

Next, as shown in FIG. 38, using a photolithographic method using a photoresist pattern (not shown) formed over the insulating film 15 as an etching mask, the insulating films 14 and 15 are dry-etched to form contact holes (openings or through holes) CNT in the insulating films 14 and 15. When the contact holes CNT are formed, the insulating film 15 is dry-etched first to cause the insulating film 14 to function as an etching stopper film. Thereafter, the insulating film 14 at the bottom portions of the contact holes CNT is removed by dry etching to form the contact holes CNT extending through the insulating films 14 and 15. By thus causing the insulating film 14 to function as an etching stopper when the insulating film (interlayer insulating film) 15 is etched, it is possible to prevent, when the contact holes CNT are formed by etching, damage to a lower layer due to excessive digging thereof or the degradation of processing dimensional accuracy.

The contact holes CNT are formed over the n$^+$-type semiconductor regions 12a, 12b, and 12c, the control gate electrode CG, the memory gate electrode MG, the gate electrode GE, and the like. At the bottom portion of each of the contact holes CNT, a part of the main portion of the semiconductor substrate 1 such as, e.g., a part of the n$^+$-type semiconductor region 12a, 12b, or 12c (the metal silicide layer 13 over the surface thereof), a part of the control gate electrode CG (the metal silicide layer 13 over the surface thereof), a part of the memory gate electrode MG (the metal silicide layer 13 over the surface thereof), a part of the gate electrode GE (the metal silicide layer 13 over the surface thereof), or the like is exposed. Note that, in the cross-sectional view of FIG. 38, a cross section is shown in which a part of the n$^+$-type semiconductor region 12b or 12c (the metal silicide layer 13 over the surface thereof) is exposed at the bottom portion of each of the contact holes CNT.

Next, in the contact holes CNT, the conductive plugs (conductor portions for coupling) PG made of tungsten (W) or the like are formed. To form the plugs PG, e.g., over the insulating film 15 including the insides (bottom portions and side walls) of the contact holes CNT, a barrier conductor film (e.g., a titanium film, a titanium nitride film, or a laminate film thereof) is formed. Then, over the barrier conductor film, a main conductor film formed of a tungsten film or the like is formed so as to fill the contact holes CNT, and the unneeded main conductor film and the unneeded barrier conductor film over the insulating film 15 are removed by a CMP method, an etch-back method, or the like to allow the plugs PG to be formed. Note that, for simpler illustration of the drawings, in FIG. 38, the barrier conductor film and the main conductor film (tungsten film) that form the plugs PG are integrally shown.

Figure 39:
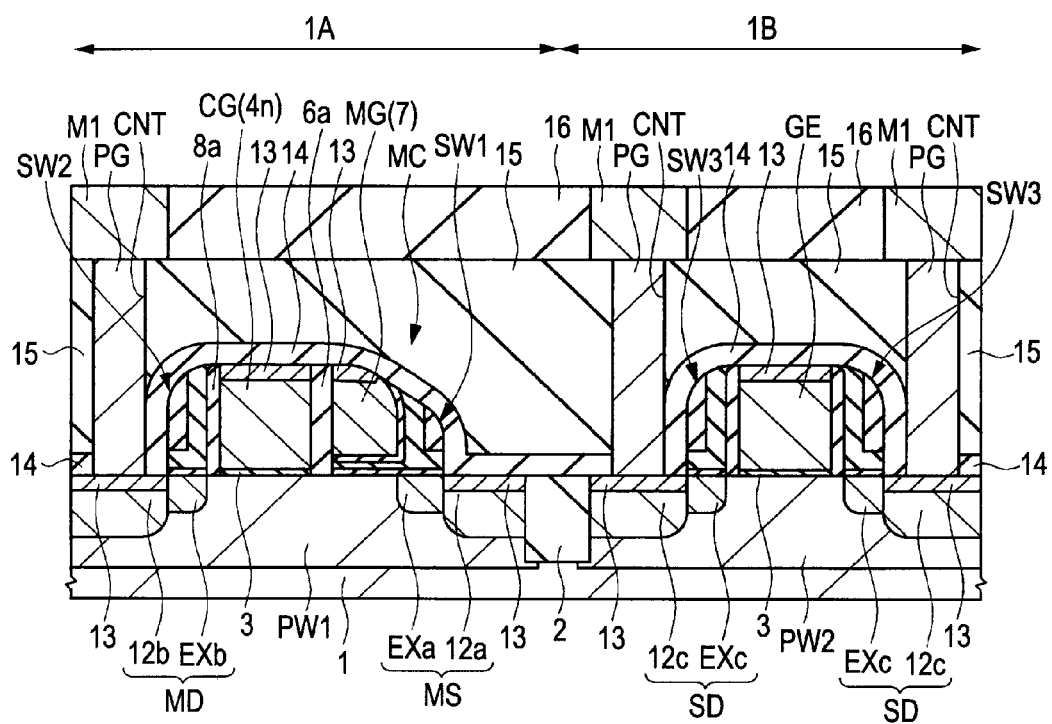
FIG. 39 is a main-portion cross-sectional view of the semiconductor device during the manufacturing process thereof, which is subsequent to FIG. 38.

Next, as shown in FIG. 39, over the insulating film 15 in which the plugs PG are buried, an insulating film 16 is formed. The insulating film 16 may also be able to be formed of a laminate film of a plurality of insulating films.

Next, by a single damascene method, the wiring lines M1 as first-layer wiring lines are formed. Specifically, the wiring lines M1 can be formed as follows. First, by dry etching using a photoresist pattern (not shown) as a mask, wiring trenches are formed in the predetermined regions of the insulating film 16, and then a barrier conductor film (such as a titanium nitride film, a tantalum film, or a tantalum nitride film) is formed over the insulating film 16 including the bottom portions and side walls of the wiring trenches. Subsequently, by a CVD method, a sputtering method, or the like, a seed layer of copper is formed over the barrier conductor film. By further using an electrolytic plating method or the like, a copper plating film is formed over the seed layer to fill the wiring trenches with the copper plating film. Then, by removing main conductor films (copper plating film and seed film) and the barrier conductor film in the region other than the wiring trenches by a CMP method, the first-layer wiring lines M1 containing copper buried in the wiring trenches as a main conductive material are formed. In FIG. 39, for the simplification of the drawings, the wiring lines M1 are shown in each of which the barrier conductive film, the seed layer, and the copper plating film are integrated.

The wiring lines M1 are electrically coupled to the source region (semiconductor region MS) of the memory transistor, the drain region (semiconductor region MD) of the control transistor, the source/drain regions (semiconductor regions SD) of the MISFET in the peripheral circuit region 1B, the control gate electrode CG, the memory gate electrode MG, the gate electrode GE, and the like via the plugs PG. Thereafter, by a dual damascene method or the like, wiring lines in the second and subsequent layers are formed, but the depiction and description thereof is omitted here. The wiring lines M1 and the wiring lines in the layers over the wiring lines M1 are not limited to damascene wiring lines, and can also be formed by patterning conductor films for wiring lines, and can also be formed as, e.g., tungsten wiring lines or aluminum wiring lines.

In this manner, the semiconductor device of the present embodiment is manufactured.

Next, referring to a comparative example, the structure and effects of the present embodiment will be described in greater detail.

Figure 40:
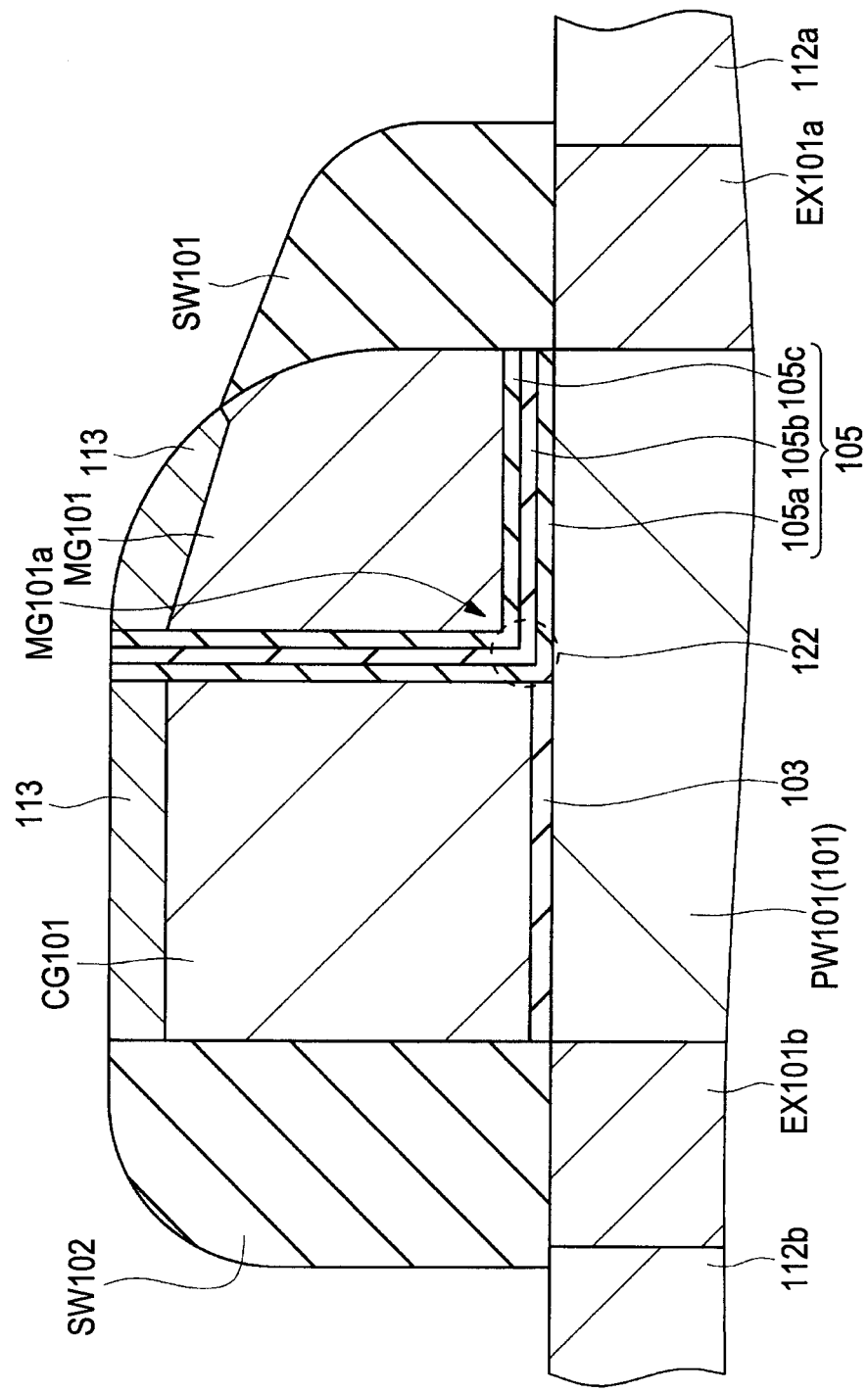
FIG. 40 is a main-portion cross-sectional view of semiconductor device of a comparative example.

First, a description will be given to a semiconductor device of the comparative example. FIG. 40 is a main-portion cross-sectional view of the semiconductor device of the comparative example, which corresponds to FIG. 2 of the present embodiment mentioned above.

The semiconductor device shown in FIG. 40 is a semiconductor device having a memory cell of a nonvolatile memory. Over a p-type well PW101 of a semiconductor substrate 101, a control gate electrode CG101 and a memory gate electrode MG101, which form the nonvolatile memory cell, are formed to adjoin each other. Between the control gate electrode CG101 and the p-type well PW101, an insulating film 103 as a gate insulating film is formed. Between the memory gate electrode MG101 and the p-type well PW101 and between the control gate electrode CG101 and the memory gate electrode MG101, an insulating film 105 formed of a laminate film of a silicon oxide film 105a, a silicon nitride film 105b, and a silicon oxide film 105c is formed. The control gate electrode CG101 and the memory gate electrode MG101 are each formed of an n-type polysilicon film. In the p-type well PW101, a semiconductor region functioning as a source region is formed of an n$^-$-type semiconductor region EX101a and an n$^+$-type semiconductor region 112a having an impurity concentration higher than that of the n$^-$-type semiconductor region EX101a, and a semiconductor region functioning as a drain region is formed of an n$^-$-type semiconductor region EX101b and an n$^+$-type semiconductor region 112b having an impurity concentration higher than that of the n$^-$-type semiconductor region EX101b. Over the respective side walls of the control gate electrode CG101 and the memory gate electrode MG101 opposite to the side walls thereof adjoining each other, sidewall spacers SW101 and SW102 are formed. Over the n$^+$-type semiconductor regions 112a and 112b, the control gate electrode CG101, and the memory gate electrode MG101, metal silicide layers 113 are formed (the depiction of the metal silicide layers 113 over the n$^+$-type semiconductor regions 112a and 112b is omitted in FIG. 40). Over the semiconductor substrate 101, an interlayer insulating film (not shown) is formed so as to cover the control gate electrode CG101, the memory gate electrode MG101, and the sidewall spacers SW101 and SW102.

In the semiconductor device of the comparative example shown in FIG. 40, the insulating film 105 extends continuously over two regions, which are the region between the memory gate electrode MG101 and the semiconductor substrate 101 (p-type well PW101) and the region between the memory gate electrode MG101 and the control gate electrode CG101, and the entire insulating film 105 is formed of the laminate film of the silicon oxide film 105a, the silicon nitride film 105b, and the silicon oxide film 105c. Therefore, the silicon nitride film 105b is present not only in the insulating film 105 between the memory gate electrode MG101 and the semiconductor substrate 101 (p-type well PW101), but also in the insulating film 105 between the memory gate electrode MG101 and the control gate electrode CG101.

The semiconductor device of the comparative example having such a structure has the following problem to be solved.

As described above, methods of writing to a nonvolatile memory include the SSI method and the FN method, and methods of erasing thereto include the BTBT method and the FN method. During writing to the nonvolatile memory, in either of the cases where the SSI method is implemented and where the FN method is implemented, electrons are injected into the silicon nitride film 105b in the insulating film between the memory gate electrode MG101 and the semiconductor substrate 101 (p-type well PW101). During erasing to the nonvolatile memory, in either of the cases where the BTBT method is implemented and where the FN method is implemented, holes are injected into the silicon nitride film 105b in the insulating film 105 between the memory gate electrode MG101 and the semiconductor substrate 101 (p-type well PW101).

When writing is performed by the SSI method, in the silicon nitride film 105b in the insulating film 105 between the memory gate electrode MG101 and the semiconductor substrate 101 (p-type well PW101), electrons are not uniformly injected. Instead, due to a place where hot electrons are generated, electrons tend to be injected into an area closer to the control gate electrode CG101 (i.e., closer to the drain region) at a density higher than in an area closer to the source, region In writing by the FN method, electrons are more likely to be injected relatively uniformly into the silicon nitride film 105b than in the writing by the SSI method. However, in the writing by the FN method also, in the silicon nitride film 105b in the insulating film 105 between the memory gate electrode MG101 and the semiconductor substrate 101 (p-type well PW101), electrons tend to be injected into the area closer to the control gate electrode CG101 (i.e., closer to the drain region) at a density higher than in the area closer to the source region due to electric field concentration in a corner portion MG101a of the memory gate electrode MG101.

Thus, in either of the cases where writing is performed by the SSI method and where writing is performed by the FN method, in the silicon nitride film 105b in the insulating film 105 between the memory gate electrode MG101 and the semiconductor substrate 101 (p-type well PW101), electrons tend to be injected into the area closer to the control gate electrode CG101 (i.e., closer to the drain region) at a higher density.

On the other hand, in erasing by the BTBT method, holes are not uniformly injected in the silicon nitride film 105b in the insulating film 105 between the memory gate electrode MG101 and the semiconductor substrate 101 (p-type well PW101). Instead, due to a place where hot holes are generated, holes tend to be injected into the area closer to the source region t a density higher than in the area closer to the control gate electrode CG101 (i.e., closer to the drain region).

In erasing by the FN method, in the silicon nitride film 105b in the insulating film 105 between the memory gate electrode MG101 and the semiconductor substrate 101 (p-type well PW101), holes tend to be injected into the area closer to the control gate electrode CG (i.e., closer to the drain region) than in the area closer to the source region due to electric field concentration in the corner portion MG101a of the memory gate electrode MG101.

Accordingly, in the cases where writing is performed by the SSI method and erasing is performed by the BTBT method (Operation Method A) and where writing is performed by the FN method and erasing is performed by the BTBT method (Operation Method C), in the silicon nitride film 105b in the insulating film 105, a position at which electrons are likely to be injected during writing and a position at which holes are likely to be injected during erasing are different. As a result, after an erase operation, charges to be eliminated undesirably remain. That is, in the silicon nitride film 105b in an area 122 encircled by the dotted line in FIG. 40, electrons are injected at a density higher than in the other area during writing by the SSI method or the FN method. However, during erasing by the BTBT method, holes are unlikely to be injected into the silicon nitride film 105b in the area 122 so that, after erasing, electrons to be eliminated are undesirably likely to remain in the silicon nitride film 105b in the area 122. If there are remaining electrons in the silicon nitride film 105, the threshold voltage of the memory transistor may fluctuate due to the remaining electrons to possibly degrade the performance of the semiconductor device including the nonvolatile memory.

On the other hand, in the cases where writing is performed by the SSI method and erasing is performed by the FN method (Operation. Method B) and where writing is performed by the FN method and erasing is performed by the FN method (Operation Method D), in the silicon nitride film 105b in the insulating film 105, a position at which electrons are likely to be injected during writing and a position at which holes are likely to be injected during erasing are substantially the same so that, after an erase operation, charges to be eliminated are unlikely to remain. That is, into the silicon nitride film 105b in the area 122 encircled by the dotted line in FIG. 40, electrons are injected at a density higher than in the other area during writing by the SSI method or the FN method but, during erasing by the FN method, holes are likely to be injected into the silicon nitride film 105b in the area 122 so that, after erasing, electrons to be eliminated are unlikely to remain in the silicon nitride film 105b in the area 122. Therefore, fluctuations in the threshold voltage of the memory transistor due to the remaining charges in the silicon nitride film 105b are unlikely to occur. However, in the cases where the operation method B is implemented and where the operation method D is implemented, due to electric field concentration in the corner portion MG101a of the memory gate electrode MG101, a large amount of charges are injected into the silicon nitride film 105b (substantially corresponding to the silicon nitride film 105b in the area 122) in the insulating film 105 between the corner portion MG101a of the memory gate electrode MG101 and the semiconductor substrate 101 (p-type well PW101). As a result, the insulating film 105 (substantially corresponding to the insulating film 105 in the area 122) between the corner portion MG101a of the memory gate electrode MG101 and the semiconductor substrate 101 (p-type well PW101) may deteriorate to possibly degrade the reliability of the insulating film 105, and degrade the performance of the semiconductor device including the nonvolatile memory.

The semiconductor device of the comparative example described above has such a problem to be solved.

By contrast, in the present embodiment, in the region between the memory gate electrode MG and the semiconductor substrate 1 (p-type well PW1) and in the region between the memory gate electrode MG1 and the control gate electrode CG1, the insulating film (5) interposed therebetween has different structures (configurations).

That is, in the present embodiment, of the insulating film 5 formed between the memory gate electrode MG and the semiconductor substrate 1 (p-type well PW1) and between the control gate electrode CG and the memory gate electrode MG, the portion (first portion or gate insulating film portion) 5a between the lower surface 24 of the memory gate electrode MG and the upper surface of the semiconductor substrate 1 (p-type well PW1) has the silicon oxide film 9a, the silicon oxide film 9b, and the silicon nitride film 10a interposed between the silicon oxide films 9a and 9b. On the other hand, of the insulating film 5 formed between the memory gate electrode MG and the semiconductor substrate 1 (p-type well PW1) and between the control gate electrode CG and the memory gate electrode MG, the portion (second portion or insulating portion) 5b between the side surface 26 of the control gate electrode CG and the side surface 25 of the memory gate electrode MG is formed of silicon oxide, and does not have the silicon nitride film 10a.

Figure 41:
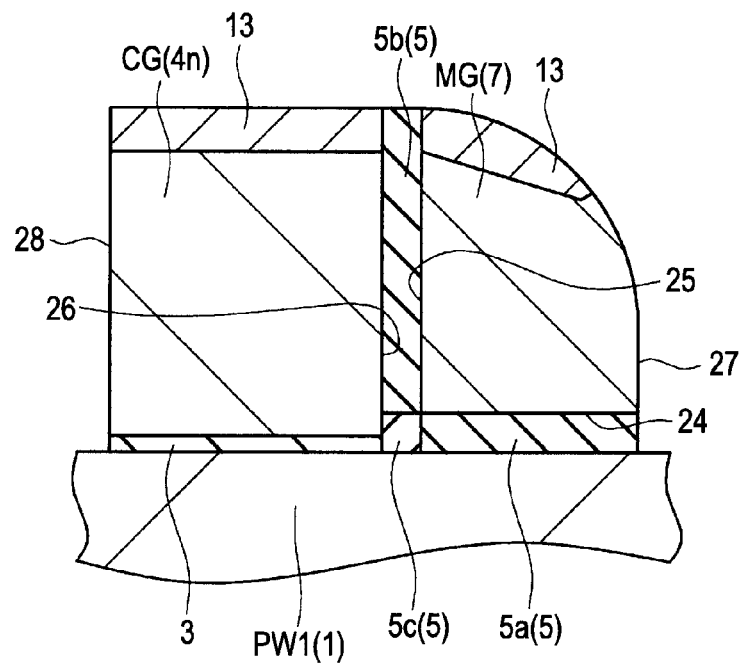
FIG. 41 is an illustrative view of the semiconductor as the embodiment of the present invention.

Here, a consideration will be given to the insulating film 5 formed between the memory gate electrode MG and the semiconductor substrate 1 (p-type well PW1) and between the control gate electrode CG and the memory gate electrode MG on the assumption that the insulating film 5 is virtually divided (partitioned) into the gate insulating film portion 5a and the insulating portion 5b. FIG. 41 is an illustrative view of the semiconductor device of the present embodiment, and schematically shows to which portions of the insulating film 5 the gate insulating film portion 5a, the insulating portion 5b, and a corner portion 5c correspond. FIG. 41 shows a cross section corresponding to FIG. 2 mentioned above. In FIG. 41, the gate insulating film 5 is shown on the assumption that it is virtually divided (partitioned) into the gate insulating film portion 5a, the insulating portion 5b, and the corner portion 5c. However, the insulating film 5 actually has a cross-sectional structure as shown in FIG. 2 mentioned above, and is formed of the silicon oxide films 6a, 9a, and 9b and the silicon nitride film 10a.

Of the insulating film 5 formed between the memory gate electrode MG and the semiconductor substrate 1 (p-type well PW1) and between the control gate electrode CG and the memory gate electrode MG, the portion 5a between the lower surface 24 of the memory gate electrode MG and the upper surface of the semiconductor substrate 1 (p-type well PW1) is referred to as the "gate insulating film portion 5a". Also, of the insulating film 5 formed between the memory gate electrode MG and the semiconductor substrate 1 (p-type well PW1) and between the control gate electrode CG and the memory gate electrode MG, the portion 5b between the side surface 26 of the control gate electrode CG and the side surface 25 of the memory gate electrode MG is referred to as the "insulating portion 5b". Also, of the insulating film 5 formed between the memory gate electrode MG and the semiconductor substrate 1 (p-type well PW1) and between the control gate electrode CG and the memory gate electrode MG, the portion (third portion or corner portion) 5c between the gate insulating film portion 5a and the insulating portion 5b is referred to as the "corner portion 5c". Between the gate insulating film portion 5a and the insulating portion 5b, the corner portion 5c is interposed. Note that the side surface 26 of the control gate electrode CG is the side surface opposing the memory gate electrode MG via the insulating film 5, and the side surface 25 of the memory gate electrode MG is the side surface opposing the control gate electrode CG via the insulating film 5. Also, the lower surface 24 of the memory gate electrode MG is a surface in contact with the gate insulating film portion 5a.

The gate insulating film portion 5a is located between the lower surface 24 of the memory gate electrode MG and the upper surface of the semiconductor substrate 1 (p-type well PW1), and therefore capable of functioning as the gate insulating film of the memory transistor. The silicon nitride film 10a in the gate insulating film portion 5a is capable of functioning as the charge storage portion (charge storage layer) of the memory cell.

The insulating portion 5b is located between the side surface 26 of the control gate electrode CG and the side surface 25 of the memory gate electrode MG, and therefore capable of functioning to dielectrically isolate the control gate electrode CG and the memory gate electrode MG.

The corner portion 5c is located at the corner portion of the insulating film 5 having an L-shaped cross section (corresponding to the cross section of each of FIGS. 1, 2, and 41). Accordingly, the gate insulating film portion 5a and the corner portion 5c extend along the main surface of the semiconductor substrate 1 (i.e., substantially in parallel with the main surface of the semiconductor substrate 1), while the insulating portion 5b and the corner portion 5c extend in the vertical direction (i.e., the direction generally perpendicular to the main surface of the semiconductor substrate 1). Of the insulating film 5, the corner portion bent from the lateral direction (direction parallel with the main surface of the semiconductor substrate 1) to the vertical direction (the direction generally perpendicular to the main surface of the semiconductor substrate 1) corresponds to the corner portion 5c.

In the insulating film 5, the gate insulating film portion 5a is located immediately below the memory gate electrode MG, but the insulating portion 5b and the corner portion 5c are not located immediately below the memory gate electrode MG. As can be seen also from FIG. 41, the boundary between the insulating portion 5b and the corner portion 5c corresponds to the extended surface of the lower surface 24 of the memory gate electrode MG in the vicinity of the corner portion 5c, and the boundary between the gate insulating film portion 5a and the corner portion 5c corresponds to the extended surface of the side surface 25 of the memory gate electrode MG in the vicinity of the corner portion 5c.

In the present embodiment, of the insulating film 5, the gate insulating film portion 5a located between the lower surface 24 of the memory gate electrode MG and the upper surface (surface) of the semiconductor substrate 1 (p-type well PW1) has the silicon nitride film 10a interposed between the silicon oxide films 9a and 9b. This allows charges to be stored in the silicon nitride film 10a, and thereby allows information to be stored in the memory transistor.

Also, in the present embodiment, of the insulating film 5, the insulating portion 5b located between the side surface 26 of the control gate electrode CG and the side surface 25 of the memory gate electrode MG is formed of silicon oxide (more specifically the silicon oxide film 6a), and does not have the silicon nitride film 10a. One of the main characteristic features of the present embodiment is that, of the insulating film 5, the portion 5b (i.e., the insulating portion 5b) between the side surface 26 of the control gate electrode CG and the side surface 25 of the memory gate electrode MG does not have the silicon nitride film 10a.

Additionally, in the present embodiment, as described above, the silicon oxide films 9a and 9b are formed in the cavity CAV formed by removing the silicon oxide film 6, and then the silicon nitride film 10a is formed in the cavity CAVa between the silicon oxide films 9a and 9b, thereby forming the insulating film 5 including the silicon oxide films 6a, 9a, and 9b and the silicon nitride film 10a. Accordingly, the insulating film 5 includes the region formed of the silicon oxide film 6a and the region formed of the laminate film of the silicon oxide film 9a, the silicon nitride film 10a, and the silicon oxide film 9b, and the two regions adjoin each other. That is, the laminate film (the end portion thereof) of the silicon oxide film 9a, the silicon nitride film 10a, and the silicon oxide film 9b adjoins the silicon oxide film 6a (the end portion thereof).

FIGS. 42 to 45 are illustrative views (main-portion cross-sectional view or partially enlarged cross-sectional view) for illustrating the region of the insulating film 5 where the silicon nitride film 10a is formed, and correspond to an enlargement of a part of FIG. 2 mentioned above. Note that, in FIGS. 42 to 45, the n⁻-type semiconductor region EXa is included in the p-type well PW1, and the depiction thereof is omitted.

As shown in FIGS. 42 to 45, an end portion 23 of the silicon nitride film 10a adjoins the silicon oxide film 6a (the end portion thereof). That is, the end portion 23 of the silicon nitride film 10a is the end portion adjoining the silicon oxide film 6a (the end portion thereof). The position of the end portion 23 of the silicon nitride film 10a is different in each of FIGS. 42 to 45.

Figure 42:
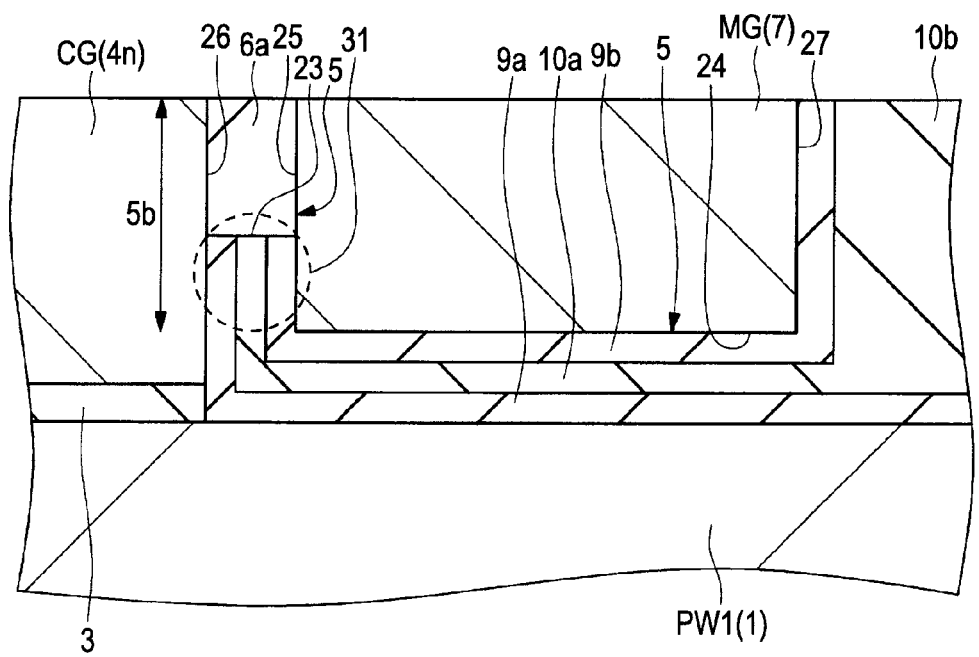
FIG. 42 is an illustrative view for illustrating a region where a silicon nitride film is formed.

In the case of FIG. 42, the end portion 23 of the silicon nitride film 10a is located within the insulating portion 5b. Therefore, in the case of FIG. 42, the insulating portion 5b has the silicon nitride film 10a.

As in the case of FIG. 42, when the silicon nitride film 10a extends also in the insulating portion 5b between the side surface of the control gate electrode CG and the side surface of the memory gate electrode MG, charges are less likely to be injected into the silicon nitride film 10a (corresponding to the silicon nitride film 10a in an area 31 encircled by the dotted line in FIG. 42) in the insulating portion 5b. However, once the charges are injected, the charges are hard to eliminate (this is because charges of the opposite polarity are also unlikely to be injected). Moreover, the charges injected into the silicon nitride film 10a (corresponding to the silicon nitride film 10a in the area 31 encircled by the dotted line in FIG. 42) in the insulating portion 5b may cause fluctuations in the threshold voltage of the memory transistor. The phenomenon may possibly occur even when any of the foregoing operation methods A, B, C, and D is implemented.

Figure 43:
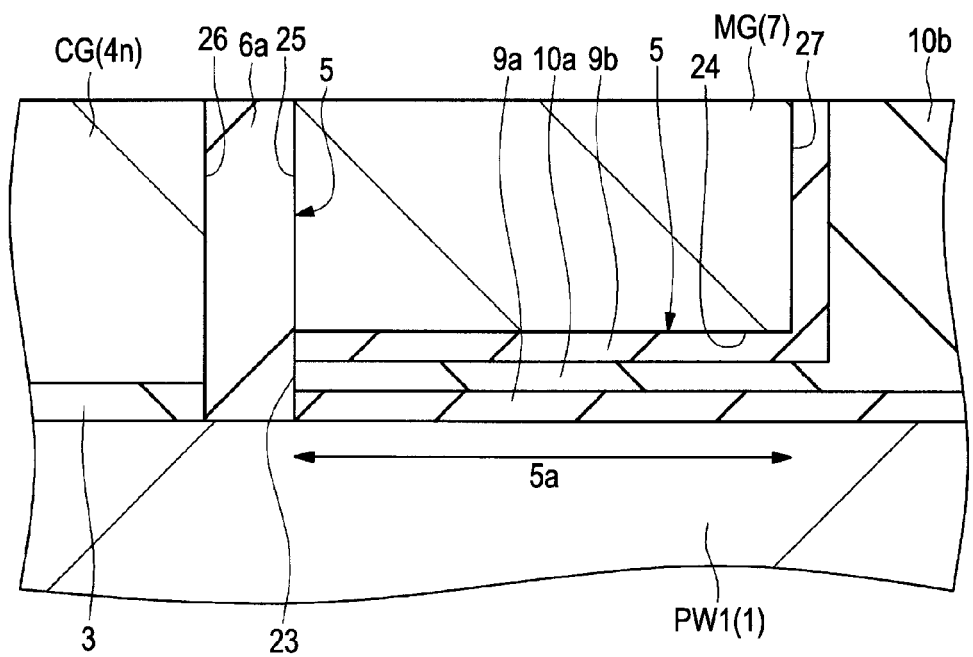
FIG. 43 is an illustrative view for illustrating the region where the silicon nitride film is formed.
Figure 44:
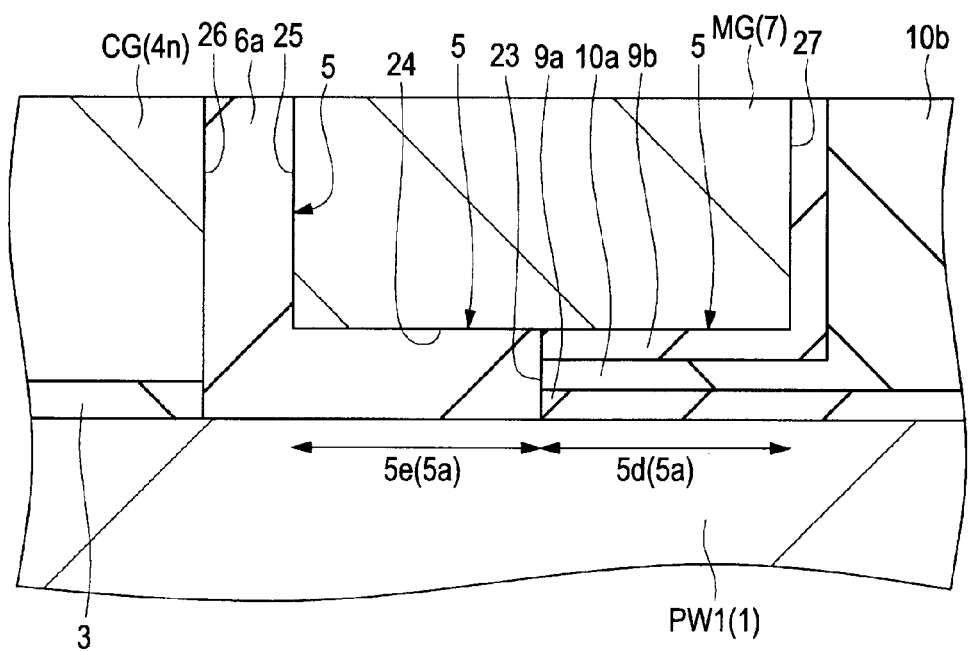
FIG. 44 is an illustrative view for illustrating the region where the silicon nitride film is formed.
Figure 45:
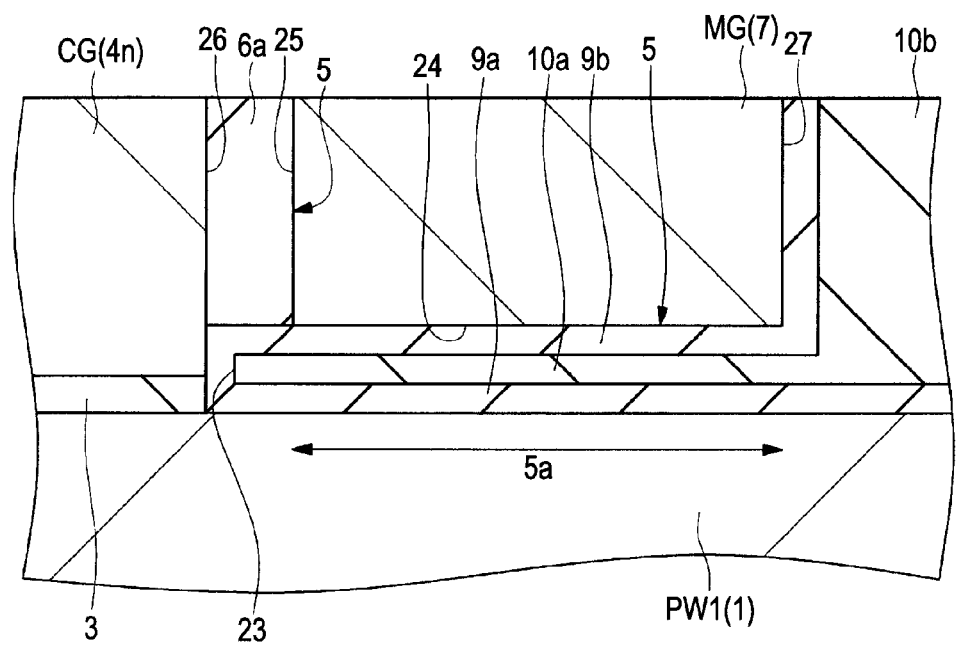
FIG. 45 is an illustrative view for illustrating the region where the silicon nitride film is formed.

Accordingly, in the present embodiment, the silicon nitride film 10a is kept from extending in the insulating portion 5b of the insulating film 5 located between the side surface 26 of the control gate electrode CG and the side surface 25 of the memory gate electrode MG. In FIGS. 43 to 45, this condition is met. In FIGS. 43 to 45, the silicon nitride film 10a does not extend in the insulating portion 5b between the side surface 26 of the control gate electrode CG and the side surface 25 of the memory gate electrode MG, and the insulating portion 5b is formed of silicon oxide (more specifically the silicon oxide film 6a). Therefore, in the case of FIGS. 43 to 45, there is no injection of charges into the silicon nitride film 10a in the insulating portion 5b between the side surface of the control gate electrode CG and the side surface of the memory gate electrode MG. As a result, it is possible to prevent fluctuations in the threshold voltage of the memory transistor due to the charges injected in the silicon nitride film 10a in the insulating portion 5b.

The respective structures of FIGS. 43 to 45 are common in that the silicon nitride film 10a does not extend in the insulating portion 5b between the side surface 26 of the control gate electrode CG and the side surface 25 of the memory gate electrode MG. However, to solve or improve the foregoing problem described with reference to the comparative example of FIG. 40 mentioned above, the position of the end portion 23 of the silicon nitride film 10a is important.

In the case of FIG. 43 or 44, in the corner portion 5c of the insulating film 5, the silicon nitride film 10a does not extend. In the case of FIG. 45, even in the corner portion 5c of the insulating film 5, the silicon nitride film 10a extends, but the length of the silicon nitride film 10a extending in the corner portion 5c of the insulating film 5 is smaller than in the case of FIG. 42.

To solve or improve the foregoing problem described with reference to the comparative example of FIG. 40 mentioned above, it is effective to reduce the silicon nitride film 10a present in the corner portion 5c of the insulating film 5, and it is more preferable to inhibit the silicon nitride film 10a from existing in the corner portion 5c of the insulating film 5. The reason for this is as follows.

As described above, in the semiconductor device of the comparative example of FIG. 40 mentioned above, in the cases where the operation method A is implemented and where the operation method C is implemented, in the silicon nitride film 105b in the insulating film 105, the position at which electrons are likely to be injected during writing and the position at which holes are likely to be injected during erasing are different. As a result, after an erase operation, charges to be eliminated undesirably remain and, due to the remaining electrons, the threshold voltage of the memory transistor may fluctuate. This results from the fact that, since electrons are injected into the silicon nitride film 105*b* in the area 122 encircled by the dotted line in FIG. 40 mentioned above at a density higher than in the other area during writing and holes are unlikely to be injected into the silicon nitride film 105*b* in the area 122 during erasing, electrons to be eliminated are undesirably likely to remain in the silicon nitride film 105*b* in the area 122 after erasing.

The insulating film 105 in the foregoing area 122 corresponds to the corner portion 5*c* of the insulating film 5 in the present embodiment. Therefore, when the silicon nitride film 10*a* is present in the corner portion 5*c* of the insulating film 5, in the silicon nitride film 10*a*, charges be eliminated are likely to remain after an erase operation and, due to the remaining charges, the threshold voltage of the memory transistor may possibly fluctuate. Accordingly, in the present embodiment, the silicon nitride film 10*a* present in the corner portion 5*c* of the insulating film 5 is reduced compared with that in the semiconductor device of the comparative example of FIG. 40 mentioned above and, more preferably, the silicon nitride film 10*a* is inhibited from existing in the corner portion 5*c* of the insulating film 5.

If the silicon nitride film 10*a* present in the corner portion 5*c* of the insulating film 5 is reduced compared with that in the semiconductor device of the comparative example of FIG. 40 mentioned above, it is possible to reduce the amount of electrons injected into the silicon nitride film 10*a* present in the corner portion 5*c* during writing. Therefore, it is possible to inhibit electrons to be eliminated from remaining in the silicon nitride film 10*a* of the corner portion 5*c* after erasing.

If the silicon nitride film 10*a* is inhibited from existing in the corner portion 5*c* of the insulating film 5, during writing, electrons are not injected since there is no silicon nitride film 10*a* in the corner portion 5*c*, and electrons are injected only into the silicon nitride film 10*a* in the gate insulating film portion 5*a*. During an erase operation, holes are likely to be injected into the silicon nitride film 10*a* in the gate insulating film portion 5*a*, and there is no silicon nitride film 10*a* in the corner portion 5*c* into which holes are assumedly unlikely to be injected. Therefore, it is possible to more reliably inhibit electrons to be eliminated from remaining in the insulating film 5 (the silicon nitride film 10*a* thereof) after erasing.

That is, in the present embodiment, in the corner portion 5*c* located at the position at which electrons are likely to be injected during writing, but holes are unlikely to be injected during erasing, the silicon nitride film 10*a* which traps charges is reduced or eliminated. Thus, it is possible to inhibit or prevent charges from remaining after an erase operation, and consequently inhibit or prevent fluctuations in the threshold voltage of the memory transistor due to the remaining charges. This allows an improvement in the performance of the semiconductor device including the nonvolatile memory.

As described above, in the semiconductor device of the comparative example of FIG. 40 mentioned above, in the cases where the operation method B is implemented and where the operation method D is implemented, due to the electric field concentration in the corner portion MG101*a* of the memory gate electrode MG101, a large amount of charges are injected into the silicon nitride film 105*b* (substantially corresponding to the silicon nitride film 105*b* in the area 122) in the insulating film 105 between the corner portion MG101*a* of the memory gate electrode MG101 and the semiconductor substrate 101. As a result, the insulating film 105 (substantially corresponding to the insulating film 105 in the area 122) between the corner portion MG101*a* of the memory gate electrode MG101 and the semiconductor substrate 101 (p-type well PW101) may deteriorate to possibly degrade the reliability of the insulating film 105. The region where the insulating film 105 is likely to deteriorate corresponds to the corner portion 5*c* of the insulating film 5 in the present embodiment. Accordingly, if the silicon nitride film 10*a* is present in the corner portion 5*c* of the insulating film 5, a large amount of charges are undesirably injected into the silicon nitride film 10*a* so that the corner portion 5*c* deteriorates to possibly degrade the reliability of the insulating film 5. Therefore, in the present embodiment, the silicon nitride film 10*a* present in the corner portion 5*c* of the insulating film 5 is reduced compared with that in the semiconductor device of the comparative example of FIG. 40 mentioned above and, more preferably, the silicon nitride film 10*a* is inhibited from existing in the corner portion 5*c* of the insulating film 5.

If the silicon nitride film 10*a* present in the corner portion 5*c* of the insulating film 5 is reduced compared with that in the semiconductor device of the comparative example of FIG. 40 mentioned above, the amount of charges injected into the silicon nitride film 10*a* present in the corner portion 5*c* can be reduced, and therefore it is possible to inhibit the corner portion 5*c* of the insulating film from deteriorating.

If the silicon nitride film 10*a* is inhibited from existing in the corner portion 5*c* of the insulating film 5, charges are not injected since there is no silicon nitride film 10*a* in the corner portion 5*c* of the insulating film 5, and it is possible to more reliably inhibit the corner portion 5*c* of the insulating film 5 from deteriorating.

That is, in the present embodiment, in the corner portion 5*c* located at the position at which a large amount of charges are likely to be injected, the silicon nitride film 10*a* which traps charges is reduced or eliminated, and thus it is possible to inhibit or prevent the corner portion 5*c* of the insulating film 5 from deteriorating. This makes it possible to inhibit or prevent the insulating film 5 from deteriorating, and thereby allows an improvement in the reliability of the insulating film 5. Therefore, it is possible to improve the performance of the semiconductor device including the nonvolatile memory.

In the case where the end portion 23 of the silicon nitride film 10*a* is located immediately below the memory gate electrode MG, the silicon nitride film 10*a* is not present in the corner portion 5*c* of the insulating film 5. In either of the cases of FIGS. 43 and 44, the end portion 23 of the silicon nitride film 10*a* is located immediately below the memory gate electrode MG, and the silicon nitride film 10*a* is not present in the corner portion 5*c* of the insulating film 5. With such a structure, when the operation method of the nonvolatile memory is either the operation method A or the operation method C, it is possible to inhibit charges to be eliminated from remaining after erasing, and inhibit or prevent fluctuations in the threshold voltage of the memory transistor due to the remaining charges, as described above. When the operation method of the nonvolatile memory is either the operation method B or the operation method D, it is possible to inhibit or prevent the deterioration of the insulating film 5, and improve the reliability of the insulating film 5. Therefore, even when the operation method of the nonvolatile memory is any of the operation method A, the operation method B, the operation method C, and the operation method D, it is possible to improve the performance of the semiconductor device including the nonvolatile memory.

Note that, when the end portion 23 of the silicon nitride film 10*a* is located immediately below the memory gate electrode MG (corresponding to FIG. 43 or 44), the insulating portion 5*b* and the corner portion 5*c* of the insulating film 5 do not have the silicon nitride film 10a so that each of the insulating portion 5b and the corner portion 5c is formed of silicon oxide (more specifically the silicon oxide film 6a).

The case where the end portion 23 of the silicon nitride film 10a is located immediately below the memory gate electrode MG is categorized into the case of FIG. 43 and the case of FIG. 44.

In the case of FIG. 43, the end portion 23 of the silicon nitride film 23 is located immediately below the side surface 25 of the memory gate electrode MG, and the gate insulating film portion 5a has a laminated structure in which the silicon oxide film 9a, the silicon nitride film 10a, and the silicon oxide film 9b are laminated.

In the case of FIG. 44, the end portion 23 of the silicon nitride film 23 is located farther away (apart) from the control gate electrode CG (i.e., closer to the source region) than the position immediately below the side surface 25 of the memory gate electrode MG. Therefore, in the case of FIG. 44, the gate insulating film portion 5a has a portion 5d in which the silicon oxide film 9a, the silicon nitride film 10a, and the silicon oxide film 9b are laminated, and a portion 5e formed of silicon oxide (more specifically the silicon oxide film 6a) so that the portion 5e is located between the portion 5d and the corner portion 5c. To put it more specifically, the gate insulating film portion 5a includes the portion 5d in which the silicon oxide film 9a, the silicon nitride film 10a, and the silicon oxide film 9b are laminated, and the portion 5e formed of silicon oxide (more specifically the silicon oxide film 6a) so that the portion 5e adjoins the corner portion 5c, and the end portion 23 of the silicon nitride film 10a is located on the boundary between the portion 5d and the portion 5e.

In either of the cases of FIGS. 43 and 44, the end portion 23 of the silicon nitride film 10a is located immediately below the memory gate electrode MG, and the corner portion 5c of the insulating film 5 does not have the silicon nitride film 10a. As a result, it is possible to obtain the effect (in the case where the operation method A or the operation method C is implemented) of being capable of inhibiting or preventing fluctuations in the threshold voltage of the memory transistor described above or the effect (in the case where the operation method B or the operation method D is implemented) of being capable of improving the reliability of the insulating film 5 described above. However, in the case of FIG. 44, the following effect can also be obtained.

That is, by etching the silicon oxide film 6 in Step S14 described above, the cavity CAV is formed, and the position of the end portion of the cavity CAV determines the location 23 of the end portion of the silicon nitride film 10a. However, due to variations in etching conditions or the like, the position of the end portion of the cavity CAV (i.e., the position of the end portion 23 of the silicon nitride film 10a) may possibly vary slightly. Therefore, if the end portion 23 of the silicon nitride film 10a is set farther away (apart) from the control gate electrode CG than the position immediately below the side surface 25 of the memory gate electrode MG, even when the position of the end portion 23 of the silicon nitride film 10a slightly varies, it is possible to maintain the state where the end portion 23 of the silicon nitride film 10a is located immediately below the memory gate electrode MG, and the insulating portion 5b and the corner portion 5c of the insulating film 5 do not have the silicon nitride film 10a. As a result, even when a step variation (specifically, a step variation in Step S14 described above) occurs, it is possible to maintain the state where the insulating portion 5b and the corner portion 5c of the insulating film 5 do not have the silicon nitride film 10a, and therefore more reliably obtain the effect (in the case where the operation method A or the operation method C is implemented) of inhibiting or preventing fluctuations in the threshold voltage of the memory transistor described above or the effect (in the case where the operation method B or the operation method D is implemented) of improving the reliability of the insulating film 5 described above. Accordingly, it is possible to more reliably improve the performance of the semiconductor device including the nonvolatile memory.

On the other hand, in the case of FIG. 43, the entire gate insulating film portion 5a has the laminated structure in which the silicon oxide film 9a, the silicon nitride film 10a, and the silicon oxide film 9b are laminated, which is advantageous in terms of improving a write speed.

To solve or improve the foregoing problem described with reference to the comparative example of FIG. 40 mentioned above, it is extremely effective to inhibit the silicon nitride film 10a from existing in the corner portion 5c of the insulating film 5. However, even when the silicon nitride film 10a is present in the corner portion 5c of the insulating film 5, if the silicon nitride film 10a in the corner portion 5c of the insulating film 5 is reduced compared with that in the case of the comparative example of FIG. 40 mentioned above, the foregoing problem can be improved compared with that in the case of the comparative example of FIG. 40 mentioned above. An example of this case corresponds to FIG. 45.

That is, in the case of FIG. 45, the end portion 23 of the silicon nitride film 10a is located at a position lower in level than the lower surface 24 of the memory gate electrode MG and closer to the control gate electrode CG than the position immediately below the side surface 25 of the memory gate electrode MG. In this case, the end portion 23 of the silicon nitride film 10a is located within the corner portion 5c, and the gate insulating film portion 5a (the entire gate insulating film portion 5a) has the laminated structure in which the silicon oxide film 9a, the silicon nitride film 10a, and the silicon oxide film 9b are laminated. With such a structure, the silicon nitride film 10a in the corner portion 5c of the insulating film 5 is reduced compared with that in the case of the comparative example of FIG. 40 mentioned above, and therefore the problem described above can be improved compared with that in the case of the comparative example of FIG. 40 mentioned above. That is, in contrast to the case of the comparative example of FIG. 40 mentioned above, it is possible to obtain the effect (in the case where the operation method A or the operation method C is implemented) of being capable of inhibiting or preventing fluctuations in the threshold voltage of the memory transistor or the effect (in the case where the operation method B or the operation method D is implemented) of being capable of inhibiting the deterioration of the insulating film 5 (the corner portion 5c thereof), and improving the reliability of the insulating film 5. Accordingly, it is possible to improve the performance of the semiconductor device including the nonvolatile memory.

The position of the end portion 23 of the silicon nitride film 10a can be controlled by adjusting etching conditions (such as, e.g., an etching time) in the etching step of Step S14 described above. By using the position of the end portion of the cavity CAV formed in Step S14 described above, the position 23 of the end portion of the silicon nitride film 10a can be controlled. For example, to obtain the structure of FIG. 44, in the etching step of Step S14 described above, the etching of the silicon oxide film 6 may be terminated appropriately before the end portion of the cavity CAV reaches the position immediately below the side surface 25 of the memory gate electrode MG. To obtain the structure of FIG. 43, in the etching step of Step S14 described above, the etching of the silicon oxide film 6 may be terminated appropriately exactly at the stage when the end portion of the cavity CAV reaches the position immediately below the side surface 25 of the memory gate electrode MG.

Figure 46:
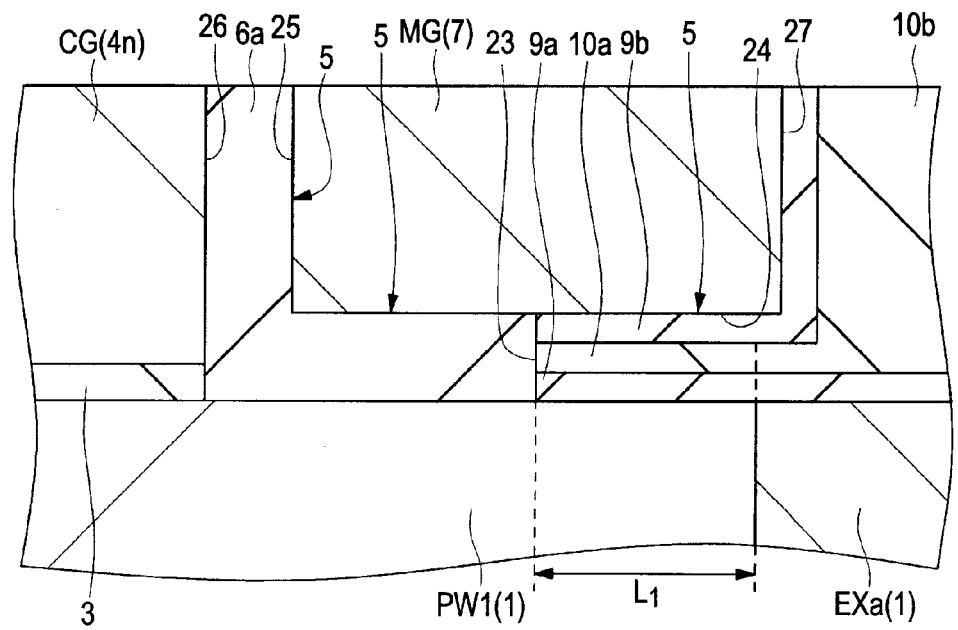
FIG. 46 is an illustrative view for illustrating the region where the silicon nitride film is formed.

FIG. 46 is an illustrative view (main-portion cross-sectional view or partially enlarged cross-sectional view) for illustrating the region of the insulating film 5 where the silicon nitride film 10a is formed, and corresponds to FIG. 44 mentioned above. In FIG. 46, the n⁻-type semiconductor region EXa is also shown.

The silicon nitride film 10a (i.e., the silicon nitride film 10a in the gate insulating film portion 5a) located between the lower surface 24 of the memory gate electrode MG and the upper surface of the semiconductor substrate 1 (p-type well PW1) is capable of functioning as the charge storage portion of the memory cell. To cause the silicon nitride film 10a to satisfactorily function as the charge storage portion of the memory cell, it is required that the distance (length or size) $L_1$ of the portion of the silicon nitride film 10a located immediately below the memory gate electrode MG which does not two-dimensionally overlap the n⁻-type semiconductor region (extension region) EXa is larger than zero (i.e., $L_1>0$) and, more preferably, the distance $L_1$ is not less than 10 nm (i.e., $L_1 \geq 10$ nm). The foregoing distance $L_1$ corresponds to the distance (length or size) of the memory gate electrode MG in the gate length direction thereof, and is shown in FIG. 46. The wording "does not two-dimensionally overlap" means that the portion of the silicon nitride film 10a does not overlap the n⁻-type semiconductor region EXa when projected in a plane parallel with the main surface of the semiconductor substrate 1, and viewed.

If the foregoing distance $L_1$ is viewed from another perspective, the end portion 23 of the silicon nitride film 10a is apart from the n⁻-type semiconductor region (extension region) EXa (the end portion thereof) by the distance $L_1$ in the gate length direction. That is, within the region at the distance $L_1$ or less from the end portion 23 of the silicon nitride film 10a in the gate length direction, the n⁻-type semiconductor region (extension region) EXa is not present immediately below, but a region serving as a channel region is present.

The fact that the foregoing distance $L_1$ is larger than zero (i.e., $L1 \geq 0$) means that the silicon nitride film 10a located immediately below the memory gate electrode MG has a portion which does not two-dimensionally overlap the n⁻-type semiconductor region (extension region) EXa, and the portion (which does not two-dimensionally overlap the n⁻-type semiconductor region EXa) is capable of properly functioning as the charge storage portion. If the foregoing distance $L_1$ is not less than 10 nm (i.e., $L1 \geq 10$ nm), it is possible to sufficiently ensure the dimension (corresponding to the foregoing distance $L_1$) in the gate length direction of the silicon nitride film 10a functioning as the charge storage portion. This allows the silicon nitride film 10a to more properly function as the charge storage portion.

That is, in the semiconductor substrate 1, the extension region (corresponding to the n⁻-type semiconductor region EXa here) is formed below the sidewall spacer SW1, and the source or drain region (corresponding to the n⁺-type semiconductor region 12a here) at an impurity concentration higher than that of the extension region is formed outside the extension region (corresponding to the n⁻-type semiconductor region EXa here). In addition, the end portion 23 of the silicon nitride film 10a is apart from the extension region (corresponding to the n⁻-type semiconductor region EXa) in the gate length direction of the memory gate electrode MG (more preferably, apart therefrom by 10 nm or more). In this manner, it is possible to improve the performance of the memory cell using the silicon nitride film 10a as the charge storage portion.

Also, in the present embodiment, the silicon nitride film 10 formed in Step S18 serves as the silicon nitride film 10a for the charge storage portion and also as the silicon nitride film 10b for the sidewall spacer SW1. That is, in the same step (step of depositing the silicon nitride film 10 of Step S18), the silicon nitride film (10a) for the charge storage portion and the silicon nitride film (10b) for the sidewall spacer SW1 are formed. Accordingly, the number of the manufacturing steps of the semiconductor device can be reduced, and the throughput of the semiconductor device can be improved. In addition, the manufacturing cost of the semiconductor device can be reduced. In the semiconductor device thus manufactured, the silicon nitride film 10a for the charge storage portion and the silicon nitride film 10b for the sidewall spacer SW1 are integrally formed. That is, the sidewall spacer SW1 has the silicon nitride film 10a for the charge storage portion and the silicon nitride film 10b formed integrally therewith.

Also, in the present embodiment, in Step S14, a part of the portion of the silicon oxide film 6 between the lower surface of the memory gate electrode MG and the semiconductor substrate 1 is removed, while the silicon oxide film 6 interposed between the upper portion of the memory gate electrode MG and the upper portion of the control gate electrode CG remains without being etched. As a result, in the region interposed between the memory gate electrode MG and the control gate electrode CG, the silicon nitride film formed between the lower surface of the memory gate electrode MG and the semiconductor substrate 1 is not formed in the subsequent step. When the silicon nitride film 10 is formed in the region interposed between the memory gate electrode MG and the control gate electrode CG, since the silicon nitride film has a high dielectric constant, the thickness of the insulating film when it is electrically viewed is smaller than that of a silicon oxide film. Accordingly, it may be difficult to ensure voltage resistance between the control gate electrode CG and the memory gate electrode MG. However, in the present embodiment, the silicon nitride film 10 is not formed in the insulating portion 5b between the side surface of the memory gate electrode MG and the side surface of the control gate electrode CG, but the silicon oxide film 6 is formed. Therefore, it is possible to more effectively ensure voltage resistance between the control gate electrode CG and the memory gate electrode MG, and ensure the reliability of the semiconductor device.

Second Embodiment

The present embodiment corresponds to the variation of the foregoing first embodiment.

In the present embodiment, a description will be given to the case where the control gate electrode CG of the nonvolatile memory of the foregoing first embodiment is formed of a laminate film of the silicon film 4n and an insulating film.

Figure 47:
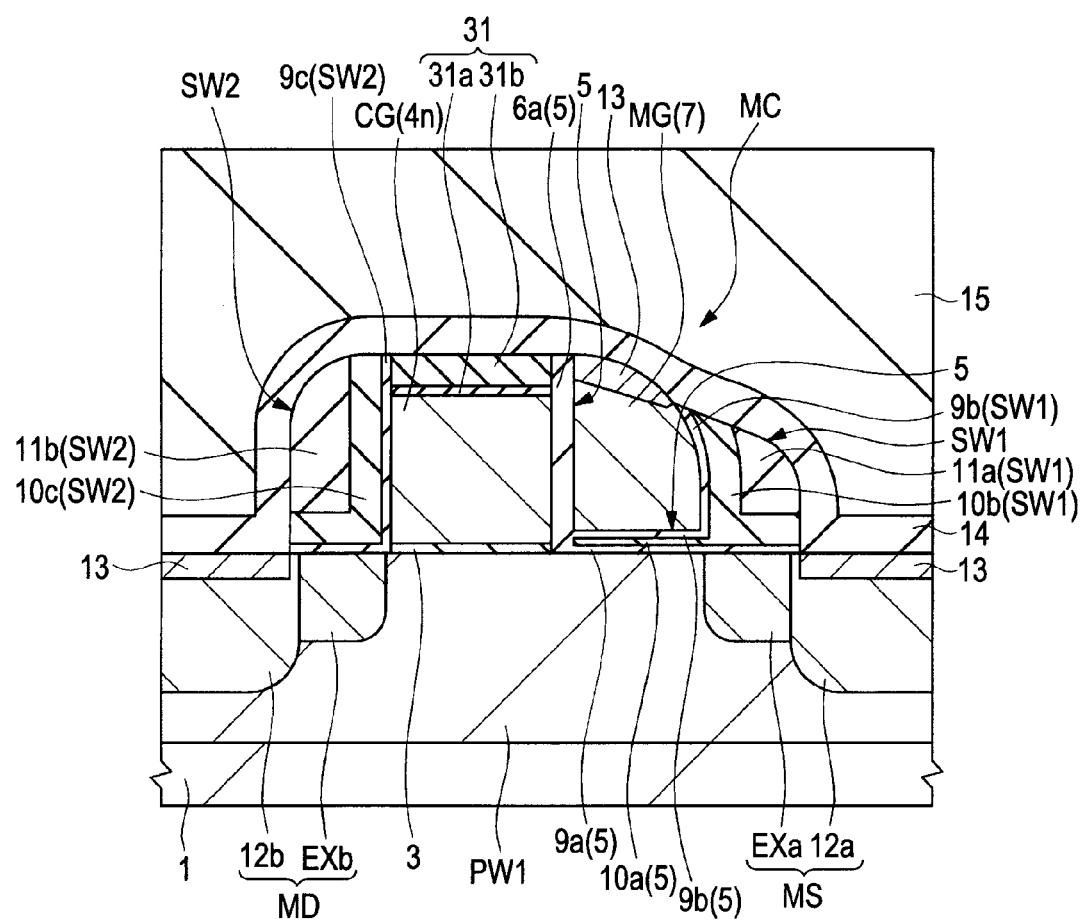
FIG. 47 is a main-portion cross-sectional view of a semiconductor device as another embodiment of the present invention.

FIG. 47 is a main-portion cross-sectional view of a semiconductor device of the present embodiment, and corresponds to FIG. 1 of the foregoing first embodiment mentioned above.

As shown in FIG. 47, in a memory cell of a nonvolatile memory in the present embodiment, the control gate electrode CG is formed of a laminate film (laminate pattern or laminate structure) of the silicon film 4n and an insulating film 31. More specifically, the control gate electrode CG is formed of the laminate film (laminate film pattern) of the silicon film 4n, an insulating film 31a over the silicon film 4n, and an insulating film 31b over the insulating film 31a. The insulating film 31 is comprised of the insulating film 31a over the silicon film 4n and the insulating film 31b over the insulating film 31a, and the insulating film 31a is formed thinner than the insulating film 31b. The insulating film 31a is preferably formed of a silicon oxide film, while the insulating film 31b is preferably formed of a silicon nitride film.

In the present embodiment, over the control gate electrode CG of the memory cell, the insulating film 31 (including the insulating films 31a and 31b herein) is formed. Therefore, over the control gate electrode CG of the memory cell, the metal silicide layer 13 is not formed. That is, a semiconductor device obtained by replacing the control gate electrode CG formed of the silicon film 4n and the metal silicide layer 13 thereover in the foregoing film embodiment with the control gate electrode CG formed of the laminate film of the silicon film 4n and the insulating film 31 corresponds to the semiconductor device of the present embodiment.

The structure of the memory cell of the present embodiment is otherwise the same as in the foregoing first embodiment, and therefore a description thereof is omitted herein.

Figure 48:
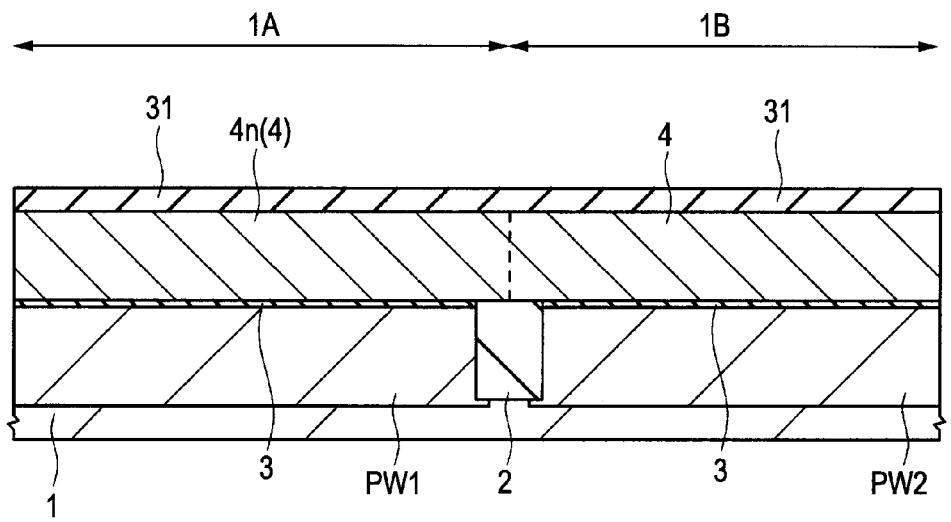
FIG. 48 is a main-portion cross-sectional view of the semiconductor device of the other embodiment of the present invention during a manufacturing process thereof.
Figure 49:
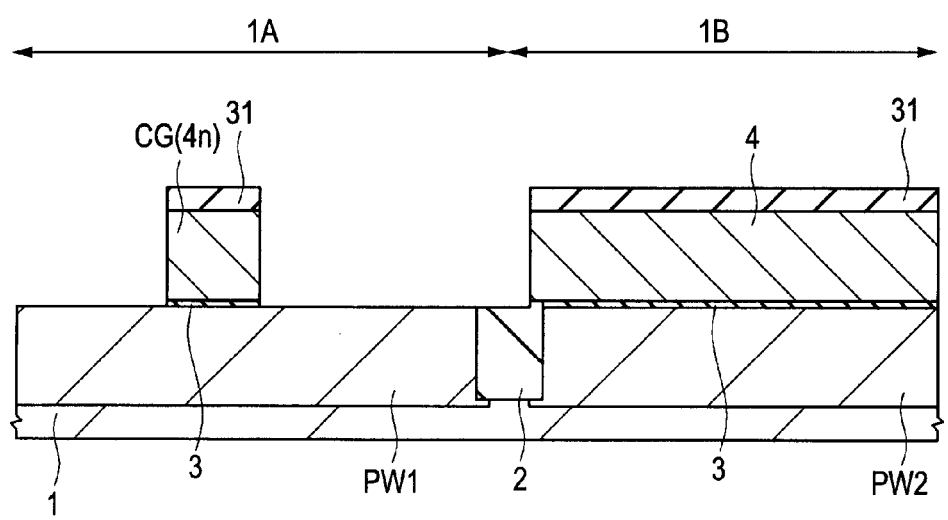
FIG. 49 is a main-portion cross-sectional view of the semiconductor device of the other embodiment of the present invention during the manufacturing process thereof.

Next, a description will be given to the manufacturing process of the semiconductor device of the present embodiment. FIGS. 48 and 49 are main-portion cross-sectional views of the semiconductor device of the present embodiment during the manufacturing process thereof, which show substantially the same cross-sectional region as in FIGS. 7 to 18 mentioned above in the foregoing first embodiment or the like.

The manufacturing process of the semiconductor device of the present embodiment is basically the same as the manufacturing process of the semiconductor device of the foregoing first embodiment. Therefore, hereinbelow, a description will be given mainly to the difference between the manufacturing process of the present embodiment and the manufacturing process of the foregoing first embodiment.

In the same manner as in the foregoing first embodiment, the structure of FIG. 9 mentioned above is obtained. Then, in the present embodiment, between Steps S5 and S6 described above, as shown in FIG. 48, the step of forming the insulating film 31 over the silicon film 4 (4n) is added. The step of forming the insulating film 31 has the step of forming the insulating film 31a over the silicon film 4 (4n), and the step of forming the insulating film 31b over the insulating film 31a. However, in FIG. 48, for the simplification of the drawings, the laminate film of the insulating films 31a and 31b is merely shown as the insulating film 31.

Then, in Step S6 described above, in the foregoing first embodiment, the silicon film 4n is patterned to form the control gate electrode CG. However, in the present embodiment, the laminate film of the silicon film 4n and the insulating film 31 is patterned to form the control gate electrode CG formed of a laminate film pattern of the silicon film 4n and the insulating film 31, as shown in FIG. 49. Then, between Steps S6 and S7, in a region (e.g., the peripheral circuit region 1B or the like) where the insulating film 31 is to be removed, the removal of the insulating film 31 is performed appropriately. The subsequent steps (Step S7 and the steps subsequent thereto) are basically the same as in the foregoing first embodiment, and therefore a description thereof is omitted here.

In the present embodiment also, the same effects as obtained in the foregoing first embodiment can be obtained.

In addition, in the present embodiment, the control gate electrode CG is formed of the laminate film of the silicon film 4n and the insulating film (more specifically the insulating films 31a and 31b). Accordingly, even when the silicon film 4 (4n) is formed thinner than in the foregoing first embodiment, it is possible to ensure the height of the memory gate electrode MG formed in the form of a sidewall spacer over the side wall of the control gate electrode CG.

While the invention achieved by the present inventors has been specifically described heretofore based on the embodiments thereof, the present invention is not limited to the foregoing embodiments. It will be appreciated that various changes and modifications can be made in the invention within the scope not departing from the gist thereof.

The present invention is useful when applied to a semiconductor device and a manufacturing technique therefor.

What is claimed is:

1. A semiconductor device including a memory cell of a nonvolatile memory, the semiconductor device comprising:
a semiconductor substrate;
a first gate electrode formed over the semiconductor substrate to form the memory cell;
a second gate electrode formed over the semiconductor substrate to adjoin the first gate electrode, and form the memory cell;
a first gate insulating film formed between the first gate electrode and the semiconductor substrate;
a first insulating film formed between the second gate electrode and the semiconductor substrate;
a second insulating film formed between the first gate electrode and the second gate electrode,
wherein the first insulating film has a first charge block film, a second charge block film, and a third insulating film having charge storage portion,
wherein the second insulating film does not have a charge storage portion,
wherein the first charge block film is formed over the semiconductor substrate,
wherein the third insulating film is formed over the first charge block film,
wherein the second charge block film is formed over the third insulating film,
wherein, over a first side wall of the second gate electrode opposite to a second side wall thereof adjoining the first gate electrode, a sidewall spacer is formed,
wherein the sidewall spacer has a fourth insulating film formed of the same film as the third insulating film,
wherein the fourth insulating film is formed integrally with the third insulating film, and
wherein the first charge block film extends from below the second gate electrode to under the sidewall spacer.

2. A semiconductor device according to claim 1,
wherein the second charge block film extends from under the lower surface of the second gate electrode to over the first side wall of the second gate electrode, and the second charge block film over the first side wall of the second gate electrode forms a part of the sidewall spacer.

3. A semiconductor device according to claim 2,
wherein an end portion of the third insulating film at a first-gate-electrode side of the third insulating film is located immediately below the second gate electrode.

4. A semiconductor device according to claim 3,
wherein a fifth insulating film is formed between the first insulating film and the second insulating film, and
wherein the fifth insulating film does not have a charge storage portion.

5. A semiconductor device according to claim 4,
wherein the end portion of the third insulating film is located farther away from the first gate electrode than a position immediately below the second side wall of the second gate electrode.

6. A semiconductor device according to claim 5, further comprising:
an extension region formed in the semiconductor substrate under the sidewall spacer; and a source or drain region formed outside the extension region of the semiconductor substrate, and having an impurity concentration higher than that of the extension region, wherein the end portion of the third insulating film is spaced apart from the extension region in a gate length direction of the second gate electrode.

7. A semiconductor device according to claim 1, wherein, by injecting hot electrons into the third insulating film, writing to the memory cell is performed, and wherein, by injecting hot holes into the third insulating film, erasing of the memory cell is performed.

8. A semiconductor device according to claim 1, wherein, by injecting hot electrons into third insulating, writing to the memory cell is performed, and wherein, by injecting holes into the third insulating film using a FN tunnel effect, erasing of the memory cell is performed.

9. A semiconductor device according to claim 1, wherein, by injecting electrons into the third insulating film using a FN tunnel effect, writing to the memory cell is performed, and wherein, by injecting hot holes into the third insulating film, erasing of the memory cell is performed.

10. A semiconductor device according to claim 1, wherein, by injecting electrons into the third insulating film using a FN tunnel effect, writing to the memory cell is performed, and wherein, by injecting holes into the third insulating film using the FN tunnel effect, erasing of the memory cell is performed.

\* \* \* \* \*